US012672413B2

(12) United States Patent
Lee et al.

(10) Patent No.: US 12,672,413 B2
(45) Date of Patent: Jun. 30, 2026

(54) DISPLAY DEVICE

(71) Applicant: Samsung Display Co., LTD., Yongin-si (KR)

(72) Inventors: Won Jun Lee, Seoul (KR); Dong Woo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 581 days.

(21) Appl. No.: 18/083,877

(22) Filed: Dec. 19, 2022

(65) Prior Publication Data

US 2023/0197764 A1      Jun. 22, 2023

(30) Foreign Application Priority Data

Dec. 20, 2021      (KR) ......................... 10-2021-0182631

(51) Int. Cl.
*H10H 29/14*          (2025.01)
*H10H 20/831*        (2025.01)
*H10H 20/857*        (2025.01)

(52) U.S. Cl.
CPC ...... *H10H 29/142* (2025.01); *H10H 20/8316* (2025.01); *H10H 20/857* (2025.01)

(58) Field of Classification Search
CPC .................................................... H10H 29/37
See application file for complete search history.

(56) References Cited

U.S. PATENT DOCUMENTS

| | | | |
|---|---|---|---|
| 10,580,946 B2 | 3/2020 | Im et al. | |
| 10,797,212 B2 | 10/2020 | Im et al. | |
| 11,088,197 B2 | 8/2021 | Kang et al. | |
| 2020/0203587 A1* | 6/2020 | Kim ..................... | H10H 29/142 |
| 2022/0199695 A1* | 6/2022 | Takiguchi ................ | G02B 5/20 |

FOREIGN PATENT DOCUMENTS

WO          2020209109 A1      10/2020

* cited by examiner

*Primary Examiner* — Feifei Yeung Lopez
(74) *Attorney, Agent, or Firm* — Womble Bond Dickinson (US) LLP

(57) ABSTRACT

A display device includes a bank layer extending in a first direction and a second direction intersecting the first direction and surrounding subpixels; a first electrode extending in the first direction in each of the subpixels; second electrodes spaced apart from the first electrode and extending in the first direction; light emitting elements comprising a first light emitting element disposed on the first electrode and any one of the second electrodes, and a second light emitting element having an end disposed on another one of the second electrodes; a first connection electrode disposed on the first electrode and electrically contacting the first light emitting element; and a second connection electrode disposed on the second electrodes and electrically contacting the second light emitting element, wherein each of the second electrodes is disposed in different ones of the subpixels and overlaps in a plan view the bank layer disposed between the subpixels.

20 Claims, 27 Drawing Sheets

NDA

10

DPA

DR1

DR2

PX

SA1 EP CTA SPX1   SA1 ROP1   SPX2   SA1 ROP1   SPX3

ROP1

CT2

CT1

CTD

BP2

BP1

CNE1

CNE2

ED1

RMH

ED2

N1    N1

EMA

CNE3

CTS    N3

N2

N2    N3

BNL

BP1
BP2

EMA

SA2 RME2    RME1   SA2 RME2 EMA   RME1   SA2 RME2 ROP2   RME1

DR1

DR2

RME: RME1, RME2
CNE: CNE1, CNE2, CNE3
ED: ED1, ED2
ROP: ROP1, ROP2
SA: SA1, SA2

CNE: CNE1, CNE2, CNE3
ED: ED1, ED2
SA: SA1, SA2

RME: RME1, RME2
RME2: RM_S, RM_B
ROP: ROP1, ROP2
SA: SA1, SA2

RME: RME1, RME2
CNE: CNE1, CNE2, CNE3
ED: ED1, ED2

RME: RME1, RME2
CNE: CNE1, CNE2, CNE3

RME: RME1, RME2, RME3
RME1: RM1, RM2
CNE: CNE1, CNE2, CNE3, CNE4, CNE5
ED: ED1, ED2, ED3, ED4

RME: RME1, RME2, RME3
CNE: CNE1, CNE2, CNE3, CNE4
ED: ED1, ED2

RME: RME1, RME2, RME3
CNE: CNE1, CNE2

RME: RME1, RME2
CNE: CNE1, CNE2

DR3

DISPLAY DEVICE

CROSS-REFERENCE TO RELATED APPLICATION(S)

This application claims priority to and the benefit of Korean Patent Application No. 10-2021-0182631 under 35 U.S.C. § 119, filed on Dec. 20, 2021, in the Korean Intellectual Property Office (KIPO), the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

SUMMARY

Aspects of the disclosure provide a display device which includes an electrode disposed over different subpixels to prevent misalignment of light emitting elements.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may comprise a bank layer extending in a first direction and a second direction intersecting the first direction and surrounding subpixels; a first electrode extending in the first direction in each of the subpixels; second electrodes spaced apart from the first electrode and extending in the first direction, the first electrode being disposed between the second electrodes; light emitting elements comprising a first light emitting element disposed on the first electrode and any one of the second electrodes, and a second light emitting element having an end disposed on another one of the second electrodes; a first connection electrode disposed on the first electrode and electrically contacting the first light emitting element; and a second connection electrode disposed on the second electrodes and electrically contacting the second light emitting element, wherein each of the second electrodes may be disposed in different ones of the subpixels and overlaps in a plan view the bank layer disposed between the subpixels.

In an embodiment, a maximum width of each of the second electrodes is greater than a width of a portion of the bank layer which is disposed between different ones of the subpixels.

In an embodiment a display device may further comprise, a first bank pattern extending in the first direction in each of the subpixels and overlapping the first electrode in a plan view; and second bank patterns spaced apart from each other and each disposed over different ones of the subpixels adjacent to each other in the second direction, the first bank pattern being disposed between the second bank patterns, wherein the second electrodes may overlap the second bank patterns, and the maximum width of each of the second electrodes may be greater than a width of each of the second bank patterns.

In an embodiment, the first light emitting element may be disposed between the first bank pattern and any one of the second bank patterns, and the second light emitting element may be disposed between the first bank pattern and another one of the second bank patterns.

In an embodiment, a display device may further comprise a bottom electrode overlapping in a plan view the bank layer and the second electrodes. The bottom electrode and the second electrodes may be disposed on different layers.

In an embodiment, each of the second electrodes may comprise an electrode stem portion extending in the first direction, and a widened electrode portion electrically connected to the electrode stem portion and wider than the electrode stem portion, and the widened electrode portion may be disposed over different ones of the subpixels.

In an embodiment, the second electrodes may comprise a first electrode line on which the second light emitting element is disposed and a second electrode line on which the first light emitting element is disposed, the second connection electrode is disposed on the first electrode line of the second electrodes, and the display device may further comprise a first extension portion disposed on the second electrode line and electrically contacting the first light emitting element; a second extension portion disposed on the first electrode and electrically contacting the second light emitting element; and a third connection electrode comprising a first connection portion electrically connecting the first extension portion and the second extension portion and disposed on the bank layer.

In an embodiment, the subpixels may comprise a first subpixel and a second subpixel adjacent to the first subpixel in the second direction, the first subpixel and the second subpixel may share the second electrode line of the second electrodes, and the first light emitting element of the first subpixel and the second light emitting element of the second subpixel may be disposed on a same one of the second electrodes.

In an embodiment, each of the second electrodes may comprise an electrode hole overlapping in a plan view the bank layer between different ones of the subpixels.

In an embodiment, a display device may further comprise a first insulating layer disposed on the first electrode and the second electrodes, wherein the first insulating layer comprises a first opening hole overlapping the electrode hole in a plan view.

In an embodiment, a display device may further comprise a second insulating layer disposed on the light emitting elements and the bank layer; and a third insulating layer disposed on the second insulating layer and disposed under the first connection electrode and the second connection electrode. the second insulating layer may comprise second opening holes disposed on the bank layer, and the third insulating layer may comprise third opening holes disposed on the bank layer.

In an embodiment, each of the second opening holes and the third opening holes may have a smaller size than the electrode hole of each of the second electrodes.

In an embodiment, the second opening holes and the third opening holes may be disposed on the bank layer between different ones of the subpixels and do not overlap each other in a plan view.

In an embodiment, a display device may further comprise a third electrode disposed between the first electrode and the second electrodes and extending in the first direction. The first light emitting element has a first end disposed on the first electrode and a second end disposed on any one of the second electrodes, and the second light emitting element has a first end disposed on the third electrode and a second end disposed on another one of the second electrodes.

In an embodiment, a display device may further comprise a first bank pattern extending in the first direction in each of the subpixels and overlapping the first electrode and the third electrode in a plan view; and second bank patterns spaced apart from the first bank pattern in the second direction, the first bank pattern being disposed between the second bank patterns, each of the second electrodes may overlap different second bank patterns in a plan view, and one of the second electrodes may overlap in a plan view the second bank patterns respectively disposed in different ones of the subpixels.

In an embodiment, a display device may further comprise a third connection electrode comprising a first extension portion disposed on the third electrode and facing the second connection electrode and a second extension portion disposed on the second electrodes and spaced apart from the second connection electrode; a fourth connection electrode comprising a third extension portion disposed on the second electrodes and facing the first connection electrode and a fourth extension portion disposed on the first electrode and spaced apart from the first connection electrode; and a fifth connection electrode comprising a fifth extension portion disposed on the third electrode and spaced apart from the first extension portion and a sixth extension portion disposed on the second electrodes and spaced apart from the third extension portion.

According to another embodiment of the disclosure, a display device comprises, subpixels arranged in a first direction and a second direction intersecting the first direction and each comprising an emission area; a bank layer surrounding the subpixels and the emission area; a first electrode and a second electrode, each being disposed over different ones of the subpixels adjacent to each other in the second direction, and spaced apart from each other in the emission area of each of the subpixels; light emitting elements disposed on the first electrode and the second electrode in the emission area of each of the subpixels; a first connection electrode disposed on the first electrode and electrically contacting first ends of the light emitting elements; and a second connection electrode disposed on the second electrode and electrically contacting second ends of the light emitting elements, wherein the first electrode and the second electrode have a greater width than the bank layer in the second direction and each overlap in a plan view the bank layer disposed between the emission areas of adjacent subpixels.

In an embodiment, a display device may further comprise a first bank pattern and a second bank pattern disposed in the emission area of each of the subpixels and spaced apart from each other in the second direction, wherein each of the first electrode and the second electrode covers the first bank pattern and the second bank pattern respectively in different ones of the subpixels.

In an embodiment, each of the light emitting elements is disposed between the first bank pattern and the second bank pattern.

In an embodiment, the subpixels comprise a first subpixel and a second subpixel adjacent to the first subpixel in the second direction, wherein the first subpixel and the second subpixel share the second electrode, the first electrode of the first subpixel is disposed on a side of the second electrode in the second direction, and the first electrode of the second subpixel is disposed on another side of the second electrode in the second direction.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
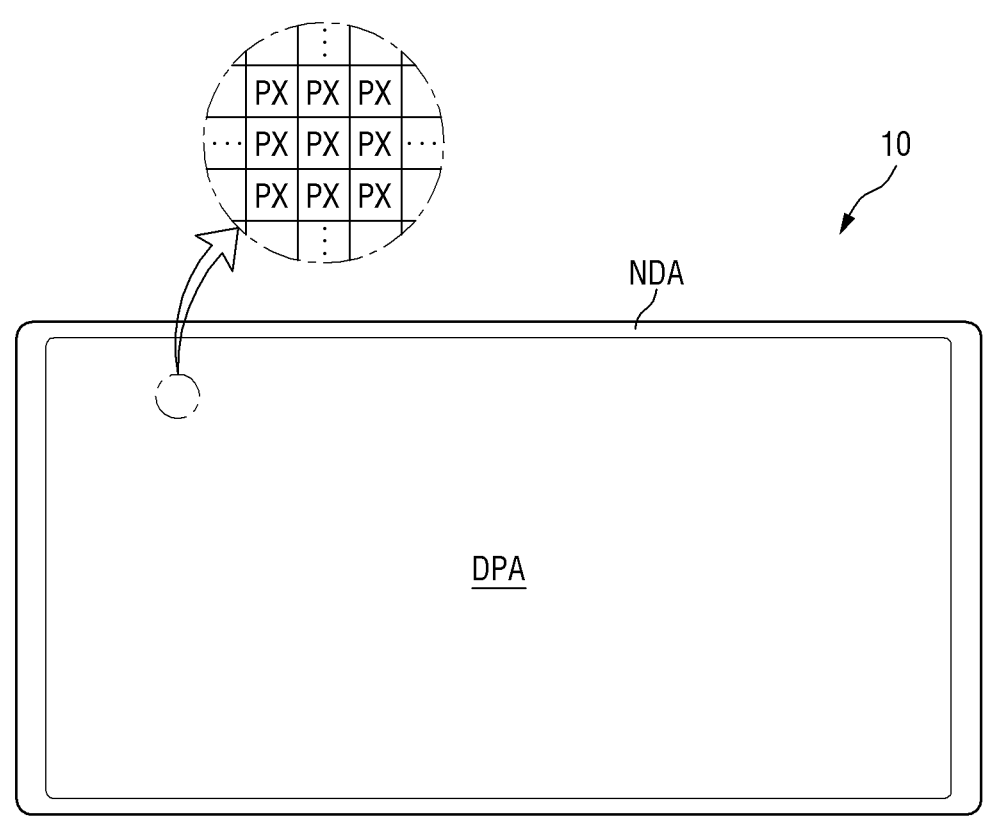
FIG. 1 is a schematic plan view of a display device according to an embodiment.
Figure 1:
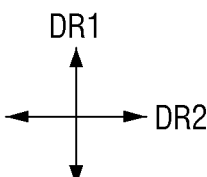

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The term "overlap" or "at least partially overlap" as used herein may mean that at least part of a first object faces at least part of a second object in a given direction or given view.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The term "and/or" includes all combinations of one or more of which associated configurations may define. For example, "A and/or B" may be understood to mean "A, B, or A and B."

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include televisions, laptop computers, monitors, billboards, Internet of things (IoT) devices, mobile phones, smartphones, tablet personal computers (PCs), electronic watches, smartwatches, watch phones, head-mounted displays, mobile communication terminals, electronic notebooks, electronic-book readers, portable multimedia players (PMPs), navigation devices, game machines, digital cameras, and camcorders, all of which provide a display screen.

The display device 10 includes a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels can also be applied as long as the same technical spirit is applicable.

The shape of the display device 10 can be variously modified. For example, the display device 10 may have various shapes such as a horizontally long rectangle, a vertically long rectangle, a square, a quadrilateral with rounded corners (vertices), other polygons, or a circle. The shape of a display area DPA of the display device 10 may also be substantially identical or similar to the overall shape of the display device 10. FIG. 1 illustrates the display device 10 shaped like a rectangle that is long in a second direction DR2.

The display device 10 may include the display area DPA and a non-display area NDA. The display area DPA is an area where an image can be displayed, and the non-display area NDA is an area where no image is displayed. The display area DPA may also be referred to as an active area, and the non-display area NDA may also be referred to as an inactive area. The display area DPA may generally occupy a center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombic shape having each side inclined with respect to a direction. The pixels PX may be arranged in a stripe type or an island type. Each of the pixels PX may include one or more light emitting elements which emit light of a specific wavelength band to display a specific color.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. Wirings or circuit drivers included in the display device 10 may be located, or external devices may be mounted, in each non-display area NDA.

Figure 2:
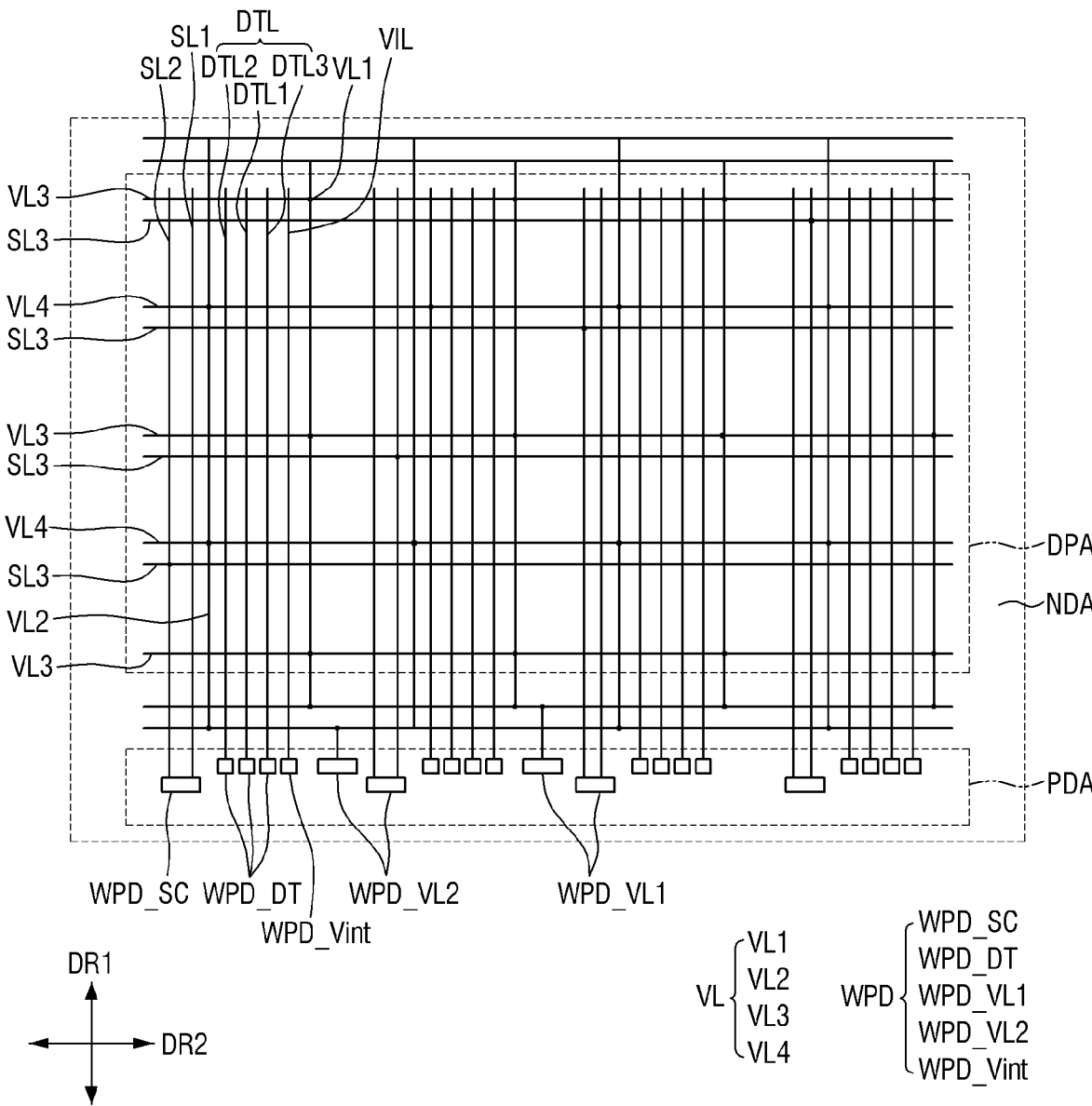
FIG. 2 is a schematic plan view illustrating the arrangement of a plurality of wirings included in the display device according to the embodiment.

FIG. 2 is a schematic layout view illustrating wirings included in the display device 10 according to the embodiment.

Referring to FIG. 2, the display device 10 may include wirings. The display device 10 may include scan lines SL (SL1 to SL3), data lines DTL (DTL1 to DTL3), initialization voltage lines VIL, and voltage lines VL (VL1 to VL4). Although not illustrated in the drawing, other wirings may be further disposed in the display device 10. The wirings may include wirings made of a first conductive layer and extending in a first direction DR1 and wirings made of a third conductive layer and extending in the second direction DR2. However, the directions in which the wirings extend are not limited thereto.

First scan lines SL1 and second scan lines SL2 may extend in the first direction DR1. A first scan line SL1 and a second scan line SL2 may be disposed adjacent to each other and may be spaced apart from other first scan lines SL1 and other second scan lines SL2 in the second direction DR2. The first scan line SL1 and the second scan line SL2 may be connected to a scan wiring pad WPD_SC connected to a scan driver (not illustrated). The first scan lines SL1 and the second scan lines SL2 may extend from a pad area PDA disposed in the non-display area NDA to the display area DPA.

Third scan lines SL3 may extend in the second direction DR2, and each of the third scan lines SL3 may be spaced apart from other third scan lines SL3 in the first direction DR1. A third scan line SL3 may be connected to one or more first scan lines SL1 or one or more second scan lines SL2. The scan lines SL may have a mesh structure in the entire display area DPA, but the disclosure is not limited thereto.

In the specification, the term "connect" may mean that any one member and another member are connected to each other not only through physical contact but also through another member. In addition, it can be understood that any one part and another part are connected to each other as one integrated member. Further, the connection between any one member and another member can be interpreted to include electrical connection through another member in addition to connection through direct contact.

The data lines DTL may extend in the first direction DR1. The data lines DTL include first data lines DTL1, second data lines DTL2, and third data lines DTL3. One each of the first to third data lines DTL1 to DTL3 form a group and are disposed adjacent to each other. Each of the data lines DTL1 through DTL3 may extend from the pad area PDA disposed in the non-display area NDA to the display area DPA. However, the disclosure is not limited thereto, and the data lines DTL may be disposed at equal intervals between a first voltage line VL1 and a second voltage line VL2 which will be described below.

The initialization voltage lines VIL may extend in the first direction DR1. Each of the initialization voltage lines VIL may be disposed between the data lines DTL and a first voltage line VL1. The initialization voltage lines VIL may extend from the pad area PDA disposed in the non-display area NDA to the display area DPA.

First voltage lines VL1 and second voltage lines VL2 extend in the first direction DR1, and third voltage lines VL3 and fourth voltage lines VL4 extend in the second direction DR2. The first voltage lines VL1 and the second voltage lines VL2 may be alternately disposed in the second direction DR2, and the third voltage lines VL3 and the fourth voltage lines VL4 may be alternately disposed in the first direction DR1. The first voltage lines VL1 and the second voltage lines VL2 may extend in the first direction DR1 to cross the display area DPA. Among the third voltage lines VL3 and the fourth voltage lines VL4, some lines may be disposed in the display area DPA, and other lines may be disposed in the non-display area NDA located on sides of the display area DPA in the first direction DR1. The first voltage lines VL1 and the second voltage lines VL2 may be made of the first conductive layer, and the third voltage lines VL3 and the fourth voltage lines VL4 may be made of the third conductive layer disposed on a different layer from the first conductive layer. Each of the first voltage lines VL1 may be connected to at least one third voltage line VL3, and each of the second voltage lines VL2 may be connected to at least one fourth voltage line VL4. The voltage lines VL may have a mesh structure in the entire display area DPA. However, the disclosure is not limited thereto.

The first scan lines SL1, the second scan lines SL2, the data lines DTL, the initialization voltage lines VIL, the first voltage lines VL1, and the second voltage lines VL2 may be electrically connected to at least one wiring pad WPD. Each wiring pad WPD may be disposed in the non-display area NDA. In an embodiment, each wiring pad WPD may be disposed in the pad area PDA located on a lower side of the display area DPA which is another side in the first direction DR1. The first and second scan lines SL1 and SL2 are connected to a scan wiring pad WPD_SC disposed in the pad area PDA, and the data lines DTL are connected to different data wiring pads WPD_DT, respectively. Each of the initialization voltage lines VIL is connected to an initialization wiring pad WPD_Vint, the first voltage lines VL1 are connected to a first voltage wiring pad WPD_VL1, and the second voltage lines VL2 are connected to a second voltage wiring pad WPD_VL2. An external device may be mounted on the wiring pads WPD. The external device may be mounted on the wiring pads WPD by an anisotropic conductive film, ultrasonic bonding, or the like. Although FIG. 2 illustrates that each wiring pad WPD is disposed in the pad area PDA located on the lower side of the display area DPA, the disclosure is not limited thereto. Some of the wiring pads WPD may also be disposed in an area located on an upper side or any one of left and right sides of the display area DPA.

Each pixel PX or subpixel SPXn (where n is an integer of about 1 to about 3) of the display device 10 includes a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit can be variously changed. According to an embodiment, each subpixel SPXn of the display device 10 may have a 3TIC structure in which the pixel driving circuit includes three transistors and a capacitor. Although the pixel driving circuit will be described below using the 3TIC structure as an example, the disclosure is not limited thereto, and other various modified pixel structures such as a 2TIC structure, a 7TIC structure, and a 6TIC structure are also applicable.

Figure 3:
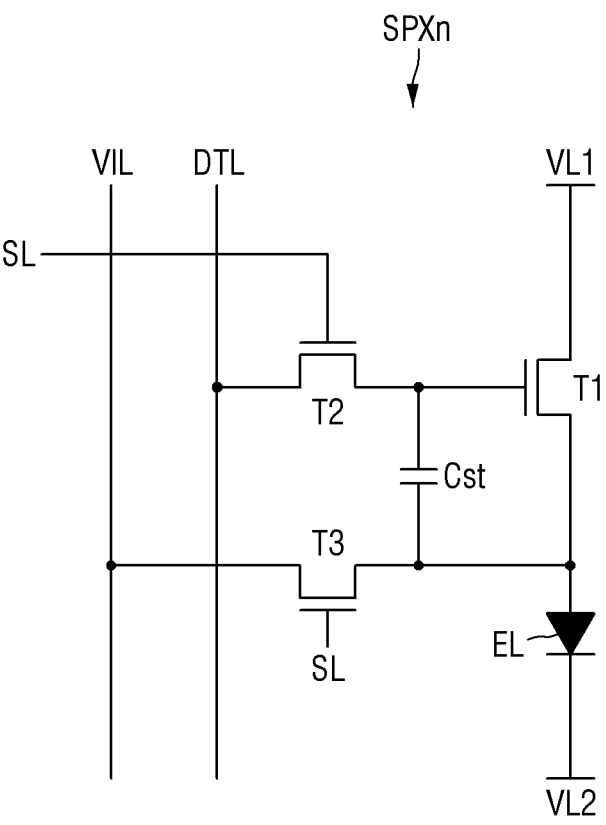
FIGS. 3 and 4 are schematic diagrams of equivalent circuits of pixels of the display device according to the embodiment.
Figure 4:
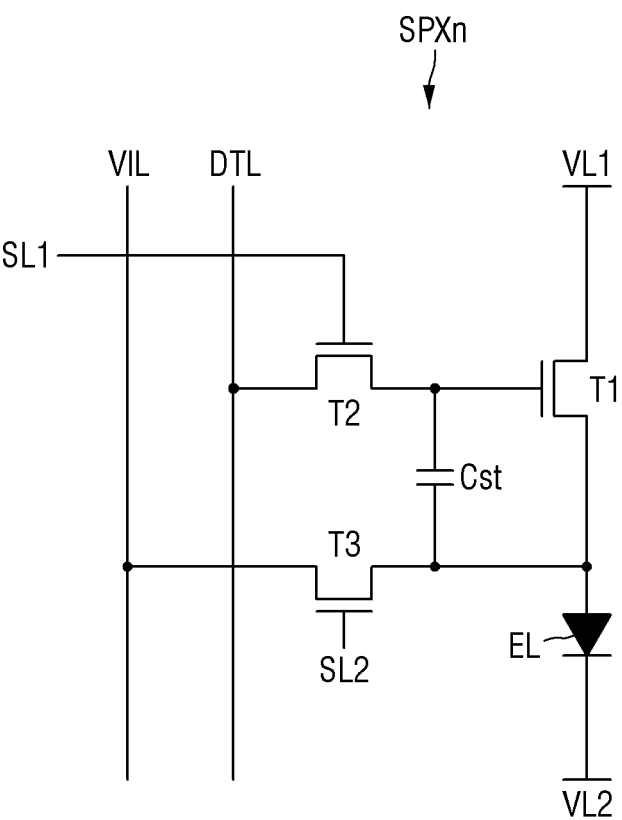

FIGS. 3 and 4 are schematic diagrams of equivalent circuits of pixels of the display device 10 according to the embodiment.

Referring to FIG. 3, each subpixel SPXn of the display device 10 according to the embodiment includes three transistors T1 to T3 and a storage capacitor Cst in addition to a light emitting diode EL.

The light emitting diode EL emits light according to a current supplied through a first transistor T1. The light emitting diode EL includes a first electrode, a second electrode, and at least one light emitting element disposed between them. The light emitting element may emit light of a specific wavelength band in response to electrical signals received from the first electrode and the second electrode.

A first end of the light emitting diode EL may be connected to a source electrode of the first transistor T1, and a second end of the light emitting diode EL may be connected to a second voltage line VL2 to which a low-potential voltage (hereinafter referred to as a second power supply voltage) lower than a high-potential voltage (hereinafter referred to as a first power supply voltage) of a first voltage line VL1 is supplied.

The first transistor T1 adjusts a current flowing from the first voltage line VL1, to which the first power supply voltage is supplied, to the light emitting diode EL according to a voltage difference between a gate electrode and the source electrode thereof. For example, the first transistor T1 may be a driving transistor for driving the light emitting diode EL. The first transistor T1 may have the gate electrode connected to a source electrode of a second transistor T2, the source electrode connected to the first electrode of the light emitting diode EL, and a drain electrode connected to the first voltage line VL1 to which the first power supply voltage is applied.

The second transistor T2 is turned on by a scan signal from a first scan line SL1 to connect a data line DTL to the gate electrode of the first transistor T1. The second transistor T2 may have a gate electrode connected to the first scan line SL1, the source electrode connected to the gate electrode of the first transistor T1, and a drain electrode connected to the data line DTL.

A third transistor T3 is turned on by a scan signal from a second scan line SL2 to connect an initialization voltage line VIL to the first end of the light emitting diode EL. The third transistor T3 may have a gate electrode connected to the second scan line SL2, a drain electrode connected to the initialization voltage line VIL, and a source electrode connected to the first end of the light emitting diode EL or the source electrode of the first transistor T1.

In an embodiment, the source electrode and the drain electrode of each of the transistors T1 to T3 are not limited to the above description, and the opposite may also be the case. Each of the transistors T1 to T3 may be formed as a thin-film transistor. Although FIG. 3 illustrates that each of the transistors T1 to T3 is mainly described as an N-type metal-oxide-semiconductor field-effect transistor (MOSFET), the disclosure is not limited thereto. For example, each of the transistors T1 to T3 may also be formed as a P-type MOSFET, or some of the transistors T1 to T3 may be formed as N-type MOSFETs, and the other may be formed as P-type MOSFETs.

The storage capacitor Cst is formed between the gate electrode and the source electrode of the first transistor T1. The storage capacitor Cst stores a difference between a gate voltage and a source voltage of the first transistor T1.

In the embodiment of FIG. 3, the gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on by scan signals transmitted from different scan lines. However, the disclosure is not limited thereto.

Referring to FIG. 4, the gate electrodes of the second transistor T2 and the third transistor T3 may be connected to a same scan line SL. The second transistor T2 and the third transistor T3 may be simultaneously turned on by a scan signal transmitted from the same scan line.

The structure of a pixel PX of the display device 10 according to the embodiment will now be described in detail with further reference to other drawings.

Figure 5:
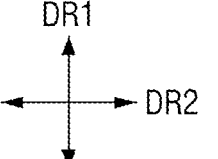
FIG. 5 is a schematic plan view of a pixel of the display device according to the embodiment.
Figure 6:
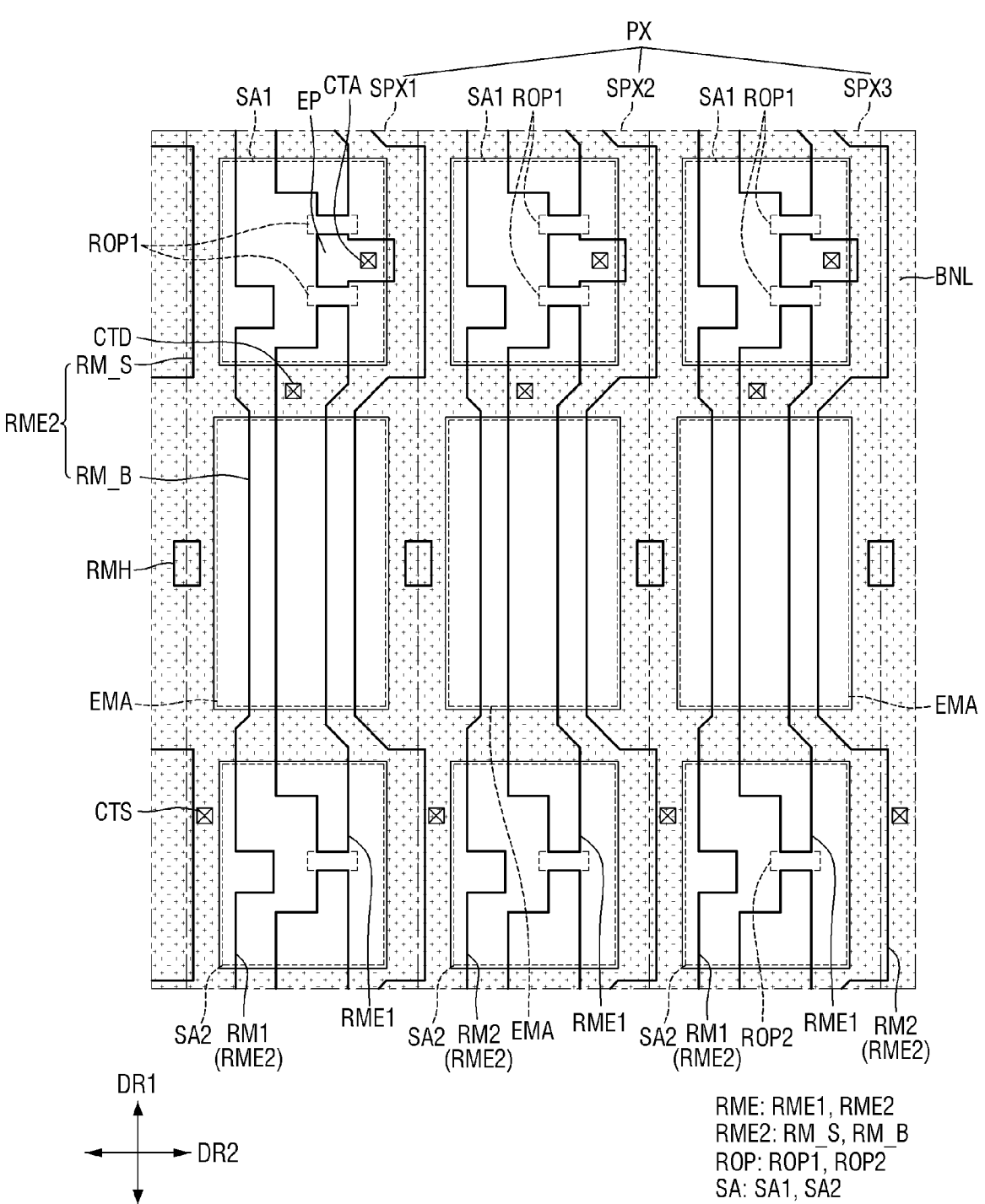
FIG. 6 is a schematic plan view illustrating the arrangement of electrodes and a bank layer in the pixel of FIG. 5.
Figure 7:
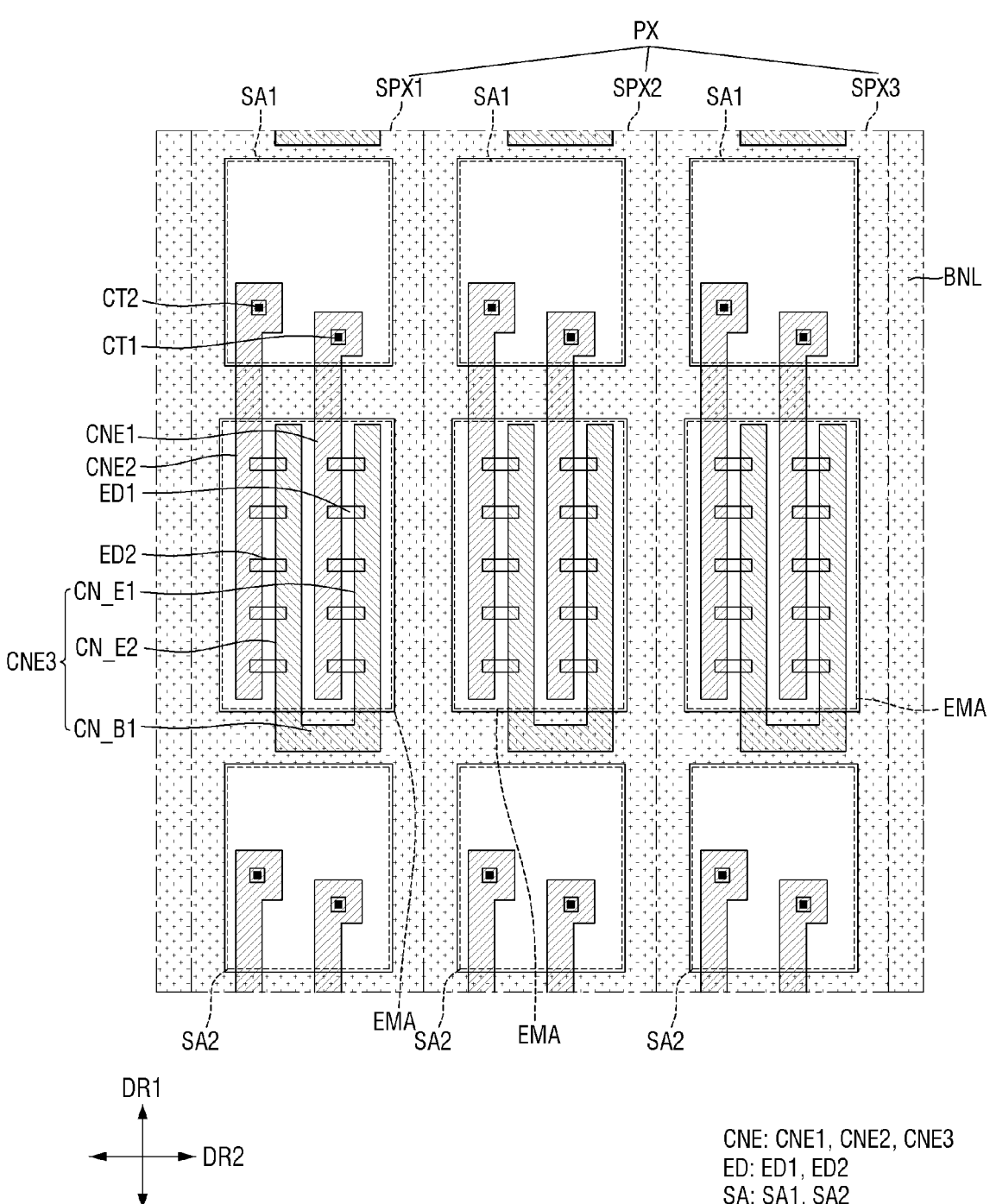
FIG. 7 is a schematic plan view illustrating the arrangement of connection electrodes and light emitting elements in the pixel of FIG. 5.

FIG. 5 is a schematic plan view of a pixel PX of the display device 10 according to the embodiment. FIG. 6 is schematic a plan view illustrating the arrangement of electrodes RME and a bank layer BNL in the pixel PX of FIG. 5. FIG. 7 is a schematic plan view illustrating the arrangement of connection electrodes CNE and light emitting elements ED in the pixel PX of FIG. 5.

FIG. 5 illustrates the planar arrangement of the electrodes RME (RME1 and RME2), bank patterns BP1 and BP2, the bank layer BNL, light emitting elements ED (ED1 and ED2), and the connection electrodes CNE (CNE1 and CNE2) in a pixel PX of the display device 10. FIGS. 6 and 7 illustrate the arrangement of the electrodes RME (RME1 and RME2), the light emitting elements ED (ED1 and ED2), and the connection electrodes CNE (CNE1 and CNE2) based on the bank layer BNL illustrated in the pixel PX of FIG. 5.

Referring to FIGS. 5 to 7, each of the pixels PX of the display device 10 may include subpixels SPXn. For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the disclosure is not limited thereto, and the subpixels SPXn may also emit light of a same color. In an embodiment, the subpixels SPXn may emit blue light. Although FIGS. 5 to 7 illustrate that a pixel PX includes three subpixels SPXn, the disclosure is not limited thereto, and the pixel PX may also include a greater number of subpixels SPXn.

Each subpixel SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area.

The emission area EMA may include an area in which the light emitting elements ED are disposed and an area which is adjacent to the light emitting elements ED and from which light emitted from the light emitting elements ED is output. For example, the emission area EMA may also include an area from which light emitted from the light emitting elements ED is output after being reflected or refracted by other members. Light emitting elements ED may be disposed in each subpixel SPXn, and an area where the light emitting elements ED are disposed and an area adjacent to this area may form the emission area EMA.

Although FIGS. 5 to 7 illustrate that the respective emission areas EMA of the subpixels SPXn have substantially a same area, the disclosure is not limited thereto. In some embodiments, the emission area EMA of each subpixel SPXn may have a different area according to the color or wavelength band of light emitted from the light emitting elements ED disposed in the subpixel SPXn.

Each subpixel SPXn may further include sub-areas SA1 and SA2 disposed in the non-emission area. The sub-areas SA1 and SA2 may include a first sub-area SA1 disposed on an upper side of the emission area EMA which is a first side in the first direction DR1 and a second sub-area SA2 disposed on a lower side of the emission area EMA which is a second side in the first direction DR1. The emission area EMA and the sub-areas SA1 and SA2 may be alternately arranged in the first direction DR1 according to the arrangement of the pixels PX and the subpixels SPXn, and the first sub-area SA1 or the second sub-area SA2 may be disposed between different emission areas EMA spaced apart from each other in the first direction DR1. For example, emission areas EMA may be repeatedly arranged in the first direction DR1 with the first sub-area SA1 or the second sub-area SA2 interposed between them. Emission areas EMA, first sub-areas SA1, and second sub-areas SA2 may each be repeatedly arranged in the second direction DR2. The first sub-areas SA1 and the second sub-areas SA2 may be areas distinguished from each other by the arrangement of wiring connection electrodes EP and the electrodes RME which will be described below. However, the disclosure is not limited thereto, and the arrangement of the emission areas EMA and the sub-areas SA1 and SA2 in pixels PX may also be different from that in FIGS. 5 and 6.

Each of the first and second sub-areas SA1 and SA2 may be an area shared by subpixels SPXn adjacent to each other in the first direction DR1. For example, each of the second sub-areas SA2 illustrated in FIGS. 5 and 6 may be shared by a subpixel SPXn illustrated in the drawings and a subpixel SPXn not illustrated in the drawings and adjacent to the above subpixel SPXn in the first direction DR1. Subpixels SPXn illustrated in the drawings may be subpixels, each having the first sub-area SA1 disposed above the emission area EMA, and subpixels SPXn adjacent to the above subpixels SPXn in the first direction DR1 may be subpixels, each having the second sub-area SA2 disposed above the emission area EMA.

Light may not exit from the sub-areas SA1 and SA2 because the light emitting elements ED are not disposed in the sub-areas SA1 and SA2, but a portion of each of the electrodes RME disposed in each subpixel SPXn may be disposed in the sub-areas SA1 and SA2. The electrodes RME disposed in different subpixels SPXn may be separated from each other in separation portions ROP of the sub-areas SA1 and SA2.

The display device 10 according to the embodiment may include the electrodes RME (RME1 and RME2), the bank patterns BP1 and BP2, the bank layer BNL, the light emitting elements ED, and the connection electrodes CNE (CNE1 and CNE2).

The bank patterns BP1 and BP2 may be disposed in the emission area EMA of each subpixel SPXn. Each of the bank patterns BP1 and BP2 may have a width in the second direction DR2 and may extend in the first direction DR1.

For example, the bank patterns BP1 and BP2 may include first and second bank patterns BP1 and BP2 spaced apart from each other in the second direction DR2 in the emission area EMA of each subpixel SPXn. The first bank pattern BP1 is disposed in a center of the emission area EMA, and the second bank patterns BP2 are spaced apart from each other with the first bank pattern BP1 interposed between them. The first and second bank patterns BP1 and BP2 may be alternately disposed in the second direction DR2 and may be disposed as island-shaped patterns in the display area DPA. Light emitting elements ED may be disposed between the first and second bank patterns BP1 and BP2.

The first and second bank patterns BP1 and BP2 may have different widths measured in the second direction DR2. A width of the first bank pattern BP1 measured in the second direction DR2 may be smaller than a width of each of the second bank patterns BP2. While the first bank pattern BP1 is disposed in the emission area EMA of each subpixel SPXn, each of the second bank patterns BP2 may be disposed over the emission areas EMA of two subpixels SPXn adjacent to each other in the second direction DR2. Each of the second bank patterns BP2 may be disposed at a boundary between subpixels SPXn adjacent to each other in the second direction DR2 and may overlap (e.g., in a plan view) the bank layer BNL to be described below. However, the disclosure is not limited thereto, and the first and second bank patterns BP1 and BP2 may also have a same width.

The first and second bank patterns BP1 and BP2 may have a same length in the first direction DR1 but may be shorter in the first direction DR1 than the emission area EMA surrounded by the bank layer BNL. The first and second bank patterns BP1 and BP2 may be spaced apart from portions of the bank layer BNL which extend in the second direction DR2. However, the disclosure is not limited thereto, and the bank patterns BP1 and BP2 may also be integral with the bank layer BNL or may partially overlap the portions of the bank layer BNL which extend in the second direction DR2. The length of each of the bank patterns BP1 and BP2 in the first direction DR1 may be equal to or greater than the length, in the first direction DR1, of the emission area EMA surrounded by the bank layer BNL.

Although FIG. 5 illustrates that first bank pattern BP1 and two different second bank patterns BP2 are disposed in each subpixel SPXn, the disclosure is not limited thereto. The number and shape of the bank patterns BP1 and BP2 may vary according to the number or arrangement structure of the electrodes RME.

The electrodes RME (RME1 and RME2) extend in a direction and are disposed in each subpixel SPXn. The electrodes RME1 and RME2 may extend in the first direction DR1 to lie in the emission area EMA of each subpixel SPXn and may be spaced apart from each other in the second direction DR2. The electrodes RME may be electrically connected to the light emitting elements ED. However, the disclosure is not limited thereto, and the electrodes RME may also not be electrically connected to the light emitting elements ED.

The display device 10 may include a first electrode RME1 disposed in each subpixel SPXn and second electrodes RME2, each being disposed over different subpixels SPXn. The first electrode RME1 may be disposed adjacent to a center of each subpixel SPXn and may be disposed over the emission area EMA and the sub-areas SA1 and SA2. Each of the second electrodes RME2 may be spaced apart from the first electrode RME1 in the second direction DR2 in the emission area EMA and may be disposed over subpixels SPXn. The first and second electrodes RME1 and RME2 may generally extend in the first direction DR1 but may have different lengths in the first direction DR1, and their portions disposed in the emission area EMA may have different shapes.

The first electrode RME1 may be disposed in the center of each subpixel SPXn, and a portion thereof disposed in the emission area EMA may be disposed on the first bank pattern BP1. The first electrode RME1 may extend in the first direction DR1 from the first sub-area SA1 to the second sub-area SA2 via the emission area EMA. A width of the first electrode RME1 measured in the second direction DR2 may vary according to position, and a portion thereof overlapping the first bank pattern BP1 at least in the emission area EMA may have a greater width than the first bank pattern BP1.

Each of the second electrodes RME2 may include a portion extending in the first direction DR1 and a portion widening around the emission area EMA. According to an embodiment, each of the second electrodes RME2 may include an electrode stem portion RM_S extending in the first direction DR1 and a widened electrode portion RM_B connected to or extending from the electrode stem portion RM_S and wider than the electrode stem portion RM_S in the second direction DR2.

The electrode stem portion RM_S may overlap a portion of the bank layer BNL which extends in the first direction DR1 and may be disposed on a side of each sub-area SA in the second direction DR2. The electrode stem portion RM_S of the second electrode RME2 may be disposed between the first sub-areas SA1 and between the second sub-areas SA2 of subpixels SPXn adjacent to each other in the second direction DR2. The electrode stem portion RM_S may be disposed between the sub-areas SA1 and SA2 adjacent to each other in the second direction DR2, and a portion thereof may protrude to each of the sub-areas SA1 and SA2.

The widened electrode portion RM_B may be disposed on sides (or both sides) of the center of each subpixel SPXn in the second direction DR2 and may be disposed on each of the second bank patterns BP2. Each of the second electrodes RME2 may widen in the second direction DR2 at an intersection of a portion of the bank layer BNL which extends in the first direction DR1 and a portion of the bank layer BNL which extends in the second direction DR2. The widened electrode portion RM_B may be disposed over the emission areas EMA of subpixels SPXn adjacent to each other in the second direction DR2 and may overlap an area between the subpixels SPXn. The widened electrode portion RM_B may overlap a portion disposed between adjacent subpixels SPXn among portions of the bank layer BNL which extend in the first direction DR1.

The second electrodes RME2 may generally extend in the first direction DR1 and may be disposed between subpixels SPXn adjacent to each other in the second direction DR2. The second electrodes RME2 may be classified into different electrode lines RM1 and RM2 disposed on sides (or both sides) of the first electrode RME1 in the second direction DR2. The second electrodes RME2 may include a first electrode line RM1 and a second electrode line RM2 different from each other, and the first electrode line RM1 and the second electrode line RM2 may be alternately disposed in the second direction DR2. For example, in the first subpixel SPX1, the second electrode RME2 disposed on a left side of the first electrode RME1 may be a first electrode line RM1, and the second electrode RME2 disposed on a right side of the first electrode RME1 may be a second electrode line RM2. In the second subpixel SPX2, the second electrode RME2 disposed on the left side of the first electrode RME1 may be the second electrode line RM2, and the second electrode RME2 disposed on the right side of the first electrode RME1 may be the first electrode line RM1. In the third subpixel SPX3, the second electrode RME2 disposed on the left side of the first electrode RME1 may be the first electrode line RM1, and the second electrode RME2 disposed on the right side of the first electrode RME1 may be the second electrode line RM2.

The width of the first electrode RME1 measured in the second direction DR2 may be greater than a width of the electrode stem portion RM_S of each second electrode RME2 but may be smaller than a width of the widened electrode portion RM_B. The first electrode RME1 may have a greater width than the first bank pattern BP1 and may overlap sides (or both sides) of the first bank pattern BP1.

The electrode stem portion RM_S of each second electrode RME2 may have a relatively small width so that it can be disposed between the sub-areas SA1 and SA2. On the other hand, the widened electrode portion RM_B may have a greater width than the first electrode RME1. The first electrode RME1 and the second electrodes RME2 may cover sides (or both sides) of the first bank pattern BP1 and sides (or both sides) of the second bank patterns BP2 in the second direction DR2, respectively. A distance between the first and second bank patterns BP1 and BP2 may be greater than a distance between the first and second electrodes RME and RME2. According to an embodiment, a maximum width of the widened electrode portion RM_B may be greater than the width of each second bank pattern BP2 and may be greater than a width of a portion of the bank layer BNL which extends in the first direction DR1.

The widened electrode portion RM_B of each of the second electrodes RME2 may cover a second bank pattern BP2 and, similar to the second bank pattern BP2, may be disposed over different subpixels SPXn. The first electrode RME1 may be disposed to correspond to any one subpixel SPXn, whereas the widened electrode portion RM_B of each of the second electrodes RME2 is disposed over adjacent subpixels SPXn. Subpixels SPXn adjacent to each other in the second direction DR2 may share the widened electrode portion RM_B of a second electrode RME2.

In an embodiment, the widened electrode portion RM_B of each second electrode RME2 may cover an area between the emission areas EMA of adjacent subpixels SPXn. Light emitting elements ED may be disposed in each emission area EMA and may be disposed between the first and second bank patterns BP1 and BP2. As will be described below, the light emitting elements ED may be disposed between the first and second bank patterns BP1 and BP2 so that ends (or both ends) thereof are placed on the electrodes RME1 and RME2 by an electric field generated on the first and second electrodes RME1 and RME2.

In case that an electrical signal is transmitted to each of the electrodes RME1 and RME2, it may also be transmitted to a conductive layer or a wiring disposed on a different layer from the electrodes RME1 and RME2, and an unwanted electric field may be generated between the electrodes RME1 and RME2 and the conductive layer. An electric field generated between the bank patterns BP1 and BP2 in the emission area EMA may cause the light emitting elements ED to be placed on the electrodes RME1 and RME2, but electric fields generated in other areas may cause the light emitting elements ED to be placed at unwanted positions. In the display device 10 according to the embodiment, any one of the electrodes RME1 and RME2 utilized to align the light emitting elements ED is disposed over adjacent subpixels SPXn. Therefore, an electric field for aligning the light emitting elements ED may be formed between the bank patterns BP1 and BP2 in the emission area EMA.

For example, another conductive layer may be disposed under the electrodes RME in an area between the subpixels SPXn, and an electric field generated between the conductive layers and the electrodes RME may induce the light emitting elements ED to be placed in an area other than the area between the bank patterns BP1 and BP2. According to an embodiment, since the widened electrode portion RM_B of each second electrode RME2 is disposed over adjacent subpixels SPXn in the display device 10, an unwanted electric field may not be generated between the another conductive layer, which is disposed between the subpixels SPXn, and the electrodes RME1 and RME2. An electric field generated on the first and second electrodes RME1 and RME2, to which different electrical signals are transmitted, may be generated only between the bank patterns BP1 and BP2, and the proportion of the light emitting elements ED aligned between the bank patterns BP1 and BP2 in the emission area EMA may increase.

According to an embodiment, each of the second electrodes RME2 may include an electrode hole RMH formed in the widened electrode portion RM_B. Since the widened electrode portion RM_B covers each of the second bank patterns BP2, a path through which gas emitted from layers disposed under each second electrode RME2 is discharged may be needed in a manufacturing process of the display device 10. The gas discharge path may be formed to prevent the electrodes RME1 and RME2 disposed on the layers from being peeled or stripped off or lifted by the gas during the manufacturing process. Each of the second electrodes RME2 may include the electrode hole RMH formed in a portion thereof overlapping the bank layer BNL, and gases generated from the layers under the second electrode RME2 may be discharged through the electrode hole RMH. The widened electrode portion RM_B of each second electrode RME2 and the electrode hole RMH will be described in more detail below with reference to other drawings.

The first electrode RME1 may contact a first conductive pattern CDP1 of the third conductive layer through a first electrode contact hole CTD in a portion of the first electrode RME1 overlapping a portion of the bank layer BNL which extends in the second direction DR2. Each of the second electrodes RME2 may contact a second conductive pattern CDP2 of the third conductive layer through a second electrode contact hole CTS in a portion of the electrode stem portion RM_S overlapping a portion of the bank layer BNL which extends in the first direction DR1. A portion of the first electrode RME1 which is disposed in a sub-area SA may overlap a first contact portion CT1, and each of the second electrodes RME2 may include a portion protruding from the electrode stem portion RM_S in the second direction DR2 to lie in a sub-area SA and may overlap a second contact portion CT2 in the protruding portion.

The first electrode RME1 may be disposed up to separation portions ROP1 and ROP2 of the sub-areas SA1 and SA2. Thus, the first electrodes RME1 of subpixels SPXn adjacent to each other in the first direction DR1 may be separated from each other. On the other hand, the second electrodes RME2 may not be separated in the sub-areas SA1 and SA2. A second electrode RME2 may be disposed in subpixels SPXn adjacent to each other in the first direction DR1. A second electrode RME2 including electrode stem portions RM_S and widened electrode portions RM_B may extend in the first direction DR1 and may have different widths around the emission area EMA and around the sub-areas SA1 and SA2 of each subpixel SPXn. The first electrode RME1 may be disposed between the separation portions ROP1 and ROP2 disposed in different sub-areas SA1 and SA2 of each subpixel SPXn and may be disposed across the emission area EMA.

The display device 10 may include a wiring connection electrode EP disposed in the first sub-area SA1 among the sub-areas SA1 and SA2 and disposed between the first electrodes RME1 of different subpixels SPXn. The wiring connection electrode EP may not be disposed in the second sub-area SA2 of each subpixel SPXn, and the first electrodes RME1 of different subpixels SPXn adjacent to each other in the first direction DR1 may be spaced apart from each other in the second sub-area SA2. In each of the subpixels SPXn illustrated in FIGS. 5 and 6 among subpixels SPXn, the first sub-area SA1 in which the wiring connection electrode EP is disposed may be disposed above the emission area EMA, and the second sub-area SA2 may be disposed below the emission area EMA. On the other hand, in each of the subpixels SPXn adjacent to the subpixels SPXn of FIGS. 5 and 6 in the first direction DR1, the first sub-area SA1 in which the wiring connection electrode EP is disposed may be disposed below the emission area EMA, and the second sub-area SA2 may be disposed above the emission area EMA.

The first electrode RME1 may be spaced apart from the wiring connection electrode EP with a first separation portion ROP1 interposed between them in the first sub-area SA1. Two first separation portions ROP1 may be disposed in a first sub-area SA1. The wiring connection electrode EP may be spaced apart from the first electrode RME1 disposed in a corresponding subpixel SPXn with a lower first separation portion ROP1 interposed between them and may be spaced apart from the first electrode RME1 disposed in another subpixel SPXn with an upper first separation portion ROP interposed between them. In the second sub-area SA2, a second separation portion ROP2 may be disposed, and different first electrodes RME1 may be spaced apart from each other in the first direction DR1.

Although FIGS. 5 and 6 illustrate that a first electrode RME1 and two different second electrodes RME2 are disposed in each subpixel SPXn, the disclosure is not limited thereto. For example, in the display device 10, a greater number of electrodes RME may be disposed in a subpixel SPXn, or the arrangement and shape of the electrodes RME may be changed.

The bank layer BNL may surround the subpixels SPXn, the emission areas EMA, and the sub-areas SA1 and SA2. The bank layer BNL may be disposed between the subpixels SPXn adjacent to each other in the first direction DR1 and the second direction DR2 and may also be disposed between the emission areas EMA and the sub-areas SA1 and SA2. The subpixels SPXn, the emission areas EMA, and the sub-areas SA1 and SA2 of the display device 10 may be areas separated by the arrangement of the bank layer BNL. Distances between the subpixels SPXn, the emission areas EMA, and the sub-areas SA1 and SA2 may vary according to a width of the bank layer BNL.

The bank layer BNL may include portions extending in the first direction DR1 and the second direction DR2 in a plan view to form a grid pattern in the entire display area DPA. The bank layer BNL may be disposed at the boundary of each subpixel SPXn to separate neighboring subpixels SPXn. The bank layer BNL may surround the emission area EMA and the sub-areas SA1 and SA2 disposed in each subpixel SPXn to separate them from each other.

The light emitting elements ED may be disposed in the emission area EMA. The light emitting elements ED may be disposed between the bank patterns BP1 and BP2 and may be spaced apart from each other in the first direction DR1. In an embodiment, the light emitting elements ED may extend in a direction, and ends (or both ends) thereof may be disposed on different electrodes RME, respectively. A length of each light emitting element ED may be greater than the distance between the electrodes RME spaced apart from each other in the second direction DR2. The direction in which the light emitting elements ED extend may be substantially perpendicular to the first direction DR1 in which the electrodes RME extend. However, the disclosure is not limited thereto, and the direction in which the light emitting elements ED extend may also be the second direction DR2 or a direction oblique to the second direction DR2.

The light emitting elements ED may include first light emitting elements ED1 having both ends disposed on the first electrode RME1 and any one of the second electrodes RME2 and second light emitting elements ED2 having ends (or both ends) disposed on the first electrode RME1 and the other second electrode RME2. In the first subpixel SPX1, the first light emitting elements ED1 may be disposed on the second electrode RME2 of the second electrode line RM2, and the second light emitting elements ED2 may be disposed on the second electrode RME2 of the first electrode line RM1. The first light emitting elements ED1 may be disposed on the right side of the first electrode RME1, and the second light emitting elements ED2 may be disposed on the left side of the first electrode RME1. The first light emitting elements ED1 and the second light emitting elements ED2 may be disposed on the first and second electrodes RME1 and RME2 but may be disposed on different second electrodes RME2.

According to an embodiment, since each of the second electrodes RME2 including the widened electrode portion RM_B is disposed in different subpixels SPXn, some of the light emitting elements ED disposed in the different subpixels SPXn may be disposed on a same second electrode RME2. For example, each of the first light emitting elements ED1 of the first subpixel SPX1 may have an end disposed on the second electrode RME2 of the second electrode line RM2, and each of the second light emitting elements ED2 of the second subpixel SPX2 may also have an end disposed on the second electrode RME2 of the second electrode line RM2. In the display device 10, since any one electrode RME is disposed in subpixels SPXn, the subpixels SPXn may share the electrode RME on which the light emitting elements ED are disposed. As will be described below, the second electrodes RME2 are electrodes to which a second power supply voltage, for example, a common voltage is applied. Therefore, different subpixels SPXn can share a second electrode RME2 without any problem.

The connection electrodes CNE (CNE1 to CNE3) may be disposed on the electrodes RME and the bank patterns BP1 and BP2. The connection electrodes CNE may extend in a direction and may be spaced apart from each other. The connection electrodes CNE may contact the light emitting elements ED and may be electrically connected to the electrodes RME or a conductive layer under the electrodes RME.

The connection electrodes CNE (CNE1 to CNE3) may include a first connection electrode CNE1, a second connection electrode CNE2, and a third connection electrode CNE3 disposed in each subpixel SPXn.

The first connection electrode CNE1 may extend in the first direction DR1 and may be disposed on the first electrode RME1. The first connection electrode CNE1 may overlap the first bank pattern BP1 and the first electrode RME1 and may extend in the first direction DR1 from the emission area EMA to the first sub-area SA1 located above the emission area EMA. The first connection electrode CNE1 may contact the first electrode RME1 through the first contact portion CT1 formed on the first electrode RME1 in the first sub-area SA1.

The second connection electrode CNE2 may be spaced apart from the first connection electrode CNE1 in the second direction DR2, may extend in the first direction DR1, and may be disposed on a second electrode RME2. The second connection electrode CNE2 may be disposed on the second electrode RME2 on the left side of the first electrode RME1, and for example, may be disposed on the second electrode RME2 of the first electrode line RM1 in the first subpixel SPX1. The second connection electrode CNE2 may overlap a second bank pattern BP2 and the widened electrode portion RM_B of the second electrode RME2 and may extend in the first direction DR1 from the emission area EMA to the first sub-area SA1 located above the emission area EMA. The second connection electrode CNE2 may contact the second electrode RME2 through the second contact portion CT2 formed on the second electrode RME2 in the first sub-area SA1.

The third connection electrode CNE3 may include extension portions CN_E1 and CN_E2 extending in the first direction DR1 and a first connection portion CN_B1 connecting the extension portions CN_E1 and CN_E2 to each other. A first extension portion CN_E1 may face the first connection electrode CNE1 in the emission area EMA and may be disposed on a second electrode RME2. In the first subpixel SPX1, the first extension portion CN_E1 may be disposed on the widened electrode portion RM_B of the second electrode RME2 of the second electrode line RM2. A second extension portion CN_E2 may face the second connection electrode CNE2 in the emission area EMA and may be disposed on the first electrode RME1. The first connection portion CN_B1 may extend in the second direction DR2 on the bank layer BNL disposed below the emission area EMA and may connect the first extension portion CN_E1 and the second extension portion CN_E2 to each other. The third connection electrode CNE3 may be disposed in the emission area EMA and on the bank layer BNL and may not be directly connected to the electrodes RME. The second electrode RME2 disposed under the first extension portion CN_E1 may be electrically connected to a second voltage line VL2, but the second power supply voltage applied to the second electrode RME2 may not be transferred to the third connection electrode CNE3.

The display device 10 may further include insulating layers PAS1 to PAS3 disposed between the electrodes RME1 and RME2, the light emitting elements ED, and the connection electrodes CNE1 to CNE3. The electrodes RME1 and RME2, the light emitting elements ED, and the connection electrodes CNE1 to CNE3 may overlap each other but may partially contact each other by the insulating layers PAS1 to PAS3 disposed between them.

Figure 8:
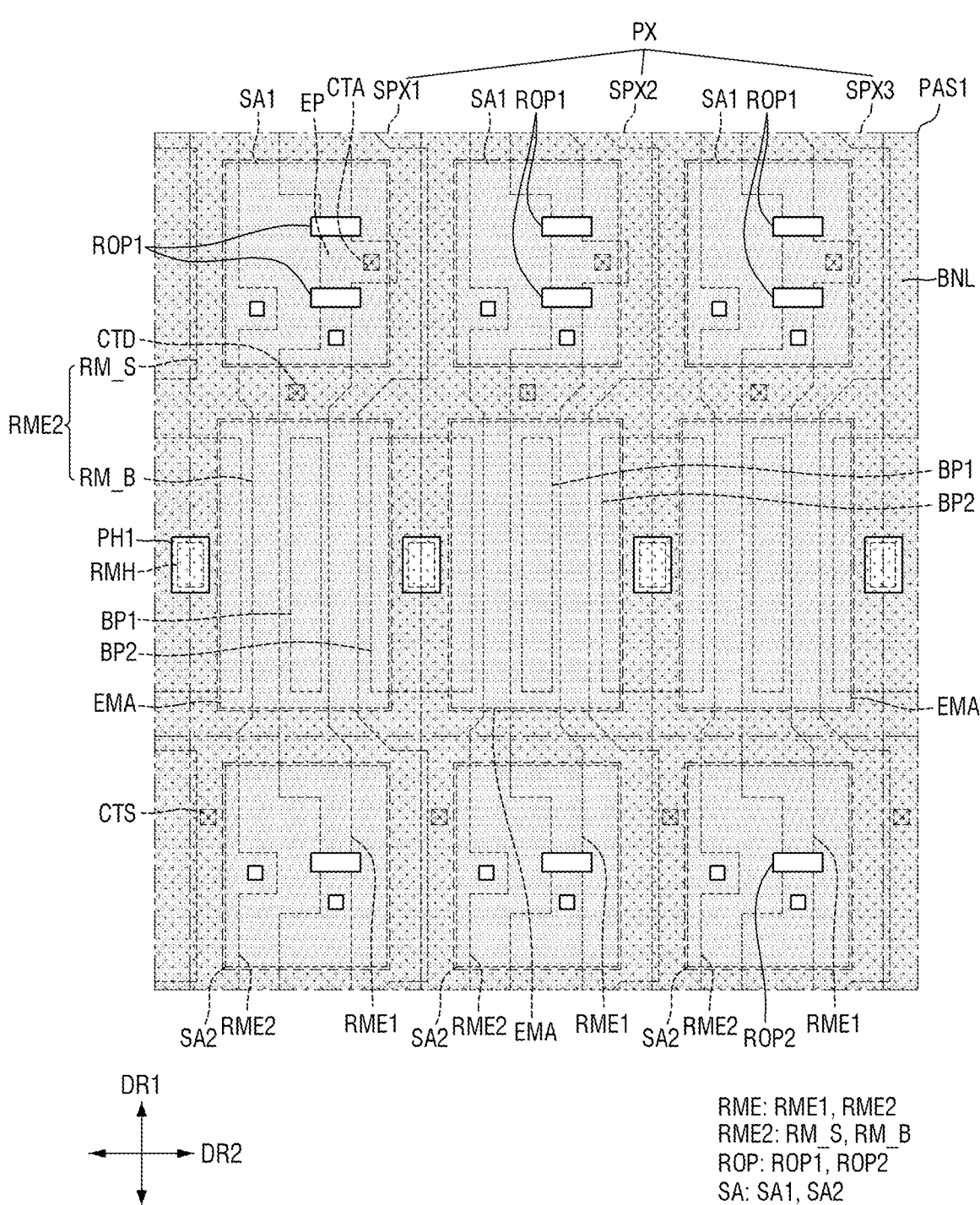
FIGS. 8 through 10 are schematic plan views illustrating the arrangement of first through third insulating layers in the pixel of FIG. 5.
Figure 9:
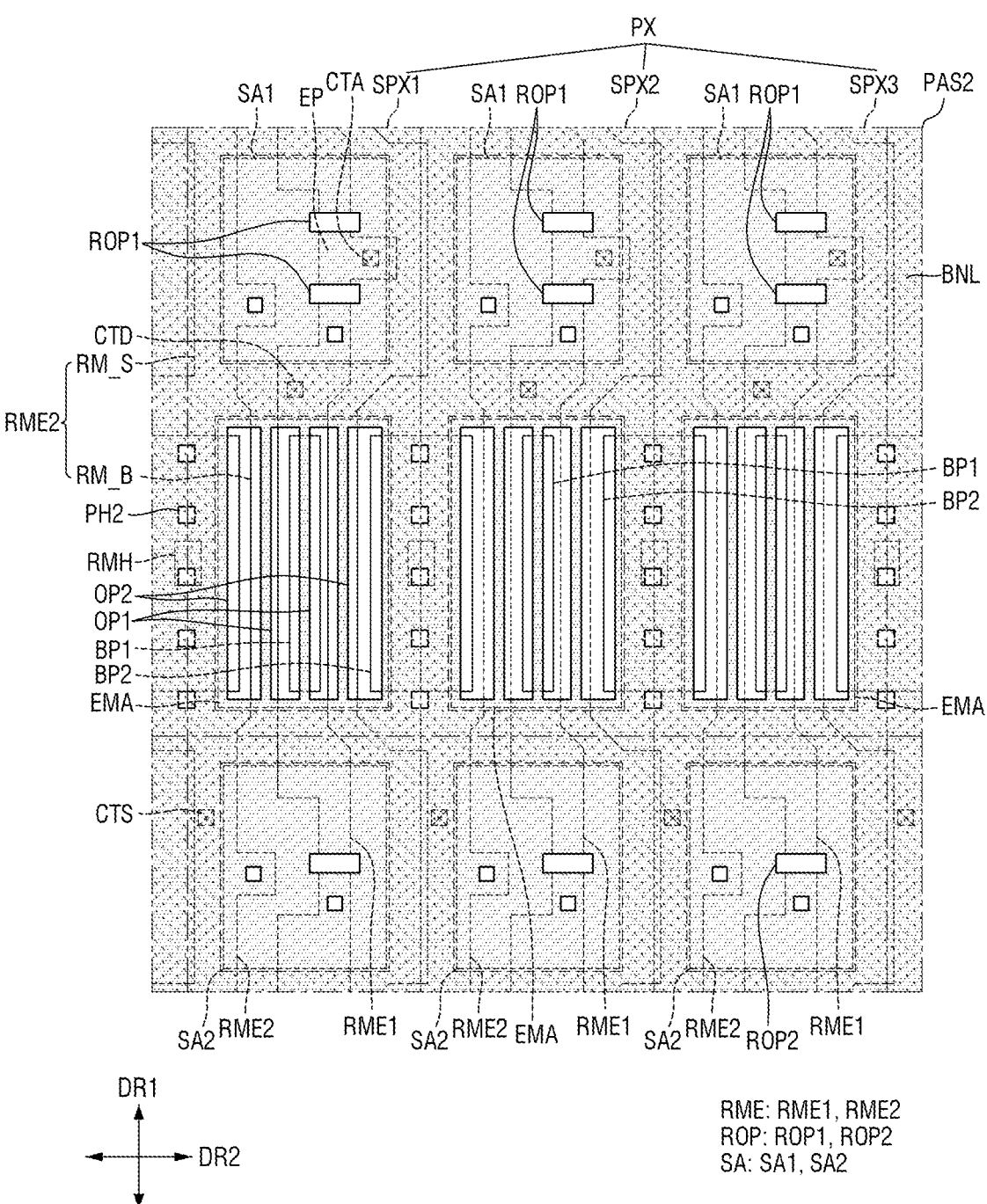
Figure 10:
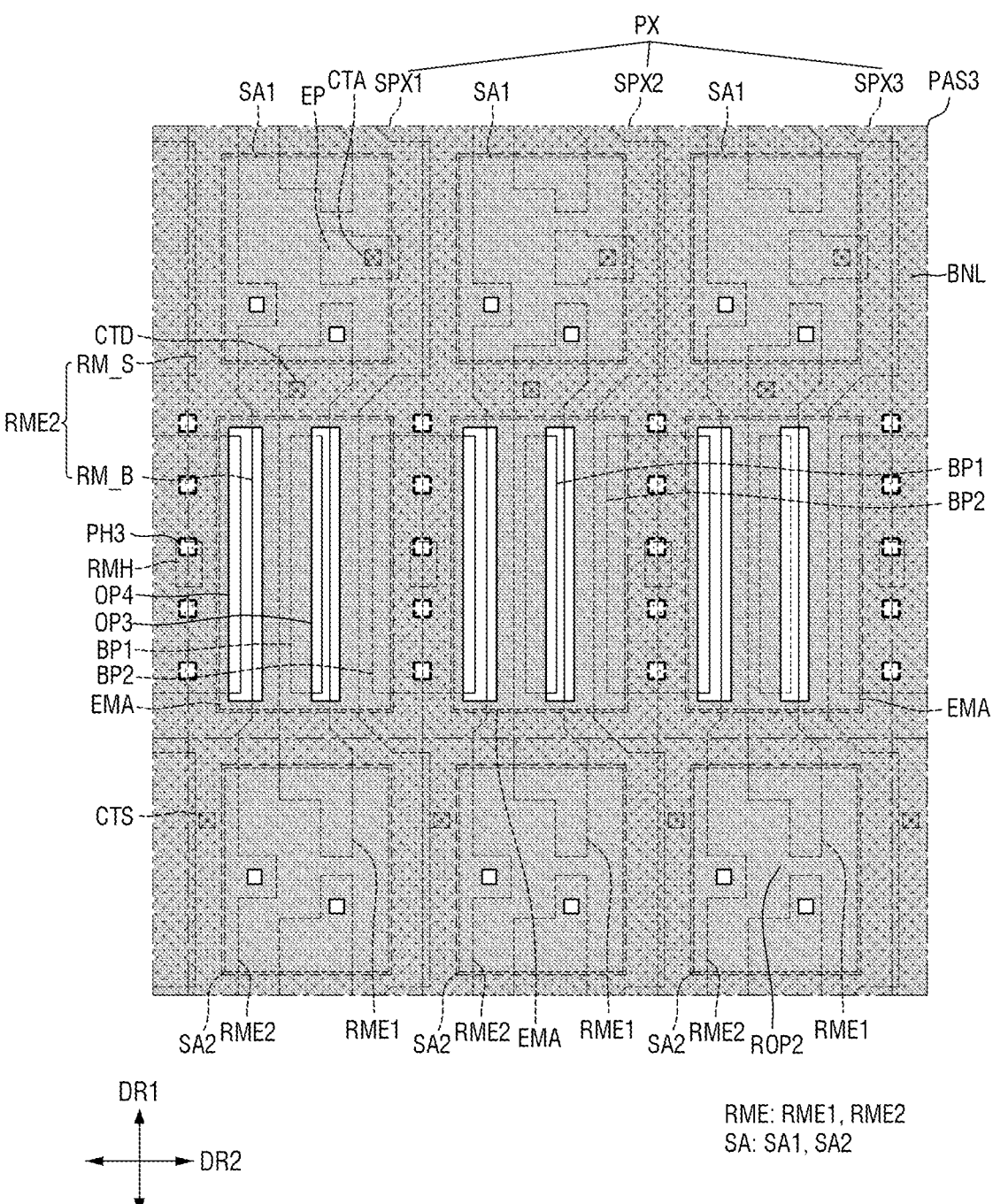
Figure 11:
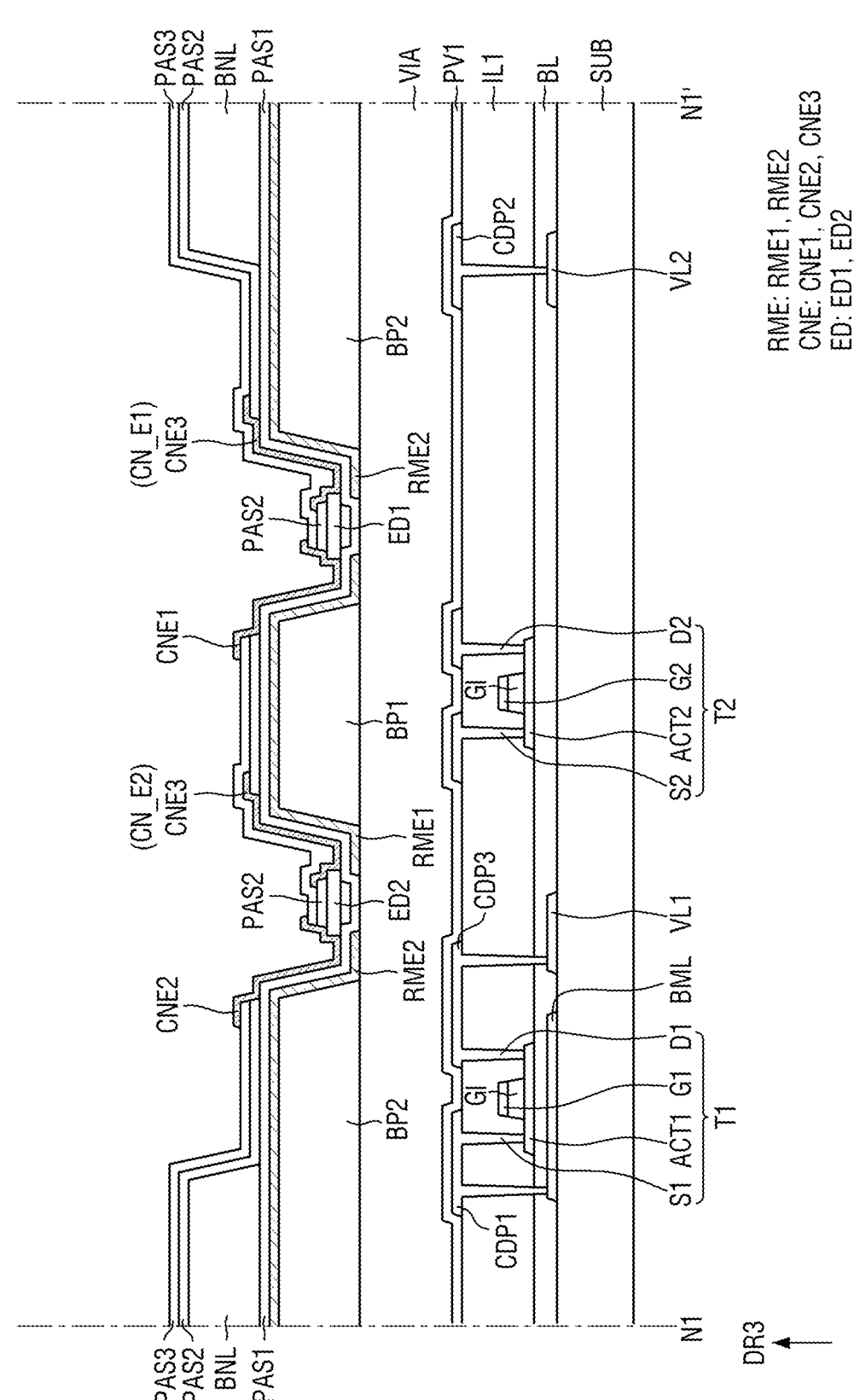
FIG. 11 is a schematic cross-sectional view taken along line N1-N1' of FIG. 5.
Figure 12:
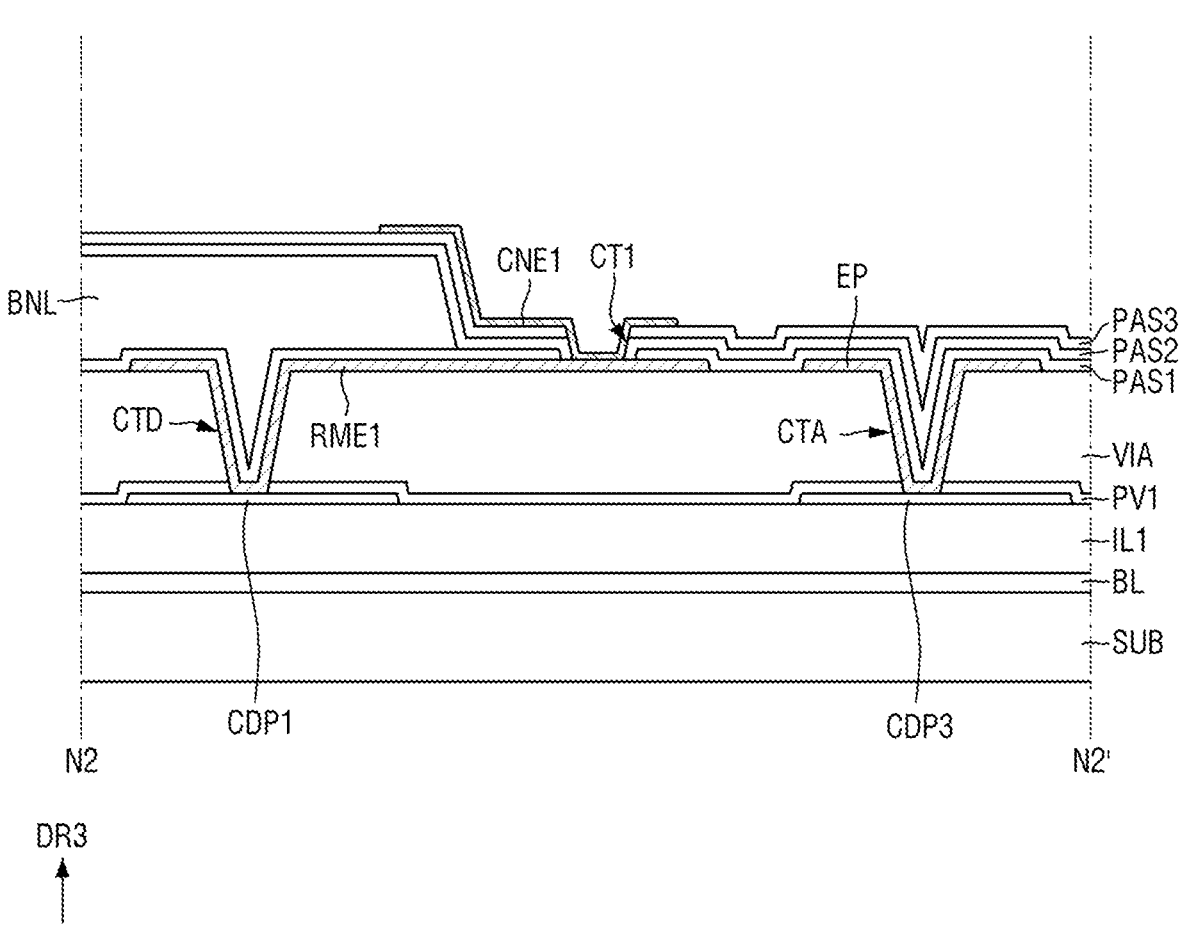
FIG. 12 is a schematic cross-sectional view taken along line N2-N2' of FIG. 5.
Figure 13:
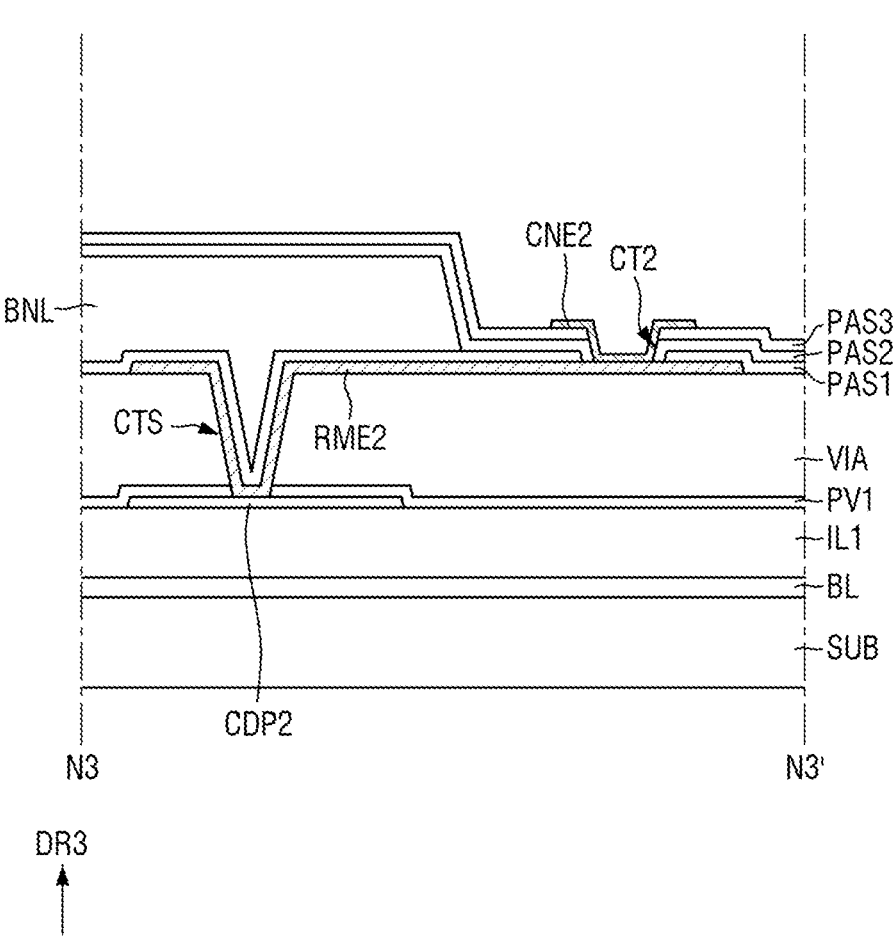
FIG. 13 is a schematic cross-sectional view taken along line N3-N3' of FIG. 5.

FIGS. 8 to 10 are schematic plan views illustrating the arrangement of first to third insulating layers PAS1 to PAS3 in the pixel PX of FIG. 5. FIG. 11 is a schematic cross-sectional view taken along line N1-N1' of FIG. 5. FIG. 12 is a schematic cross-sectional view taken along line N2-N2' of FIG. 5. FIG. 13 is a schematic cross-sectional view taken along line N3-N3' of FIG. 5.

FIGS. 8 to 10 illustrate the planar arrangement of the first insulating layer PAS1, the second insulating layer PAS2, and the third insulating layer PAS3. FIG. 11 illustrates a cross section across ends (or both ends) of light emitting elements ED (ED1 and ED2) disposed on different electrodes RME (RME1 and RME2). FIGS. 12 and 13 illustrate cross sections across electrode contact holes CTD, CTS and CTA and contact portions CT1 and CT2.

The cross-sectional structure of the display device 10 will now be described with reference to FIGS. 5 to 7 and 8 to 13. The display device 10 may include a first substrate SUB and a semiconductor layer, conductive layers, and insulating layers disposed on the first substrate SUB. The display device 10 may include the electrodes RME (RME1 and RME2), the light emitting elements ED (ED1 and ED2), and the connection electrodes CNE (CNE1 to CNE3). The semiconductor layer, the conductive layers, and the insulating layers may constitute a circuit layer of the display device 10.

The first substrate SUB may be an insulating substrate. The first substrate SUB may be made of an insulating material such as glass, quartz, or polymer resin. The first substrate SUB may be a rigid substrate, but may also be a flexible substrate that can be bent, folded, rolled, etc. The first substrate SUB may include the display area DPA and the non-display area NDA surrounding the display area DPA, and the display area DPA may include the emission area EMA and the sub-areas SA1 and SA2 which are part of the non-emission area.

A first conductive layer may be disposed on the first substrate SUB. The first conductive layer may include a bottom metal layer BML, a first voltage line VL1, and a second voltage line VL2. The bottom metal layer BML may overlap a first active layer ACT1 of a first transistor T1. The bottom metal layer BML may prevent light from entering the first active layer ACT1 of the first transistor T1 or may be electrically connected to the first active layer ACT1 to stabilize electrical characteristics of the first transistor T1. However, the bottom metal layer BML may also be omitted.

A high-potential voltage (or a first power supply voltage) supplied to the first electrode RME1 may be applied to the first voltage line VL1, and a low-potential voltage (or a second power supply voltage) supplied to each second electrode RME2 may be applied to the second voltage line VL2. The first voltage line VL1 may be electrically connected to the first transistor T1 by a conductive pattern (e.g., a third conductive pattern CDP3) of a third conductive layer. The second voltage line VL2 may be electrically connected to each second electrode RME2 by a conductive pattern (e.g., a second conductive pattern CDP2) of the third conductive layer.

Although FIG. 11 illustrates that the first voltage line VL1 and the second voltage line VL2 are disposed in the first conductive layer, the disclosure is not limited thereto. In some embodiments, the first voltage line VL1 and the second voltage line VL2 may be disposed in the third conductive layer and may be directly electrically connected to the first transistor T1 and each second electrode RME2, respectively.

A buffer layer BL may be disposed on the first conductive layer and the first substrate SUB. The buffer layer BL may be formed on the first substrate SUB to protect transistors of each pixel PX from moisture introduced through the first substrate SUB which is vulnerable to moisture penetration and may perform a surface planarization function.

The semiconductor layer is disposed on the buffer layer BL. The semiconductor layer may include the first active layer ACT1 of the first transistor T1 and a second active layer ACT2 of a second transistor T2. The first active layer ACT1 and the second active layer ACT2 may respectively partially overlap a first gate electrode G1 and a second gate electrode G2 of a second conductive layer which will be described below.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although FIG. 11 illustrates that a first transistor T1 is disposed in each subpixel SPXn of the display device 10, the disclosure is not limited thereto, and the display device 10 may include a greater number of transistors.

A first gate insulating layer GI is disposed on the semiconductor layer in the display area DPA. The first gate insulating layer GI may serve as a gate insulating film of each of the transistors T1 and T2. FIG. 11 illustrates that the first gate insulating layer GI is patterned together with the gate electrodes G1 and G2 of the second conductive layer to be described below and is thus partially disposed between the second conductive layer and the active layers ACT1 and ACT2 of the semiconductor layer. However, the disclosure is not limited thereto. In some embodiments, the first gate insulating layer GI may be disposed on the entire surface of the buffer layer BL.

The second conductive layer is disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3 which is a thickness direction, and the second gate electrode G2 may overlap a channel region of the second active layer ACT2 in the third direction DR3 which is the thickness direction. Although not illustrated in the drawings, the second conductive layer may further include an electrode of a storage capacitor.

A first interlayer insulating layer IL1 is disposed on the second conductive layer. The first interlayer insulating layer IL1 may function as an insulating film between the second conductive layer and other layers disposed on the second conductive layer and may protect the second conductive layer.###

The third conductive layer is disposed on the first interlayer insulating layer IL1. The third conductive layer may include conductive patterns CDP1 to CDP3 and a source electrode S1 or S2 and a drain electrode D1 or D2 of each of the transistors T1 and T2. Some of the conductive patterns CDP1 to CDP3 may electrically connect conductive layers or semiconductor layers on different layers to each other and may serve as source/drain electrodes of the transistors T1 and T2.

A first conductive pattern CDP1 may contact the first active layer ACT1 of the first transistor T1 through a contact hole penetrating the first interlayer insulating layer IL1. The first conductive pattern CDP1 may contact the bottom metal layer BML through a contact hole penetrating the first interlayer insulating layer IL1 and the buffer layer BL. The first conductive pattern CDP1 may serve as a first source electrode S1 of the first transistor T1. The first conductive pattern CDP1 may be electrically connected to the first electrode RME1 or the first connection electrode CNE1. The first transistor T1 may transmit the first power supply voltage, received from the first voltage line VL1, to the first electrode RME1 or the first connection electrode CNE1.

The second conductive pattern CDP2 may contact the second voltage line VL2 through a contact hole penetrating the first interlayer insulating layer IL1 and the buffer layer BL. The second conductive pattern CDP2 may be electrically connected to the second electrode RME2 or the second connection electrode CNE2. The second voltage line VL2 may transfer the second power supply voltage to the second electrode RME2 or the second connection electrode CNE2.

The third conductive pattern CDP3 may contact the first voltage line VL1 through a contact hole penetrating the first interlayer insulating layer IL1 and the buffer layer BL. The third conductive pattern CDP3 may contact the first active layer ACT1 of the first transistor T1 through a contact hole penetrating the first interlayer insulating layer IL1. The third conductive pattern CDP3 may electrically connect the first voltage line VL1 to the first transistor T1 and may serve as a first drain electrode D1 of the first transistor T1.

Each of a second source electrode S2 and a second drain electrode D2 may contact the second active layer ACT2 of the second transistor T2 through a contact hole penetrating the first interlayer insulating layer IL1. The second transistor T2 may transmit a data signal to the first transistor T1 or transmit an initialization signal.

A first passivation layer PV1 is disposed on the third conductive layer. The first passivation layer PV1 may function as an insulating film between the third conductive layer and other layers and may protect the third conductive layer.

Each of the buffer layer BL, the first gate insulating layer GI, the first interlayer insulating layer IL1, and the first passivation layer PV1 described above may be composed of inorganic layers stacked alternately each other. For example, each of the buffer layer BL, the first gate insulating layer GI, the first interlayer insulating layer IL1, and the first passivation layer PV1 may be a double layer in which inorganic layers including at least one of silicon oxide ($SiO_x$), silicon nitride ($SiN_x$), and silicon oxynitride (SiOxNy) are stacked each other or may be a multilayer in which the above inorganic layers are alternately stacked each other. However, the disclosure is not limited thereto, and each of the buffer layer BL, the first gate insulating layer GI, the first interlayer insulating layer IL1, and the first passivation layer PV1 may also be composed of an inorganic layer including one of the above insulating materials. In some embodiments, the first interlayer insulating layer IL1 may be made of an organic insulating material such as polyimide (PI).

A via layer VIA is disposed on the third conductive layer in the display area DPA. The via layer VIA may include an organic insulating material such as polyimide (PI) to compensate for a step difference due to the conductive layers thereunder and may form a flat upper surface. However, in some embodiments, the via layer VIA may be omitted.

The display device 10 may include, as a display element layer disposed on the via layer VIA, the bank patterns BP1 and BP2, the electrodes RME (RME1 and RME2), the bank layer BNL, the light emitting elements ED, and the connection electrodes CNE (CNE1 and CNE2). The display device 10 may include the insulating layers PAS1 to PAS3 disposed on the via layer VIA.

The bank patterns BP1 and BP2 may be disposed on the via layer VIA. For example, the bank patterns BP1 and BP2 may be directly disposed on the via layer VIA, and at least a portion of each of the bank patterns BP1 and BP2 may protrude from an upper surface of the via layer VIA. The protruding portion of each of the bank patterns BP1 and BP2 may have inclined side surfaces, or curved side surfaces with a curvature, and light emitted from the light emitting elements ED may be reflected upward above the via layer VIA by the electrodes RME disposed on the bank patterns BP1 and BP2. Unlike in the drawings, each of the bank patterns BP1 and BP2 may also have a shape having an outer surface curved with a curvature in a cross-sectional view, for example, a semicircular or semielliptical shape. The bank patterns BP1 and BP2 may include, but are not limited to, an organic insulating material such as polyimide (PI).

The electrodes RME (RME1 and RME2) may be disposed on the bank patterns BP1 and BP2 and the via layer VIA. The first and second electrodes RME1 and RME2 may be disposed on at least the inclined side surfaces of the bank patterns BP1 and BP2. For example, widths of the first and second electrodes RME1 and RME2 measured in the second direction DR2 may be greater than widths of the first and second bank patterns BP1 and BP2, respectively, and the first and second electrodes RME1 and RME2 may cover the inclined side surfaces of the first and second bank patterns BP1 and BP2. FIG. 11 illustrates that each of the second electrodes RME2 covers a side surface of a second bank pattern BP2 disposed in the emission area EMA. However, each of the second electrodes RME2 may also cover another side surface of the second bank pattern BP2 disposed in the emission area EMA of another adjacent subpixel SPXn. Each of the second electrodes RME2 disposed on the second bank patterns BP2 may be the widened electrode portion RM_B. The distance between the first and second electrodes RME1 and RME2 in the second direction DR2 may be smaller than the distance between the bank patterns BP1 and BP2. At least a portion of each of the first and second electrodes RME1 and RME2 may be directly disposed on the via layer VIA so that they lie in a same plane.

The light emitting elements ED disposed between the bank patterns BP1 and BP2 may emit light in directions toward ends (or both ends) thereof, and the emitted light may travel toward the electrodes RME disposed on the bank patterns BP1 and BP2. Each electrode RME may have a structure in which a portion thereof disposed on a bank pattern BP1 or BP2 can reflect light emitted from the light emitting elements ED. Each of the first and second electrodes RME1 and RME2 may cover at least one side surface of the bank pattern BP1 or BP2 to reflect light emitted from the light emitting elements ED.

Each of the electrodes RME may contact the third conductive layer through an electrode contact hole CTD or CTS in a portion of the electrode RME overlapping the bank layer BNL. A first electrode contact hole CTD may be formed in an area in which the bank layer BNL and the first electrode RME1 disposed between the emission area EMA and the first sub-area SA1 overlap each other, and a second electrode contact hole CTS may be formed in an area in which the bank layer BNL and the electrode stem portion RM_S of each second electrode RME2 disposed between the sub-areas SA1 and SA2 adjacent to each other in the second direction DR2 overlap each other. The first electrode RME1 may contact the first conductive pattern CDP1 through the first electrode contact hole CTD penetrating the via layer VIA and the first passivation layer PV1. Each of the second electrodes RME2 may contact the second conductive pattern CDP2 through the second electrode contact hole CTS penetrating the via layer VIA and the first passivation layer PV1. The first electrode RME1 may be electrically connected to the first transistor T1 through the first conductive pattern CDP1 to receive the first power supply voltage, and each of the second electrodes RME2 may be electrically connected to the second voltage line VL2 through the second conductive pattern CDP2 to receive the second power supply voltage. However, the disclosure is not limited thereto. In an embodiment, the electrodes RME1 and RME2 may not be electrically connected to the voltage lines VL1 and VL2 of the third conductive layer, and the connection electrodes CNE to be described below may be directly connected to the third conductive layer.

The wiring connection electrode EP may be connected to the third conductive pattern CDP3 through a third electrode contact hole CTA penetrating the via layer VIA. The first electrode RME1 may be formed to be connected to the wiring connection electrode EP, and an electrical signal transmitted to place the light emitting elements ED may be transmitted from the first voltage line VL1 to the first electrode RME1 through the third conductive pattern CDP3 and the wiring connection electrode EP. In the process of placing the light emitting elements ED, signals may be transmitted to the first voltage line VL1 and the second voltage line VL2 and may be transferred to the first and second electrodes RME1 and RME2, respectively.

The relative position of the second electrode contact hole CTS may be different from that of the third electrode contact hole CTA to be described below. The second electrode contact hole CTS may be disposed in a portion of the bank layer BNL which surrounds the second sub-area SA2, and the third electrode contact hole CTA may be disposed in the first sub-area SA1. For example, since the second electrode contact hole CTS and the third electrode contact hole CTA expose upper surfaces of different voltage lines VL1 and VL2, respectively, the position of each of the second electrode contact hole CTS and the third electrode contact hole CTA may be determined accordingly.

The electrodes RME may include a conductive material having high reflectivity. For example, each of the electrodes RME may include a metal such as silver (Ag), copper (Cu), or aluminum (Al), may be an alloy including aluminum (Al), nickel (Ni), or lanthanum (La), or may have a structure in which a metal layer such as titanium (Ti), molybdenum (Mo), or niobium (Nb) and the above alloy are stacked each other. In some embodiments, each of the electrodes RME may be a double layer or a multilayer in which an alloy including aluminum (Al) and at least one metal layer made of titanium (Ti), molybdenum (Mo), or niobium (Nb) are stacked each other.

However, the disclosure is not limited thereto, and each electrode RME may further include a transparent conductive material. For example, each electrode RME may include a material such as ITO, IZO, or ITZO. In some embodiments, each electrode RME may have a structure in which at least one transparent conductive material and at least one metal layer having high reflectivity are stacked each other or may be formed as a single layer including the transparent conductive material and the metal layer. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect part of the light emitted from the light emitting elements ED in an upward direction above the first substrate SUB.

The first insulating layer PAS1 may be disposed on the via layer VIA and the electrodes RME. The first insulating layer PAS1 may include an insulating material to protect the electrodes RME while insulating them from each other. Since the first insulating layer PAS1 covers the electrodes RME before the bank layer BNL is formed, it may prevent the electrodes RME from being damaged in the process of forming the bank layer BNL. The first insulating layer PAS1 may prevent the light emitting elements ED disposed thereon from directly contacting other members and thus being damaged.

In an embodiment, the first insulating layer PAS1 may be stepped such that a portion of an upper surface of the first insulating layer PAS1 is recessed between the electrodes RME spaced apart from each other in the second direction DR2. The light emitting elements ED may be disposed on the stepped upper surface of the first insulating layer PAS1, and a space may be formed between each of the light emitting elements ED and the first insulating layer PAS1.

According to an embodiment, the first insulating layer PAS1 may include separation openings formed to correspond to the separation portions ROP1 and ROP2, contact portions CT1 and CT2, and first opening holes PH1. The first insulating layer PAS1 may be disposed on the entire surface of the via layer VIA but may partially expose layers thereunder in portions thereof in which the separation openings, the contact portions CT1 and CT2, and the first opening holes PH1 are formed.

The separation openings are openings formed in the first insulating layer PAS1 to correspond to the separation portions ROP1 and ROP2 of the sub-areas SA1 and SA2 and may expose the via layer VIA disposed thereunder. In the separation openings of the first insulating layer PAS1, a process of separating the first electrodes RME1 connected to each other, from each other may be performed. The first electrode RME1 extending in the first direction DR1 may be formed to be connected to the first electrodes RME1 of other subpixels SPXn adjacent to each other in the first direction DR1 or to the wiring connection electrode EP and may be separated from them as portions exposed by the separation openings of the first insulating layer PAS1 are etched. The separation openings of the first insulating layer PAS1 may be disposed to correspond to the separation portions ROP1 and ROP2 located between the first electrodes RME1 and between the first electrode RME1 and wiring connection electrode EP.

The first opening holes PH1 of the first insulating layer PAS1 may be disposed to correspond to the electrode holes RMH of the second electrodes RME2. The first opening holes PH1 may overlap the electrode holes RMH of the second electrodes RME2 and may be larger than the electrode holes RMH in a plan view. Similar to the electrode holes RMH, the first opening holes PH1 may serve as paths through which gas generated from layers thereunder is discharged. The via layer VIA and the bank patterns BP1 and BP2 including an organic insulating material may be disposed under the electrodes RME1 and RME2 and the first insulating layer PAS1, and discharge paths for gas generated from the via layer VIA and the bank patterns BP1 and BP2 may be the electrode holes RMH of the second electrodes RME2 and the first opening holes PH1 of the first insulating layer PAS1. The first opening holes PH1 may overlap the electrode holes RMH of the second electrodes RME2 on the second bank patterns BP2 and may also overlap the bank layer BNL disposed thereon.

The contact portions CT1 and CT2 of the first insulating layer PAS1 may respectively overlap different electrodes RME in the sub-areas SA1 and SA2. For example, the contact portions CT1 and CT2 may include first contact portions CT1 overlapping the first electrodes RME1 and second contact portions CT2 overlapping the second electrodes RME2. The first and second contact portions CT1 and CT2 may be disposed in each of the sub-areas SA1 and SA2. The first contact portion CT1 disposed in each first sub-area SA1 may be spaced apart from the first separation portion ROP1 disposed below the wiring connection electrode EP and may be disposed on the first electrode RME1. The first contact portion CT1 disposed in each second sub-area SA2 may be spaced apart from the second separation portion ROP2 and may be disposed on the first electrode RME1 of another subpixel SPXn. The second contact portion CT2 may be disposed on a portion protruding from the electrode stem portion RM_S of each second electrode RME2 to each of the sub-areas SA1 and SA2.

The first contact portions CT1 and the second contact portions CT2 may penetrate the first insulating layer PAS1 to partially expose upper surfaces of the first electrodes RME1 and the second electrodes RME2 thereunder. The first contact portions CT1 and the second contact portions CT2 may further penetrate some of other insulating layers disposed on the first insulating layer PAS1. The electrodes RME exposed by the contact portions CT1 and CT2 may contact the connection electrodes CNE.

The bank layer BNL may be disposed on the first insulating layer PAS1. The bank layer BNL may include portions extending in the first direction DR1 and the second direction DR2 and may surround each subpixel SPXn. The bank layer BNL may surround the emission area EMA and the sub-areas SA1 and SA2 of each subpixel SPXn to separate them from each other and may surround the outermost periphery of the display area DPA to separate the display area DPA and the non-display area NDA from each other. Of the bank layer BNL, portions extending in the second direction DR2 may separate the emission areas EMA from the sub-areas SA1 and SA2, and portions extending in the first direction DR1 may separate adjacent subpixels SPXn from each other. The portions of the bank layer BNL which extend in the first direction DR1 may be disposed on the second bank patterns BP2.

Similar to the bank patterns BP1 and BP2, the bank layer BNL may have a height. In some embodiments, an upper surface of the bank layer BNL may be at a greater height than those of the bank patterns BP1 and BP2, and a thickness of the bank layer BNL may be equal to or greater than those of the bank patterns BP1 and BP2. The bank layer BNL may prevent ink from overflowing into adjacent subpixels SPXn in an inkjet printing process during the manufacturing process of the display device 10. Similar to the bank patterns BP1 and BP2, the bank layer BNL may include an organic insulating material such as polyimide.

The light emitting elements ED may be disposed in the emission area EMA. The light emitting elements ED may be disposed on the first insulating layer PAS1 between the bank patterns BP1 and BP2. A direction in which the light emitting elements ED extend may be substantially parallel to an upper surface of the first substrate SUB1. As will be described below, each light emitting element ED may include semiconductor layers disposed in the extending direction, and the semiconductor layers may be sequentially disposed in a direction parallel to the upper surface of the first substrate SUB. However, the disclosure is not limited thereto. In case that each of the light emitting elements ED has a different structure, the semiconductor layers may be disposed in a direction perpendicular to the first substrate SUB.

The light emitting elements ED disposed in the subpixels SPXn may emit light of different wavelength bands depending on the materials that form the semiconductor layers described above. However, the disclosure is not limited thereto, and the light emitting elements ED disposed in the subpixels SPXn may also emit light of a same color by including the semiconductor layers made of a same material.

The light emitting elements ED may be disposed on different electrodes RME between different bank patterns BP1 and BP2. The first light emitting elements ED1 may be disposed between the first bank pattern BP1 and a second bank pattern BP2 and may have ends (or both ends) disposed on the first electrode RME1 and the widened electrode portion RM_B of a second electrode RME2. In the first subpixel SPX1, the first light emitting elements ED1 may be disposed on the second electrode RME2 of the second electrode line RM2 and may be disposed on the right side of the first bank pattern BP1 in the emission area EMA. The second light emitting elements ED2 may be disposed between a second bank pattern BP2 and the first bank pattern BP1 and may have ends (or both ends) disposed on the first electrode RME1 and the widened electrode portion RM_B of a second electrode RME2. In the first subpixel SPX1, the second light emitting elements ED2 may be disposed on the second electrode RME2 of the first electrode line RM1 and may be disposed on the left side of the first bank pattern BP1 in the emission area EMA.

The light emitting elements ED may be electrically connected to the electrodes RME and the conductive layers under the via layer VIA by contacting the connection electrodes CNE (CNE1 to CNE3) and may emit light of a specific wavelength band in response to an electrical signal.

The second insulating layer PAS2 may be disposed on the light emitting elements ED, the first insulating layer PAS1, and the bank layer BNL. The second insulating layer PAS2 includes a pattern portion extending in the first direction DR1 between the bank patterns BP1 and BP2 and disposed on the light emitting elements ED. The pattern portion may partially cover outer surfaces of the light emitting elements ED and may not cover sides (or both sides) or ends (or both ends) of the light emitting elements ED. The pattern portion may form a linear or island-shaped pattern in each subpixel SPXn in a plan view. The pattern portion of the second insulating layer PAS2 may protect the light emitting elements ED while fixing the light emitting elements ED in the manufacturing process of the display device 10. The second insulating layer PAS2 may be formed to fill the space between the light emitting elements ED and the first insulating layer PAS1 under the light emitting elements ED. A portion of the second insulating layer PAS2 may be disposed on the bank layer BNL and in the sub-areas SA1 and SA2.

According to an embodiment, the second insulating layer PAS2 may include separation openings formed to correspond to the separation portions ROP1 and ROP2, openings OP1 and OP2, contact portions CT1 and CT2, and second opening holes PH2. The second insulating layer PAS2 may be disposed on the entire surface of the first insulating layer PAS1 but may partially expose layers thereunder in portions thereof in which the openings OP1 and OP2, the contact portions CT1 and CT2, and the second opening holes PH2 are formed.

The separation openings are openings formed in the second insulating layer PAS2 to correspond to the separation portions ROP1 and ROP2 of the sub-areas SA1 and SA2 and may expose the via layer VIA disposed thereunder. In the separation openings of the second insulating layer PAS2, a process of separating the first electrodes RME1 connected to each other, from each other may be performed. The separation openings of the second insulating layer PAS2 may be disposed to correspond to the separation portions ROP1 and ROP2 located between the first electrodes RME1 or between the first electrode RME1 and wiring connection electrodes EP.

The openings OP1 and OP2 of the second insulating layer PAS2 may be disposed in the emission area EMA. The openings OP1 and OP2 may be disposed on part of the electrodes RME to expose first and second ends of the light emitting elements ED1 and ED2. The second insulating layer PAS2 may include first openings OP1 partially overlapping the first electrode RME1 and second openings OP2 partially overlapping the second electrodes RME2. The first openings OP1 may overlap sides (or both sides) of the first electrode RME1 which face the second electrodes RME2. Each of the second openings OP2 may overlap a side of a second electrode RME2 which faces the first electrode RME1. Each of the first openings OP1 and the second openings OP2 may extend in the first direction DR1 and may overlap light emitting elements ED.

The first openings OP1 may overlap the first bank pattern BP1 and the first electrode RME1 and may overlap the first ends of the first light emitting elements ED1 and the second light emitting elements ED2. The second openings OP2 may overlap the second bank patterns BP2 and the second electrodes RME2 and may overlap the second ends of the first light emitting elements ED1 and the second light emitting elements ED2. A second opening OP2 may be disposed on the left side of the first electrode RME1, and the other second opening OP2 may be disposed on the right side of the first electrode RME1. Although FIG. 9 illustrates that two first openings OP1 and two second openings OP2 are disposed in each emission area EMA, the disclosure is not limited thereto. The number of the first openings OP1 and the second openings OP2 may vary according to the arrangement and number of the electrodes RME1 and RME2 disposed in each subpixel SPXn. The second openings OP2 may be wider than the first openings OP in the second direction DR2. However, the disclosure is not limited thereto, and the first openings OP1 and the second openings OP2 may also have a same width.

The second opening holes PH2 of the second insulating layer PAS2 may overlap the bank layer BNL between the subpixels SPXn. The second opening holes PH2 may be disposed on portions of the bank layer BNL which extend in the first direction DR1. For example, the second insulating layer PAS2 may include second opening holes PH2, and the second opening holes PH2 may be disposed between the emission areas EMA of subpixels SPXn adjacent to each other in the second direction DR2. The second opening holes PH2 may be spaced apart from each other in the first direction DR1. The second opening holes PH2 may be formed regardless of the electrode holes RMH and the first opening holes PH1 under the bank layer BNL. Accordingly, the second opening holes PH2 may overlap the second bank patterns BP2 and the bank layer BNL but may not overlap the electrode holes RMH and the first openings PH1, or only some of the second opening holes PH2 may overlap the electrode holes RMH and the first openings PH1. Similar to the first opening holes PH1, the second opening holes PH2 may serve as paths through which gas generated from layers thereunder is discharged.

The contact portions CT1 and CT2 of the second insulating layer PAS2 may respectively overlap different electrodes RME in the sub-areas SA1 and SA2. For example, the contact portions CT1 and CT2 may include first contact portions CT1 overlapping the first electrodes RME1 and second contact portions CT2 overlapping the second electrodes RME2. The arrangement of the first and second contact portions CT1 and CT2 is the same as that described above. Each of the first contact portions CT1 and the second contact portions CT2 may penetrate the first insulating layer PAS1 and the second insulating layer PAS2 and may also penetrate the third insulating layer PAS3 which will be described below.

The connection electrodes CNE (CNE1 to CNE3) may be disposed on the electrodes RME and the bank patterns BP1 and BP2.

The first connection electrode CNE1 may be disposed on the first electrode RME1 and the first bank pattern BP1. The first connection electrode CNE1 may partially overlap the first electrode RME1 and may extend from the emission area EMA to the sub-area SA1 or SA2 beyond the bank layer BNL. The second connection electrode CNE2 may be disposed on a second electrode RME2 and a second bank pattern BP2. The second connection electrode CNE2 may partially overlap the second electrode RME2 and may extend from the emission area EMA to the sub-area SA1 or SA2 beyond the bank layer BNL.

The third connection electrode CNE3 may be disposed over the emission area EMA and the bank layer BNL. The first extension portion CN_E1 may be disposed on the second electrode RME2 of the second electrode line RM2 and a second bank pattern BP2, and the second extension portion CN_E2 may be disposed on the first electrode RME1 and the first bank pattern BP1. The first connection portion CN_B1 may be disposed on the bank layer BNL.

Each of the first connection electrode CNE1, the second connection electrode CNE2, and the third connection electrode CNE3 may be disposed on the second insulating layer PAS2 and may contact the light emitting elements ED. The first connection electrode CNE1 may contact the first ends of the first light emitting elements ED1. The second connection electrode CNE2 may contact the second ends of the second light emitting elements ED2. In the third connection electrode CNE3, the first extension portion CN_E1 may contact the second ends of the first light emitting elements ED1, and the second extension portion CN_E2 may contact the first ends of the second light emitting elements ED2. The third connection electrode CNE3 may be a first connection electrode layer disposed between the second insulating layer PAS2 and the third insulating layer PAS3 to be described below, and the first connection electrode CNE1 and the second connection electrode CNE2 may be a second connection electrode layer disposed on the third insulating layer PAS3.

The connection electrodes CNE may include a conductive material such as ITO, IZO, ITZO, or aluminum (Al). For example, the connection electrodes CNE may include a transparent conductive material, and light emitted from the light emitting elements ED may be output through the connection electrodes CNE.

The third insulating layer PAS3 is disposed on the third connection electrode CNE3 of the first connection electrode layer and the second insulating layer PAS2. The third insulating layer PAS3 may be disposed on the entire surface of the second insulating layer PAS2 to cover the third connection electrode CNE3, and the first connection electrode CNE1 and the second connection electrode CNE2 of the second connection electrode layer may be disposed on the third insulating layer PAS3. The third insulating layer PAS3 may insulate the first and second connection electrodes CNE1 and CNE2 from the third connection electrode CNE3 so that they do not directly contact each other.

According to an embodiment, the third insulating layer PAS3 may include openings OP3 and OP4, contact portions CT1 and CT2, and third opening holes PH3. The third insulating layer PAS3 may be disposed on the entire surface of the second insulating layer PAS2 and the third connection electrode CNE3 but may partially expose layers thereunder in portions thereof in which the openings OP3 and OP4, the contact portions CT1 and CT2, and the third opening holes PH3 are formed.

The openings OP3 and OP4 of the third insulating layer PAS3 may be disposed in the emission area EMA. The openings OP3 and OP4 may be disposed on part of the electrodes RME to expose the first or second ends of the light emitting elements ED1 and ED2. The third insulating layer PAS3 may include third openings OP3 partially overlapping the first electrodes RME1 and fourth openings OP4 partially overlapping the second electrodes RME2. Each of the third openings OP3 may overlap a side of a first electrode RME1 which faces a second electrode RME2 disposed on the right side of the first electrode RME1 and may overlap any one of the first openings OP1 of the second insulating layer PAS2. The third openings OP3 may be formed of the first openings OP1 penetrating up to the third insulating layer PAS3.

Each of the fourth openings OP4 may be disposed on a second electrode RME2 disposed on the left side of the first electrode RME1. Each of the fourth openings OP4 may overlap a side of the second electrode RME2 which faces the first electrode RME1 and may overlap any one of the second openings OP2 of the second insulating layer PAS2. The fourth openings OP4 may be formed of the second openings OP2 penetrating up to the third insulating layer PAS3. Each of the third openings OP3 and the fourth openings OP4 may extend in the first direction DR1 and may overlap light emitting elements ED.

Each of the third openings OP3 may overlap a first bank pattern BP1 and a first electrode RME1 and may overlap the first ends of the first light emitting elements ED1. Each of the fourth openings OP4 may overlap a second bank pattern BP2 and a second electrode RME2 and may overlap the second ends of the second light emitting elements ED2.

The third opening holes PH3 of the third insulating layer PAS3 may overlap the bank layer BNL between the subpixels SPXn. The third opening holes PH3 may be disposed on portions of the bank layer BNL which extend in the first direction DR1. For example, the third insulating layer PAS3 may include third opening holes PH3, and the third opening holes PH3 may be disposed between the emission areas EMA of subpixels SPXn adjacent to each other in the second direction DR2. The third opening holes PH3 may be spaced apart from each other in the first direction DR1. The third opening holes PH3 may be formed regardless of the electrode holes RMH and the first opening holes PH1. Accordingly, the third opening holes PH3 may overlap the second bank patterns BP2 and the bank layer BNL but may not overlap the electrode holes RMH and the first openings PH1, or only some of the third opening holes PH3 may overlap the electrode holes RMH and the first openings PH1. However, the third opening holes PH3 may be formed not to overlap the second opening holes PH2, and the second opening holes PH2 and the third opening holes PH3 may be alternately disposed on the bank layer BNL in the first direction DR1 in a plan view. Similar to the first opening holes PH1, the third opening holes PH3 may serve as paths through which gas generated from layers thereunder is discharged.

The contact portions CT1 and CT2 of the third insulating layer PAS3 may respectively overlap different electrodes RME in the sub-areas SA1 and SA2. For example, the contact portions CT1 and CT2 may include first contact portions CT1 overlapping the first electrodes RME1 and second contact portions CT2 overlapping the second electrodes RME2. The arrangement of the first and second contact portions CT1 and CT2 is the same as that described above. Each of the first contact portions CT1 and the second contact portions CT2 may penetrate the first insulating layer PAS1, the second insulating layer PAS2, and the third insulating layer PAS3.

The first connection electrode CNE1 may contact a first electrode RME1 through the first contact portion CT1 disposed in each of the sub-areas SA1 and SA2, and the second connection electrode CNE2 may contact a second electrode RME2 through the second contact portion CT2 disposed in each of the sub-areas SA1 and SA2. The first connection electrode CNE1 may contact the first electrode RME1 through the first contact portion CT1 penetrating the first insulating layer PAS1, the second insulating layer PAS2, and the third insulating layer PAS3 in each sub-area SA. The second connection electrode CNE2 may contact the second electrode RME2 through the second contact portion CT2 penetrating the first insulating layer PAS1 and the second insulating layer PAS2 in each sub-area SA.

In each of the subpixels SPXn illustrated in FIGS. 5 to 10, the first connection electrode CNE1 and the second connection electrode CNE2 may respectively contact the electrodes RME1 and RME2 in the first sub-area SA1 in which the wiring connection electrode EP is disposed. On the other hand, in each of the subpixels SPXn adjacent to and located below the subpixels SPXn of FIGS. 5 to 10 in the first direction DR1, the first connection electrode CNE1 and the second connection electrode CNE2 may respectively contact the electrodes RME1 and RME2 in the second sub-area SA2 in which the wiring connection electrode EP is not disposed.

The first connection electrode CNE1 and the second connection electrode CNE2 may be electrically connected to the third conductive layer through the electrodes RME, respectively. The first connection electrode CNE1 may be electrically connected to the first transistor T1 to receive the first power supply voltage, and the second connection electrode CNE2 may be electrically connected to the second voltage line VL2 to receive the second power supply voltage. Each of the first connection electrode CNE1 and the second connection electrode CNE2 may contact the light emitting elements ED in the emission area EMA to transfer a power supply voltage to the light emitting elements ED. However, the disclosure is not limited thereto. In some embodiments, the first connection electrode CNE1 and the second connection electrode CNE2 may directly contact the third conductive layer and may be electrically connected to the third conductive layer through patterns other than the electrodes RME.

On the other hand, the third connection electrode CNE3 may not be directly connected to the electrodes RME. The second electrode RME2 disposed under the first extension portion CN_E1 may be electrically connected to the second voltage line VL2, but the second power supply voltage applied to the second electrode RME2 may not be directly transferred to the third connection electrode CNE3. The third connection electrode CNE3 may be electrically connected to the first connection electrode CNE1 and the second connection electrode CNE2 through the light emitting elements ED.

The first connection electrode CNE1 and the second connection electrode CNE2 may be disposed on the third insulating layer PAS3, and the third connection electrode CNE3 may be disposed between the second insulating layer PAS2 and the third insulating layer PAS3. In the above arrangement structure of the connection electrodes CNE, the light emitting elements ED may be classified into different light emitting elements ED1 and ED2 according to the connection electrodes CNE that ends (or both ends) thereof contact. The first ends of the first light emitting elements ED1 and the second ends of the second light emitting elements ED2 may contact the connection electrodes CNE1 and CNE2 disposed on the third insulating layer PAS3. The second ends of the first light emitting elements ED1 and the first ends of the second light emitting elements ED2 may contact the third connection electrode CNE3 disposed between the second insulating layer PAS2 and the third insulating layer PAS3. The first light emitting elements ED1 and the second light emitting elements ED2 may be connected to each other in series through the connection electrodes CNE. Since the display device 10 according to the embodiment includes a greater number of the light emitting elements ED in each subpixel SPXn and forms a series connection of the light emitting elements ED, the amount of light emitted per unit area can be increased.

Although not illustrated in the drawings, another insulating layer may be further disposed on the third insulating layer PAS3 and the first connection electrode CNE1. The insulating layer may protect members disposed on the first substrate SUB from an external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material. As another example, the first insulating layer PAS1 and the third insulating layer PAS3 may include an inorganic insulating material, and the second insulating layer PAS2 may include an organic insulating material. Each or at least one of the first insulating layer PAS1, the second insulating layer PAS2, and the third insulating layer PAS3 may be formed in a structure in which insulating layers are alternately or repeatedly stacked each other. In an embodiment, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of a same material, or some thereof may be made of a same material while others thereof are made of different materials, or all of them may be made of different materials.

Figure 14:
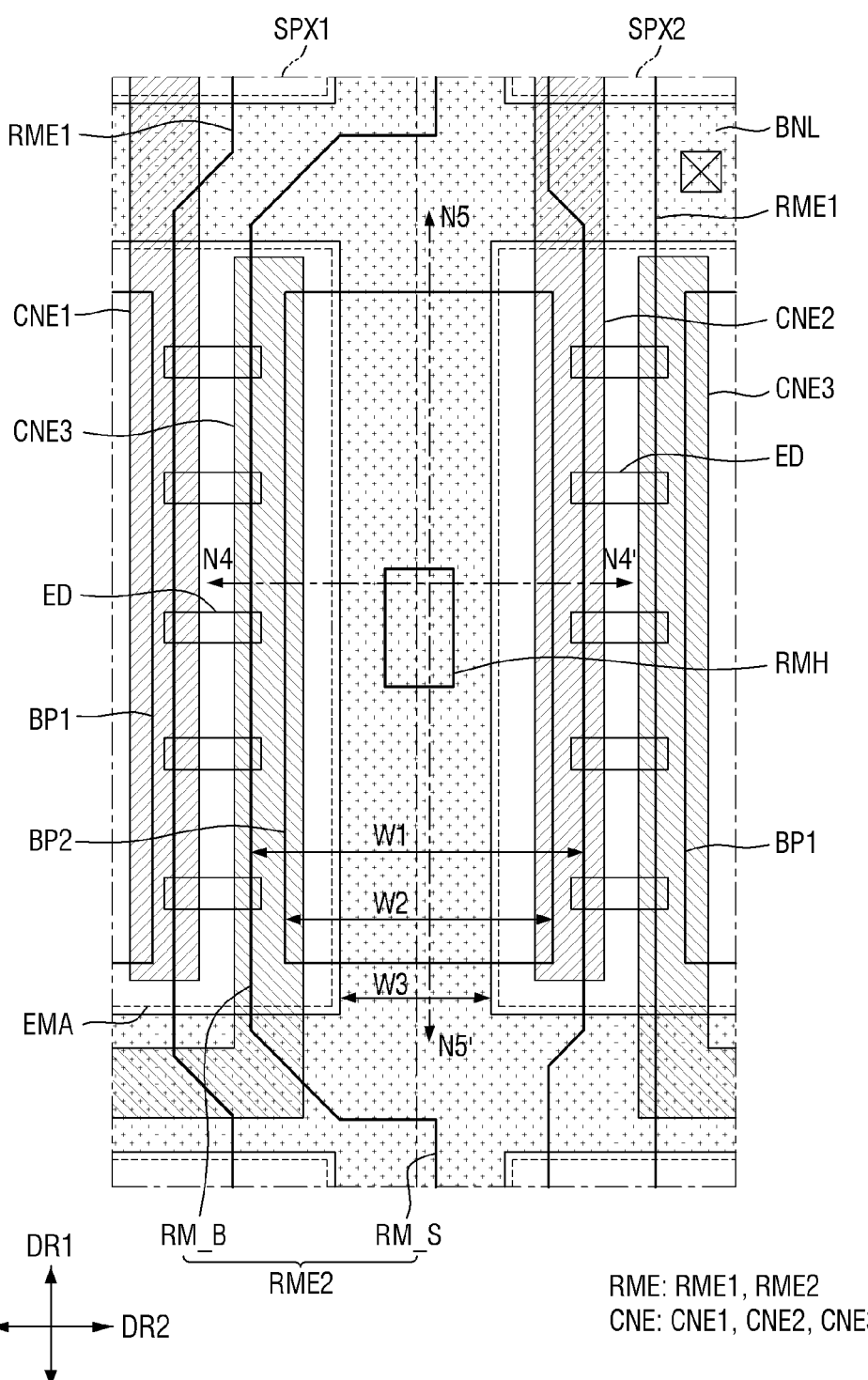
FIG. 14 is a schematic plan view illustrating a portion of a second electrode disposed between adjacent subpixels of the display device according to the embodiment.
Figure 15:
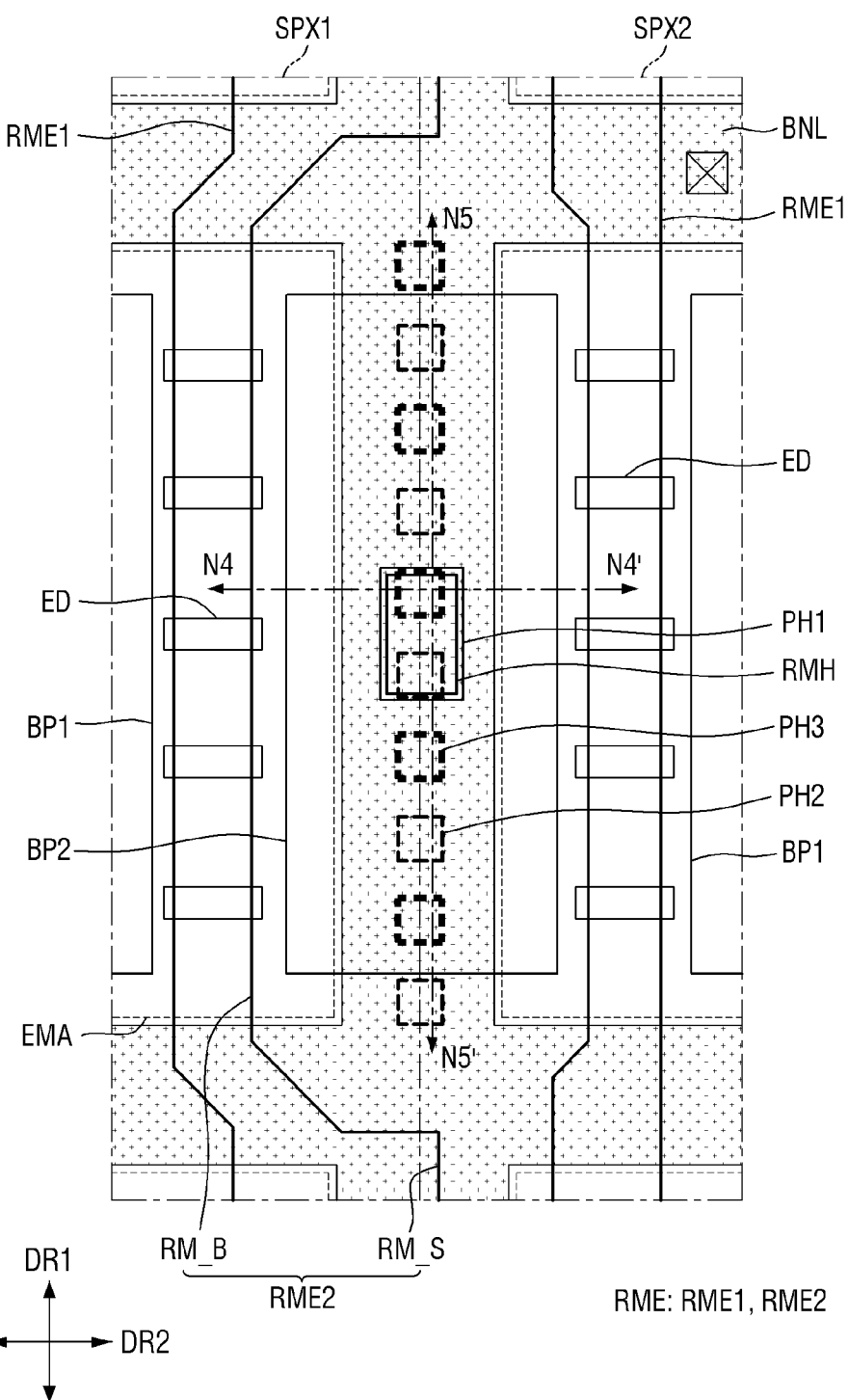
FIG. 15 is a schematic plan view illustrating the arrangement of opening holes formed in the second insulating layer and the third insulating layer of the display device according to the embodiment.
Figure 16:
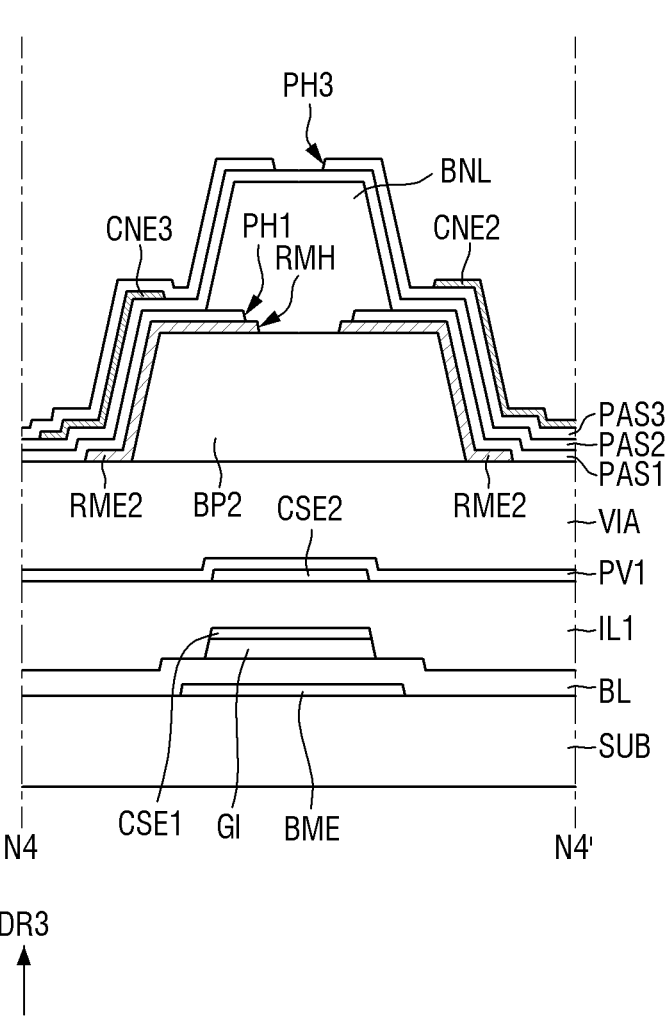
FIG. 16 is a schematic cross-sectional view taken along line N4-N4' of FIGS. 14 and 15.
Figure 17:
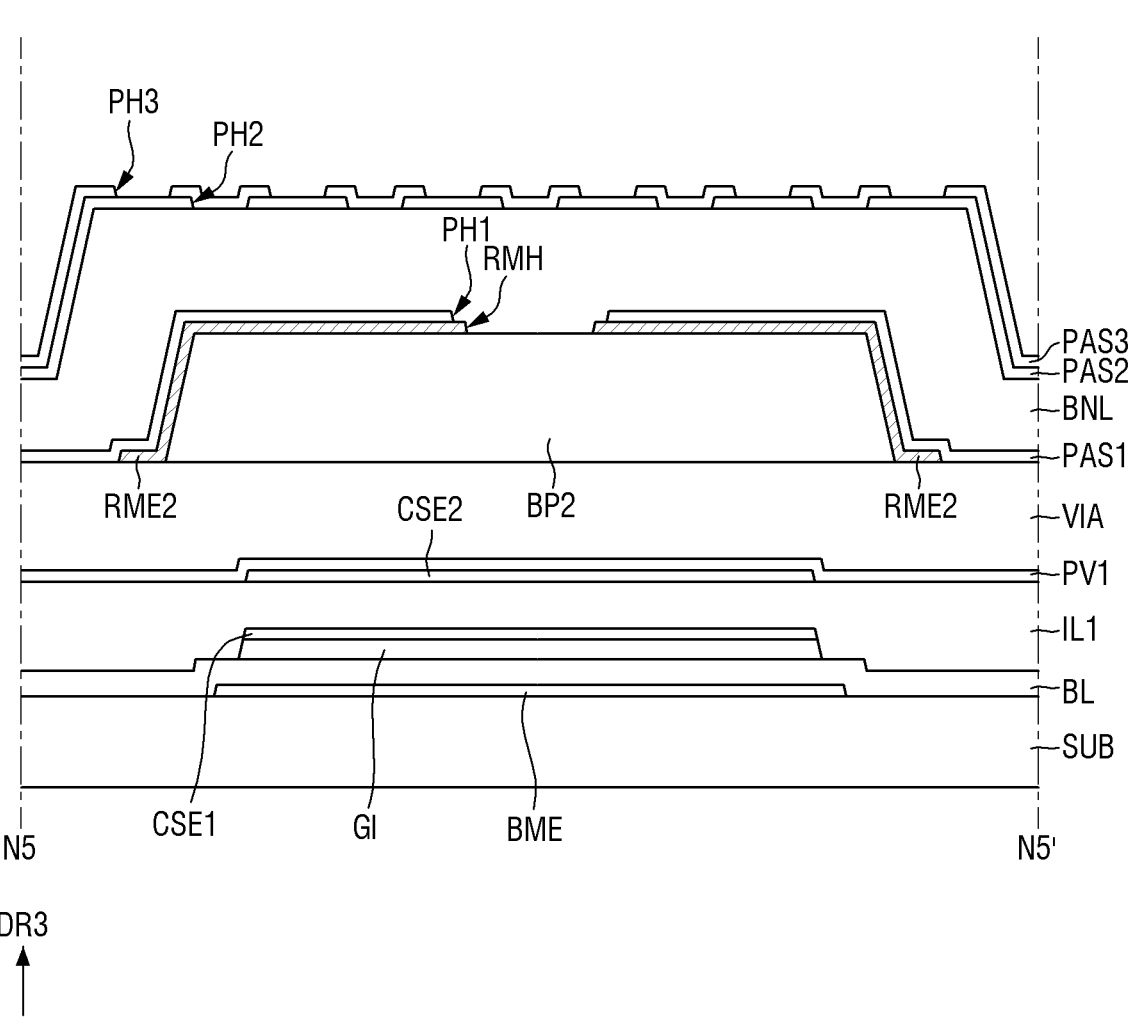
FIG. 17 is a schematic cross-sectional view taken along line N5-N5' of FIGS. 14 and 15.

FIG. 14 is a schematic plan view illustrating a portion of a second electrode RME2 disposed between adjacent subpixels SPXn of the display device 10 according to the embodiment. FIG. 15 is a schematic plan view illustrating the arrangement of opening holes formed in the second insulating layer PAS2 and the third insulating layer PAS3 of the display device 10 according to the embodiment. FIG. 16 is a schematic cross-sectional view taken along line N4-N4' of FIGS. 14 and 15. FIG. 17 is a schematic cross-sectional view taken along line N5-N5' of FIGS. 14 and 15.

FIGS. 14 and 15 illustrate relative arrangements of the widened electrode portion RM_B of the second electrode RME2 and the opening holes PH1 to PH3 between the first subpixel SPX1 and the second subpixel SPX2. FIGS. 16 and 17 respectively illustrate cross sections across the widened electrode portion RM_B and the opening holes PH1 to PH3 in the second direction DR2 and the first direction DR1.

Referring to FIGS. 14 to 17, the widened electrode portion RM_B of the second electrode RME2 may be disposed over the emission areas EMA of subpixels SPXn adjacent to each other in the second direction DR2. According to an embodiment, a width W1 of the widened electrode portion RM_B of the second electrode RME2 may be greater than a width W2 of a second bank pattern BP2, and a width W3 of a portion of the bank layer BNL which extends in the first direction DR1. A length of the second bank pattern BP2 measured in the first direction DR1 may be smaller than a length of the widened electrode portion RM_B of the second electrode RME2, and edges of the second bank pattern BP2 may be covered by the widened electrode portion RM_B. The second electrode RME2 disposed over the subpixels SPXn adjacent to each other may prevent light emitting elements ED from being aligned in areas other than an area.

The light emitting elements ED may be disposed on first electrodes RME1 and the widened electrode portion RM_B between first bank patterns BP1 and the second bank pattern BP2. The light emitting elements ED may be placed on the first electrodes RME1 and the second electrode RME2 as their positions and orientation directions are changed by an electric field generated on the electrodes RME1 and RME2. An electric field generated on each first electrode RME1 and the widened electrode portion RM_B may place the light emitting elements ED at a set position, but electric fields generated in other areas may place the light emitting elements ED at unset positions.

As illustrated in FIGS. 16 and 17, the display device 10 according to the embodiment may further include electrodes BME, CSE1, and CSE2, which may overlap (or may be overlapped by) the bank layer BNL, among the conductive layers under the via layer VIA. For example, the first conductive layer may further include a bottom electrode BME in addition to the bottom metal layer BML. The second conductive layer may further include an electrode CSE1 of a storage capacitor, and the third conductive layer may further include another electrode CSE2 of the storage capacitor. The bottom electrode BME and electrodes CSE1 and CSE2 of the storage capacitor may overlap in the thickness direction the bank layer BNL disposed between the emission areas EMA of the subpixels SPXn. A first opening hole PH1 of the first insulating layer PAS1 may overlap the bottom electrode BME and the electrodes CSE1 and CSE2 of the storage capacitor in the thickness direction. Although FIGS. 16 and 17 illustrate the electrodes CSE1 and CSE2 of the storage capacitor disposed in the second conductive layer and the third conductive layer, the disclosure is not limited thereto. Other electrodes or wirings may also be disposed in the second conductive layer and the third conductive layer to overlap the bank layer BNL.

During the manufacturing process of the display device 10, the light emitting elements ED may be sprayed on the emission area EMA and placed on the electrodes RME. In case that an electrical signal is transmitted to each of the electrodes RME1 and RME2, an electric field may be generated on the electrode RME1 and RME2. An electrical signal may be transmitted to a conductive layer other than the electrodes RME1 and RME2. Thus, an electric field may also be generated by the electrical signal transmitted to the conductive layer other than the electrodes RME1 and RME2. For example, in case that an electrical signal is transmitted to the second electrode RME2, an electrical signal may be transmitted to the electrodes CSE1 and CSE2 of the storage capacitor or the bottom electrode BME under the via layer VIA.

In the display device 10 according to the embodiment, the widened electrode portion RM_B of the second electrode RME2 is disposed over different subpixels SPXn to overlap other conductive layers between the subpixels SPXn in the thickness direction. Thus, even in case that an electrical signal is transmitted to the second electrode RME2 and a conductive layer under the second electrode RME2, an electric field may not be generated between the second electrode RME2 and the conductive layer or may be generated under the second electrode RME2. The electric field may not affect the alignment of the light emitting elements ED on the second electrode RME2, and the light emitting elements ED may be aligned at a set position between the bank patterns BP1 and BP2 or on the first and second electrodes RME1 and RME2 in the emission area EMA.

In particular, since the second electrode RME2 including the widened electrode portion RM_B having a large width covers the second bank pattern BP2 disposed over different subpixels SPXn and overlaps the bank layer BNL, it can prevent an electric field from being generated by a conductive layer under the bank layer BNL. In case that an electric field is generated by conductive layers (e.g., the electrodes CSE1 and CSE2 of the storage capacitor) disposed under the bank layer BNL between the subpixels SPXn, the light emitting elements ED may cluster around the bank layer BNL. However, in the display device 10 according to the embodiment, generation of an electric field by a conductive layer under the bank layer BNL may be prevented, and the light emitting elements ED may be placed in the emission area EMA with a high degree of alignment. Accordingly, the product quality and manufacturing efficiency of the display device 10 may be improved.

The second electrode RME2 may be an electrode electrically connected to the second voltage line VL2, and the second power supply voltage may be a common voltage commonly applied to subpixels SPXn. The second electrode RME2 may be disposed over subpixels SPXn adjacent to each other in the first direction DR1, and the subpixels SPXn may simultaneously receive the second power supply voltage without any problem. Similarly, although the widened electrode portion RM_B of the second electrode RME2 is disposed in subpixels SPXn adjacent to each other in the second direction DR2, each of the subpixels SPXn may emit light individually.

In the entire display area DPA, the first electrode RME1 may be disposed in the center of each subpixel SPXn, and the second electrode RME2 may be disposed between the subpixels SPXn. The first electrode RME1 and the second electrode RME2 may be alternately disposed in the second direction DR2, and the light emitting elements ED may be disposed in a space between them. The light emitting elements ED may be disposed in the emission area EMA and may be electrically connected to the electrodes RME through the connection electrodes CNE1 to CNE3 to emit light. Although FIGS. 14 and 15 illustrate that a first electrode RME1 and part of two different second electrodes RME2 are disposed in each subpixel SPXn, the disclosure is not limited thereto. The number, shape, and arrangement of the electrodes RME in each subpixel SPXn can vary as long as any one electrode RME is disposed over adjacent subpixels SPXn to prevent misalignment of the light emitting elements ED. This will be described below with reference to other embodiments.

The second electrode RME2 may cover the second bank pattern BP2 and may include an electrode hole RMH which is a discharge path for gas generated from an organic insulating material under the second electrode RME2. The electrode hole RMH may overlap the second bank pattern BP2 and the bank layer BNL between the emission areas EMA of the subpixels SPXn. In the display device 10, the first insulating layer PAS1, the second insulating layer PAS2, and the third insulating layer PAS3 disposed on the second electrode RME2 may also include the opening holes PH1 to PH3 which are discharge paths for gas generated from an organic insulating material layer under the first insulating layer PAS1, the second insulating layer PAS2, and the third insulating layer PAS3.

The first insulating layer PAS1 may include a first opening hole PH1 formed to correspond to the electrode hole RMH. The first opening hole PH1 may be formed to overlap the electrode hole RMH, and its size may be equal to or greater than that of the electrode hole RMH in a plan view. In the first opening hole PH1, a portion of the second electrode RME2 and a portion of the second bank pattern BP2 overlapping the electrode hole RMH may be exposed. However, the bank layer BNL disposed on the first insulating layer PAS1 may cover the second electrode RME2 and the second bank pattern BP2 exposed through the first opening hole PH1.

Second opening holes PH2 of the second insulating layer PAS2 and third opening holes PH3 of the third insulating layer PAS3 may be disposed on the bank layer BNL. The second opening holes PH2 and the third opening holes PH3 may each be spaced apart from each other in the first direction DR1. The second opening holes PH2 and the third opening holes PH3 may be disposed in a portion of the bank layer BNL which extends in the first direction DR1 between the emission areas EMA. However, the disclosure is not limited thereto, and the second opening holes PH2 and the third opening holes PH3 may also be disposed between the sub-areas SA1 and SA2 or in a portion of the bank layer BNL which extends in the second direction DR2.

According to an embodiment, the second opening holes PH2 and the third opening holes PH3 may be disposed regardless of the electrode hole RMH and the first opening hole PH1 but may be disposed not to overlap each other. Each of the second and third opening holes PH2 and PH3 may or may not overlap the electrode hole RMH and the first opening hole PH1. The second opening holes PH2 and the third opening holes PH3 may be spaced apart from each other in the first direction DR1, regardless of the placement position of the electrode hole RMH and the first opening hole PH1.

However, the third opening holes PH3 may not overlap the second opening holes PH2. For example, each of the third opening holes PH3 may be disposed between different second opening holes PH2 in a plan view. The second opening holes PH2 and the third opening holes PH3 may be alternately arranged in the first direction DR1. In some embodiments, a conductive pattern disposed on the same layer as the first connection electrode CNE1 or the third connection electrode CNE3 may be further disposed on the bank layer BNL. Since the second opening holes PH2 of the second insulating layer PAS2 and the third opening holes PH3 of the third insulating layer PAS3 are alternately arranged without overlapping each other, conductive patterns disposed on different layers can be prevented from short-circuiting.

The second insulating layer PAS2 and the third insulating layer PAS3 cover the via layer VIA, the bank patterns BP1 and BP2, and the bank layer BNL including an organic insulating material. Therefore, in case that a heat treatment process is performed in a process of forming the second insulating layer PAS2 and the third insulating layer PAS3, gas may be generated from the organic insulating material under the second insulating layer PAS2 and the third insulating layer PAS3. Gases generated in the process of forming the second insulating layer PAS2 and the third insulating layer PAS3 may be discharged through the electrode hole RMH and the first to third opening holes PH1 to PH3. The electrode hole RMH and the first to third opening holes PH1 to PH3 utilized as gas discharge paths may be in the non-emission area and overlap the bank layer BNL. Since the electrode hole RMH and the first to third opening holes PH1 to PH3 are not formed in the emission area EMA, they may not affect the arrangement of the light emitting elements ED and the connection between the connection electrodes CNE1 to CNE3 and the light emitting elements ED.

According to an embodiment, the electrode hole RMH may be larger than the second opening holes PH2 and the third opening holes PH3 in a plan view. For example, a length of the electrode hole RMH in the first direction DR1 and a width of the electrode hole RMH in the second direction DR2 may be greater than lengths and widths of the second opening holes PH2 and the third opening holes PH3. As described above, in some embodiments, conductive patterns disposed on different layers may be further disposed on the bank layer BNL. In order to prevent a short circuit between them, the second opening holes PH2 and the third opening holes PH3 may be alternately disposed. The second opening holes PH2 and the third opening holes PH3 alternately disposed may have a small size in consideration of the area of the upper surface of the bank layer BNL, so that they do not overlap each other.

The display device 10 according to the embodiment includes an electrode disposed over different subpixels SPXn. Therefore, generation of an electric field by a lower conductive layer disposed between the subpixels SPXn may be prevented, and the light emitting elements ED may be placed in the emission area EMA with a high degree of alignment. Accordingly, the product quality and manufacturing efficiency of the display device 10 may be improved.

Figure 18:
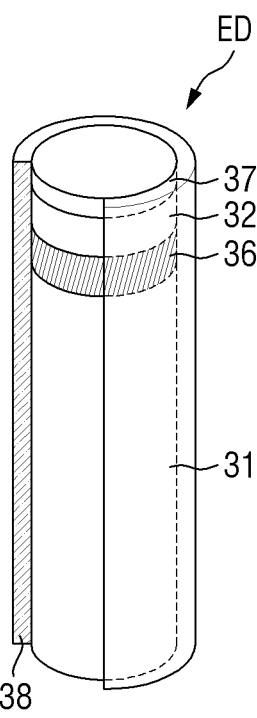
FIG. 18 is a schematic perspective view of a light emitting element according to an embodiment.

FIG. 18 is a schematic view of a light emitting element ED according to an embodiment.

Referring to FIG. 18, the light emitting element ED may be a light emitting diode. Specifically, the light emitting element ED may be an inorganic light emitting diode having a size of nanometers to micrometers and made of an inorganic material. In case that an electric field is formed in a specific direction between two electrodes facing each other, the light emitting element ED may be aligned between the two electrodes of which polarities are formed.

The light emitting element ED according to the embodiment may extend in a direction. The light emitting element ED may be shaped like a cylinder, a rod, a wire, a tube, or the like. However, the shape of the light emitting element ED is not limited thereto, and the light emitting element ED may also have various shapes including polygonal prisms such as a cube, a rectangular parallelepiped, and a hexagonal prism, and a shape extending in a direction and having a partially inclined outer surface.

The light emitting element ED may include a semiconductor layer doped with a dopant of any conductivity type (e.g., a p type or an n type). The semiconductor layer may receive an electrical signal from an external power source and emit light in a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN, and InN doped with an n-type dopant. The n-type dopant used to dope the first semiconductor layer 31 may be Si, Ge, Sn, Se, or the like.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN, and InN doped with a p-type dopant. The p-type dopant used to dope the second semiconductor layer 32 may be Mg, Zn, Ca, Ba, or the like.

Although FIG. 18 illustrates that each of the first semiconductor layer 31 and the second semiconductor layer 32 is composed of a layer, the disclosure is not limited thereto. Each of the first semiconductor layer 31 and the second semiconductor layer 32 may also include a greater number of layers, for example, may further include a clad layer or a tensile strain barrier reducing (TSBR) layer, depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN, and SLs doped with an n-type dopant. The semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which quantum layers and well layers are alternately stacked each other. The light emitting layer 36 may emit light through combination of electron-hole pairs according to electrical signals received through the first semiconductor layer 31 and the second semiconductor layer 32. The light emitting layer 36 may include a material such as AlGaN, AlGaInN, or InGaN. In particular, in case that the light emitting layer 36 has a multiple quantum well structure in which a quantum layer and a well layer are alternately stacked each other, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked each other or may include different group III to V semiconductor materials depending on the wavelength band of light that it emits. Light emitted from the light emitting layer 36 is not limited to light in a blue wavelength band. In some embodiments, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may surround an outer surface of at least the light emitting layer 36 but may expose ends of the light emitting element ED in a longitudinal direction. An upper surface of the insulating film 38 may be rounded in a cross-sectional view in an area adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although FIG. 18 illustrates that the insulating film 38 is formed as a single layer, the disclosure is not limited thereto. In some embodiments, the insulating film 38 may be formed in a multilayer structure in which layers are stacked each other.

The insulating film 38 may protect the semiconductor layers and the electrode layer of the light emitting element ED. The insulating film 38 may prevent an electrical short circuit that may occur in the light emitting layer 36 in case that the light emitting layer 36 directly contacts an electrode that transmits an electrical signal to the light emitting element ED. The insulating film 38 may prevent a reduction in luminous efficiency of the light emitting element ED.

An outer surface of the insulating film 38 may be treated. The light emitting element ED may be sprayed onto electrodes in a state where it is dispersed in an ink, and may be aligned. The surface of the insulating film 38 may be hydrophobic or hydrophilic-treated so that the light emitting element ED is kept separate or dispersed in the ink without being agglomerated with other adjacent light emitting elements ED.

Various embodiments of the display device 10 will now be described with reference to other drawings.

Figure 19:
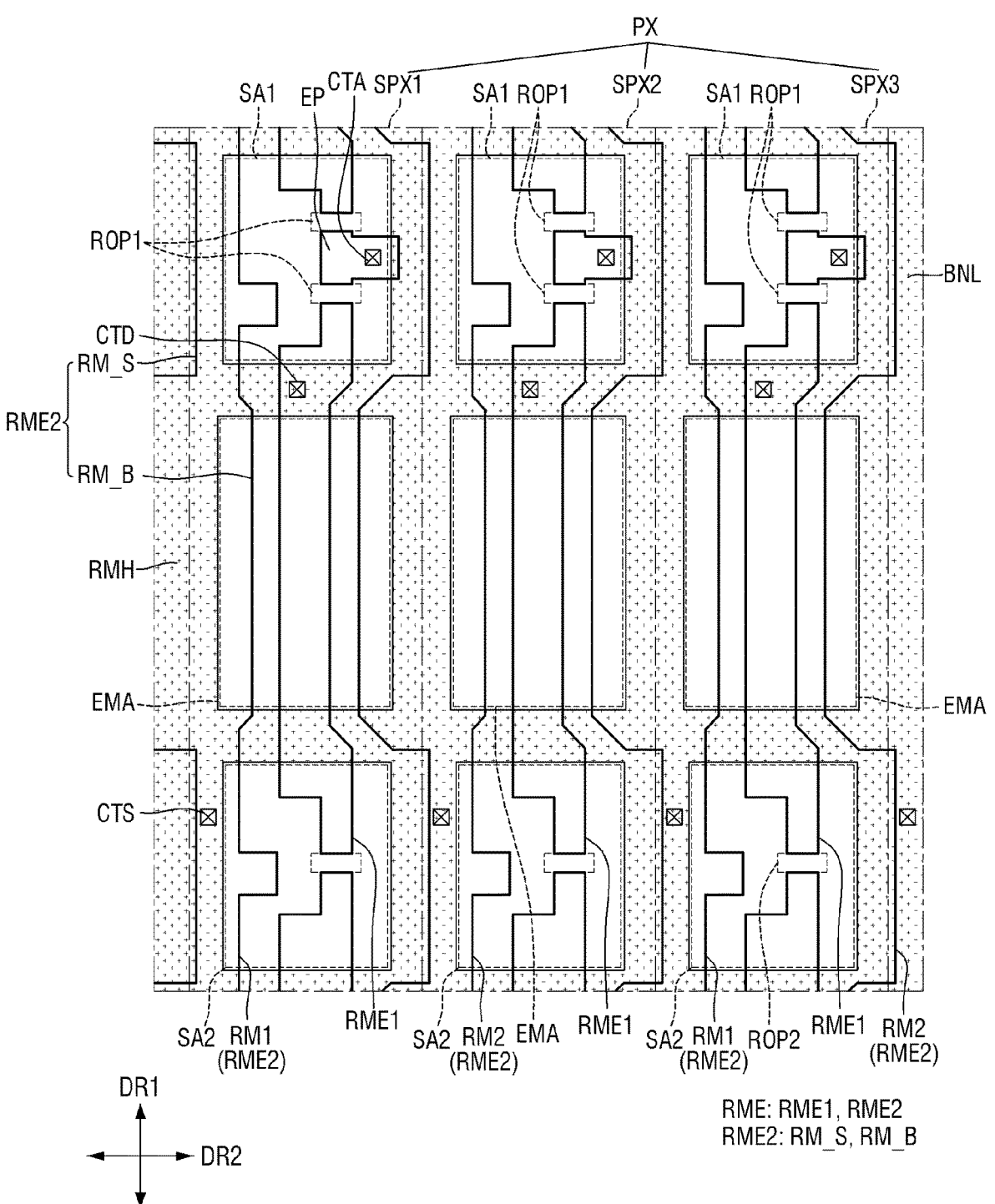
FIG. 19 is a schematic plan view illustrating electrodes and a bank layer disposed in a pixel of a display device according to an embodiment.

FIG. 19 is a schematic plan view illustrating electrodes and a bank layer BNL disposed in a pixel of a display device 10 according to an embodiment.

Referring to FIG. 19, in the display device 10 according to the embodiment, each second electrode RME2 may not include an electrode bole RMH. The electrode hole RMH is a discharge path for gas generated from an organic insulating material disposed under electrodes RME1 and RME2. The electrode hole RMH may prevent the electrodes RME1 and RME2 from being peeled off or lifted by the gas. However, if the gas can be discharged through a manufacturing process condition and another path, the electrode hole RMH of each widened electrode portion RM_B disposed under the bank layer BNL may be omitted.

Figure 20:
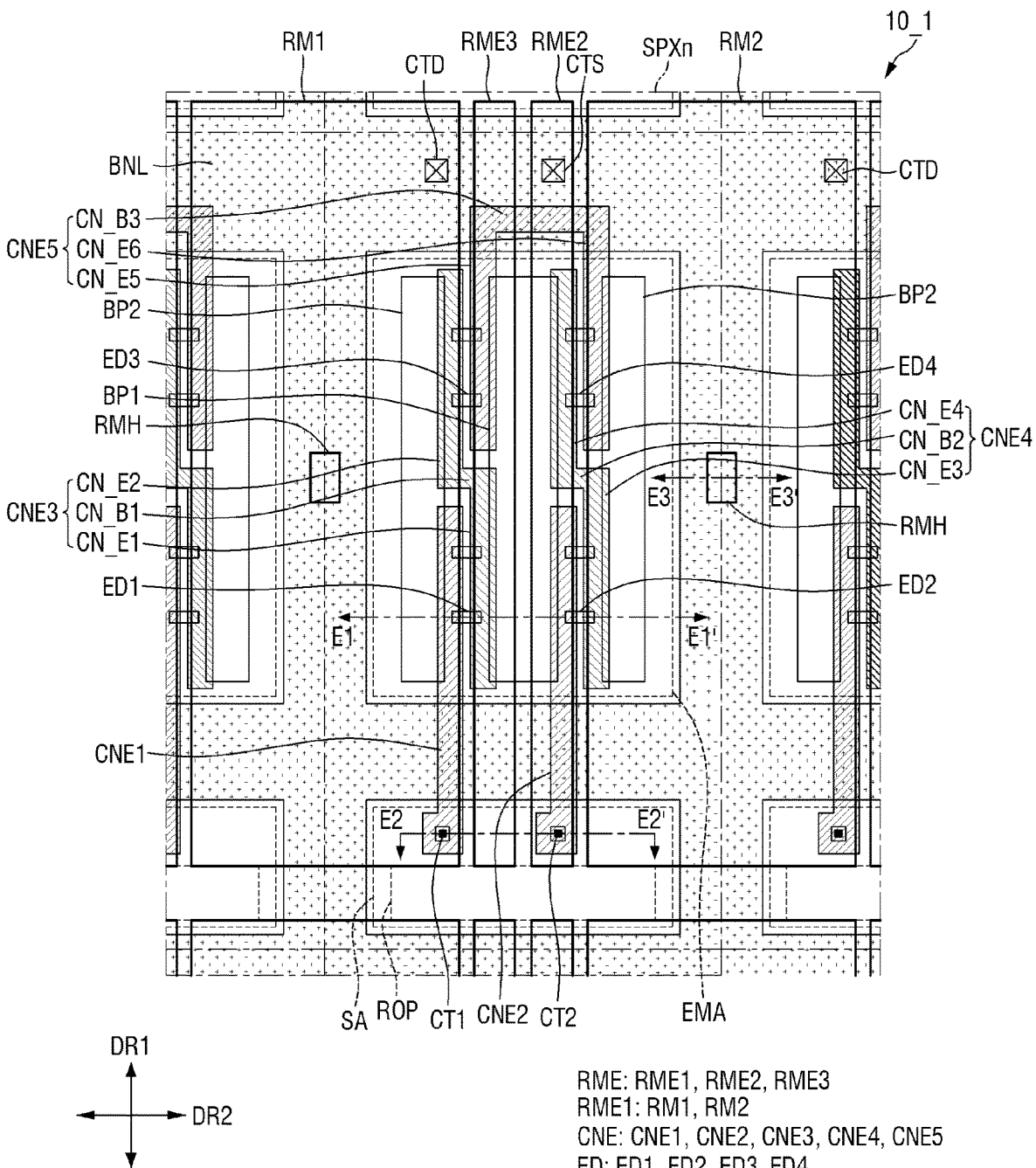
FIG. 20 is a schematic plan view of a subpixel of a display device according to an embodiment.
Figure 21:
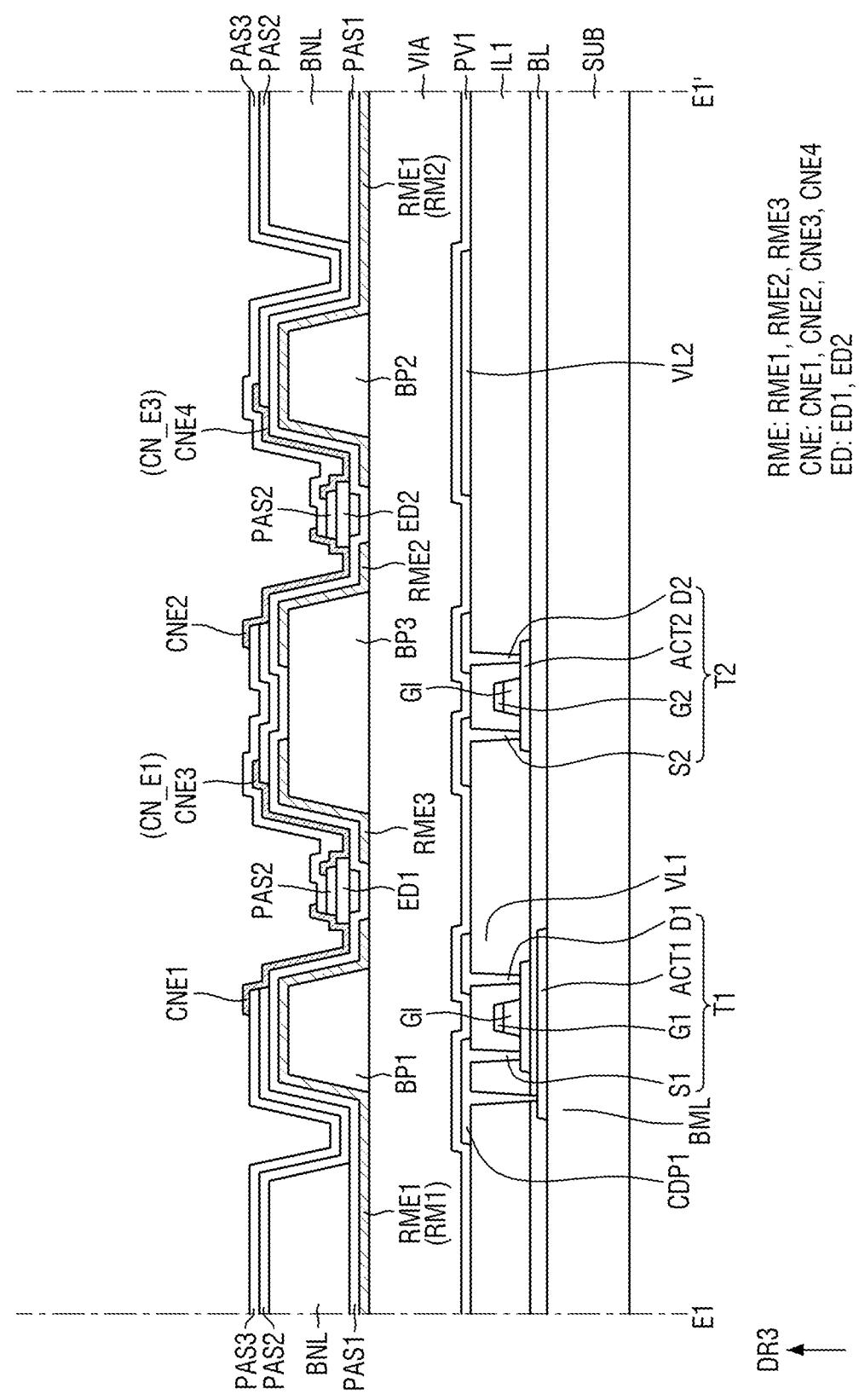
FIG. 21 is a schematic cross-sectional view taken along line E1-E1' of FIG. 20.
Figure 22:
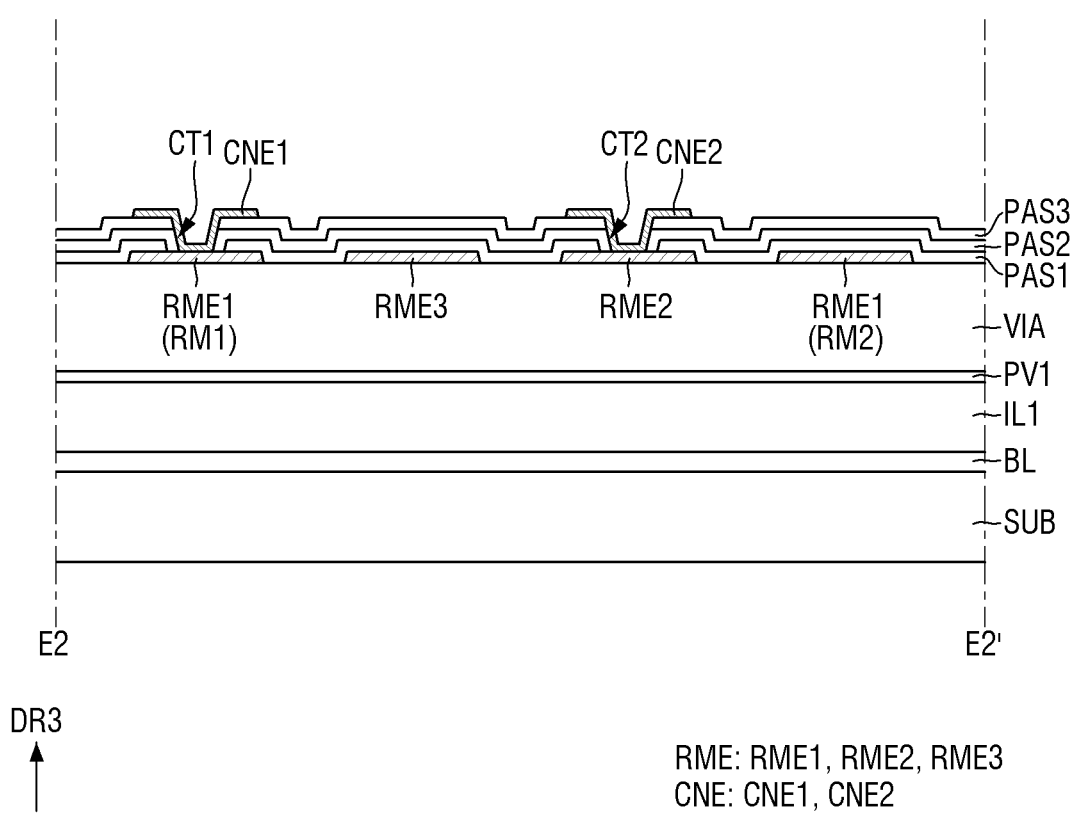
FIG. 22 is a schematic cross-sectional view taken along line E2-E2' of FIG. 20.
Figure 23:
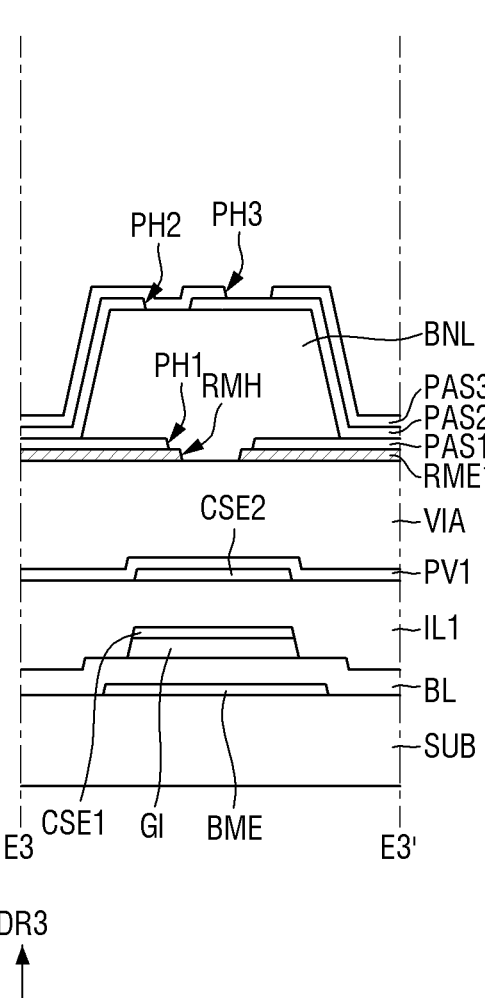
FIG. 23 is a schematic cross-sectional view taken along line E3-E3' of FIG. 20.

FIG. 20 is a schematic plan view of a subpixel SPXn of a display device 10_1 according to an embodiment. FIG. 21 is a schematic cross-sectional view taken along line E1-E1' of FIG. 20. FIG. 22 is a schematic cross-sectional view taken along line E2-E2' of FIG. 20. FIG. 23 is a schematic cross-sectional view taken along line E3-E3' of FIG. 20.

FIG. 20 illustrates the planar arrangement of bank patterns BP1 and BP2, electrodes RME (RME1 to RME3), light emitting elements ED (ED1 to ED3), and connection electrodes CNE (CNE1 to CNE5) in a subpixel SPXn of the display device 10_1. FIG. 21 illustrates a cross section across ends of two different light emitting elements ED1 and ED2. FIG. 22 illustrates a cross section across contact portions CT1 and CT2 in the second direction DR2. FIG. 23 illustrates a cross section across an area between subpixels SPXn adjacent to each other in the second direction DR2.

Referring to FIGS. 20 to 23, the display device 10_1 may have various arrangement structures of the electrodes RME and the light emitting elements ED. The embodiment is different from the embodiment of FIGS. 5 and 6 in the number and shape of the electrodes RME, the bank patterns BP1 and BP2, the light emitting elements ED, and the connection electrodes CNE disposed in each subpixel SPXn. In the display device 10_1, the arrangement structure of the electrodes RME can be variously modified as long as any one electrode RME is disposed over two different subpixels SPXn and prevents misalignment of the light emitting elements ED. Hereinafter, any redundant description will not be repeated, and differences may be mainly described.

Each subpixel SPXn of the display device 10_1 may include two first electrodes RME1, each being disposed over different subpixels SPXn, and a second electrode RME2 and a third electrode RME3 disposed between the first electrodes RME1. In the display device 10_1, four electrodes RME1 (RM1 and RM2), RME2 and RME3 may be disposed in an emission area EMA of each subpixel SPXn, and a greater number of light emitting elements ED and connection electrodes CNE may be disposed.

The bank patterns BP1 and BP2 may include a first bank pattern BP1 and two second bank patterns BP2 disposed in each subpixel SPXn. Unlike in the embodiment of FIG. 5, each of the second bank patterns BP2 may not be disposed over neighboring subpixels SPXn and may be disposed within the emission area EMA. The first bank pattern BP1 may be disposed in a center of the emission area EMA, and the two different second bank patterns BP2 may be spaced apart from each other in the second direction DR2 with the first bank pattern BP1 interposed between them. A width of the first bank pattern BP1 measured in the second direction DR2 may be greater than that of each of the second bank patterns BP2. Two different electrodes RME2 and RME3 may be disposed on the first bank pattern BP1, and an electrode RME1 may be disposed on each of the second bank patterns BP2. The first bank pattern BP1 may partially overlap the second electrode RME2 and the third electrode RME3, and the second bank patterns BP2 may partially overlap the first electrodes RME1. A distance between the bank patterns BP1 and BP2 in the second direction DR2 may be greater than a distance between the electrodes RME.

The electrodes RME disposed in each subpixel SPXn may include two first electrodes RME1 and the second electrode RME2 and the third electrode RME3 disposed between first electrodes RME1.

Similar to the second electrodes RME2 of FIG. 5, each of the first electrodes RME1 may be disposed over different subpixels SPXn. One of the first electrodes RME1 may be disposed on a left side of each subpixel SPXn, and the other first electrode RME1 may be disposed on a right side of each subpixel SPXn. In FIG. 20, the first electrode RME1 disposed on the left side may be the first electrode RME1 of a first electrode line RM1, and the first electrode RME1 disposed on the right side may be the first electrode RME1 of a second electrode line RM2.

Each of the first electrodes RME1 may be disposed over subpixels SPXn adjacent to each other in the second direction DR2 and may overlap a bank layer BNL disposed between the subpixels SPXn. Each of the first electrodes RME1 may cover the second bank patterns BP2 respectively disposed in different subpixels SPXn. A first electrode RME1 may cover two second bank patterns BP2 and may overlap the bank layer BNL between the second bank patterns BP2 respectively disposed in different subpixels SPXn.

A width of each first electrode RME1 measured in the second direction DR2 may be greater than a width of each of the second bank patterns BP2 and the bank layer BNL. Each of the first electrodes RME1 may overlap conductive layers overlapping the bank layer BNL between the subpixels SPXn. For example, each of the first electrodes RME1 may overlap electrodes CSE1 and CSE2 of a storage capacitor and a bottom electrode BME under the bank layer BNL in the thickness direction. Each of the first electrodes RME1 may shield an electric field generated between conductive layers disposed under the bank layer BNL and may prevent the light emitting elements ED from being disposed at an unwanted position.

According to an embodiment, each of the first electrodes RME1 disposed over different subpixels SPXn may include an electrode hole RMH at a position overlapping the bank layer BNL. The electrode hole RMH may be disposed between the emission areas EMA of two different subpixels SPXn and may overlap the bank layer BNL. The shape and function of the electrode hole RMH are the same as those described above. The electrode hole RMH may also be omitted.

Although the first electrodes RME1 have a constant width in the second direction DR2, the disclosure is not limited thereto. Similar to the second electrodes RME2 according to the embodiment of FIG. 5, each of the first electrodes RME1 of the embodiment may also include an electrode stem portion RM_S and a widened electrode portion RM_B, and only the widened electrode portion RM_B having a large width may be disposed over the emission areas EMA.

The second electrode RME2 and the third electrode RME3 may be disposed between different first electrodes RME1. The second electrode RME2 and the third electrode RME3 may be spaced apart from each other in the second direction DR2 on the first bank pattern BP1. The second electrode RME2 may face the first electrode RME1 of the second electrode line RM2, and the third electrode RME3 may face the first electrode RME1 of the first electrode line RM1.

The first and second electrodes RME1 and RME2 among the electrodes RME may respectively contact a first conductive pattern CDP1 and a second conductive pattern CDP2 through electrode contact boles CTD and CTS disposed under the bank layer BNL, but the third electrode RME3 may not contact them.

Among the first electrodes RME1 disposed in any one subpixel SPXn, the first electrode RME1 disposed on the left side may contact the first conductive pattern CDP1 through a first electrode contact hole CTD disposed in the subpixel SPXn. Among the first electrodes RME1 disposed in any one subpixel SPXn, the first electrode RME1 disposed on the right side may contact the first conductive pattern CDP1 through the first electrode contact hole CTD disposed in another subpixel SPXn. In FIG. 20, the first electrode RME1 of the first electrode line RM1 may contact the first conductive pattern CDP1 of a corresponding subpixel SPXn through the first electrode contact hole CTD disposed in the corresponding subpixel SPXn. The first electrode RME1 of the second electrode line RM2 may contact the first conductive pattern CDP1 of another subpixel SPXn through the first electrode contact hole CTD disposed in the subpixel SPXn.

A first insulating layer PAS1 may be disposed in a structure substantially identical or similar to those of the above-described embodiments. The first insulating layer PAS1 may be disposed in the entire display area DPA and may cover the electrodes RME and the bank patterns BP1 and BP2. Although not illustrated in the drawings, the first insulating layer PAS1 may include separation openings, contact portions CT1 and CT2, and first opening holes PH1, which will not be described in detail. A first contact portion CT1 may be disposed on the first electrode RME1 of the first electrode line RM1, and a second contact portion CT2 may be disposed on the second electrode RME2.

The bank layer BNL may surround the subpixels SPXn, the emission areas EMA, and sub-areas SA. The bank layer BNL may include portions extending in the first direction DR1 and the second direction DR2 and disposed in a grid pattern. Unlike the embodiment of FIG. 5, the display device 10_1 may include a sub-area SA in each subpixel SPXn. In the display device 10_1, an emission area EMA and a sub-area SA may be alternately disposed in the first direction DR1.

The light emitting elements ED may be disposed between the bank patterns BP1 and BP2 or may be disposed on different electrodes RME. Some of the light emitting elements ED may be disposed between the first bank pattern BP1 and the left second bank pattern BP2, and others thereof may be disposed between the first bank pattern BP1 and the right second bank pattern BP2. The light emitting elements ED may include first light emitting elements ED1 and third light emitting elements ED3 disposed between the first bank pattern BP1 and the left second bank pattern BP2 and second light emitting elements ED2 and the fourth light emitting elements ED4 disposed between the first bank pattern BP1 and the right second bank pattern BP2. Each of the first light emitting elements ED1 and the third light emitting elements ED3 may be disposed on the first electrode RME1 of the first electrode line RM1 and the third electrode RME3, and each of the second light emitting elements ED2 and the fourth light emitting elements ED4 may be disposed on the second electrode RME2 and the first electrode RME1 of the second electrode line RM2. The first light emitting elements ED1 and the second light emitting elements ED2 may be disposed in the emission area EMA of a corresponding subpixel SPXn to be adjacent to a lower side or the sub-area SA, and the third light emitting elements ED3 and the fourth light emitting elements ED4 may be disposed in the emission area EMA of the corresponding subpixel SPXn to be adjacent to an upper side.

However, the light emitting elements ED are not classified according to their position in the emission area EMA but may be classified according to their connection relationship with the connection electrodes CNE which will be described below. Ends of each light emitting element ED may contact different connection electrodes CNE according to the arrangement structure of the connection electrodes CNE, and the light emitting elements ED may be classified into different light emitting elements ED according to types of the connection electrodes CNE that they contact.

A second insulating layer PAS2 may be disposed in a structure substantially identical or similar to those of the above-described embodiments. The second insulating layer PAS2 may be disposed on the light emitting elements ED, the first insulating layer PAS1, and the bank layer BNL. Although not illustrated in the drawings, the second insulating layer PAS2 may include separation openings, contact portions CT1 and CT2, openings OP1 and OP2, and second opening holes PH2, which will not be described in detail.

The connection electrodes CNE may include a third connection electrode CNE3, a fourth connection electrode CNE4, and a fifth connection electrode CNE5 disposed over electrodes RME, in addition to a first connection electrode CNE1 disposed on the first electrode RME1 of the first electrode line RM1 and a second connection electrode CNE2 disposed on the second electrode RME2.

Each of the first connection electrode CNE1 and the second connection electrode CNE2 may have a relatively short length in the first direction DR1. The first connection electrode CNE1 and the second connection electrode CNE2 may be disposed below the center of the emission area EMA. The first connection electrode CNE1 and the second connection electrode CNE2 may be disposed over the emission area EMA and the sub-area SA of a corresponding subpixel SPXn and may respectively directly contact the electrodes RME through the contact portions CT1 and CT2 formed in the sub-area SA. The first connection electrode CNE1 may directly contact a first electrode RME1 through the first contact portion CT1 penetrating the first insulating layer PAS1, the second insulating layer PAS2, and a third insulating layer PAS3 in the sub-area SA, and the second connection electrode CNE2 may contact the second electrode RME2 through the second contact portion CT2 penetrating the first insulating layer PAS1, the second insulating layer PAS2, and the third insulating layer PAS3 in the sub-area SA.

The third connection electrode CNE3 may include a first extension portion CN_E1 disposed on the third electrode RME3, a second extension portion CN_E2 disposed on the first electrode RME1 of the first electrode line RM1, and a first connection portion CN_B1 connecting the first extension portion CN_E1 and the second extension portion CN_E2. The first extension portion CN_E1 may be spaced apart from the first connection electrode CNE1 in the second direction DR2 to face the first connection electrode CNE1, and the second extension portion CN_E2 may be spaced apart from the first connection electrode CNE1 in the first direction DR1. The first extension portion CN_E1 may be disposed on the lower side of the emission area EMA of a corresponding subpixel SPXn, and the second extension portion CN_E2 may be disposed on the upper side of the emission area EMA. The first extension portion CN_E1 and the second extension portion CN_E2 may be disposed within the emission area EMA. The first connection portion CN_B1 may be disposed across the first electrode RME1 and the third electrode RME3 in the center of the emission area EMA. The third connection electrode CNE3 may generally extend in the first direction DR1 but may be bent in the second direction DR2 and may extend again in the first direction DR1.

The fourth connection electrode CNE4 may include a third extension portion CN_E3 disposed on the first electrode RME1 of the second electrode line RM2, a fourth extension portion CN_E4 disposed on the second electrode RME2, and a second connection portion CN_B2 connecting the third extension portion CN_E3 and the fourth extension portion CN_E4. The third extension portion CN_E3 may be spaced apart from the second connection electrode CNE2 in the second direction DR2 to face the second connection electrode CNE2, and the fourth extension portion CN_E4 may be spaced apart from the second connection electrode CNE2 in the first direction DR1. The third extension portion CN_E3 may be disposed on the lower side of the emission area EMA of a corresponding subpixel SPXn, and the fourth extension portion CN_E4 may be disposed on the upper side of the emission area EMA. The third extension portion CN_E3 and the fourth extension portion CN_E4 may be disposed within the emission area EMA. The second connection portion CN_B2 may be disposed across the second electrode RME2 and the first electrode RME1 of the second electrode line RM2 in an area adjacent to the center of the emission area EMA. The fourth connection electrode CNE4 may generally extend in the first direction DR1 but may be bent in the second direction DR2 and may extend again in the first direction DR1.

The fifth connection electrode CNE5 may include a fifth extension portion CN_E5 disposed on the third electrode RME3, a sixth extension portion CN_E6 disposed on the first electrode RME1 of the second electrode line RM2, and a third connection portion CN_B3 connecting the fifth extension portion CN_E5 and the sixth extension portion CN_E6. The fifth extension portion CN_E5 may be spaced apart from the second extension portion CN_E2 of the third connection electrode CNE3 in the second direction DR2 to face the second extension portion CN_E2, and the sixth extension portion CN_E6 may be spaced apart from the fourth extension portion CN_E4 of the fourth connection electrode CNE4 in the second direction DR2 to face the fourth extension portion CN_E4. Each of the fifth extension portion CN_E5 and the sixth extension portion CN_E6 may be disposed on the upper side of the emission area EMA, and the third connection portion CN_B3 may be disposed across the third electrode RME3, the second electrode RME2, and the first electrode RME1 of the second electrode line RM2. The fifth connection electrode CNE5 may surround the fourth extension portion CN_E4 of the fourth connection electrode CNE4 in a plan view.

Each of the third connection electrode CNE3 and the fourth connection electrode CNE4 may be a connection electrode that does not contact an electrode RME1, RME2, or RME3. The first extension portion CN_E1 of the third connection electrode CNE3 and the third extension portion CN_E3 of the fourth connection electrode CNE4 may be disposed only within the emission area EMA without extending to the sub-area SA.

The first connection electrode CNE1 and the second connection electrode CNE2 may be first type connection electrodes connected to the electrodes RME1 and RME2 directly connected to a third conductive layer. The third connection electrode CNE3, the fourth connection electrode CNE4, and the fifth connection electrode CNE5 may be second type connection electrodes not connected to the electrodes RME. The third connection electrode CNE3, the fourth connection electrode CNE4, and the fifth connection electrode CNE5 may not be connected to the electrodes RME but may contact the light emitting elements ED and may form an electrical connection circuit of the light emitting elements ED together with other connection electrodes CNE.

The third connection electrode CNE3 and the fourth connection electrode CNE4 may be connection electrodes in which electrode extension portions extending in the first direction DR1 are not side by side with or arranged alongside each other in the second direction DR2, and the fifth connection electrode CNE5 may be a connection electrode in which electrode extension portions extending in the first direction DR1 are side by side with each other in the second direction DR2. The third connection electrode CNE3 and the fourth connection electrode CNE4 may extend in the first direction DR1 but may be bent, and the fifth connection electrode CNE5 may surround a portion of another connection electrode.

The third insulating layer PAS3 may be disposed in a structure substantially identical or similar to those of the above-described embodiments. The third insulating layer PAS3 may be disposed on the second insulating layer PAS2 except for an area in which a second connection electrode layer is disposed.

The first connection electrode CNE1 may contact first ends of the first light emitting elements ED1, and the second connection electrode CNE2 may contact second ends of the second light emitting elements ED2. The third connection electrode CNE3 may contact second ends of the first light emitting elements ED1 and first ends of the third light emitting elements ED3. The fourth connection electrode CNE4 may contact second ends of the fourth light emitting elements ED4 and first ends of the second light emitting elements ED2 The fifth connection electrode CNE5 may contact second ends of the third light emitting elements ED3 and first ends of the fourth light emitting elements ED4.

In the above arrangement structure of the connection electrodes CNE, the light emitting elements ED may be classified into different light emitting elements ED according to the connection electrodes CNE that ends (or both ends) thereof contact. Each of the first light emitting elements ED1 and the second light emitting elements ED2 may have the first end contacting a first type connection electrode and the second end contacting a second type connection electrode. The first light emitting elements ED1 may contact the first connection electrode CNE1 and the third connection electrode CNE3, and the second light emitting elements ED2 may contact the second connection electrode CNE2 and the fourth connection electrode CNE4. Each of the third light emitting elements ED3 and the fourth light emitting elements ED4 may have ends (or both ends) contacting second type connection electrodes. The third light emitting elements ED3 may contact the third connection electrode CNE3 and the fifth connection electrode CNE5, and the fourth light emitting elements ED4 may contact the fourth connection electrode CNE4 and the fifth connection electrode CNE5.

The light emitting elements ED may be connected to each other in series through the connection electrodes CNE. The display device 10_1 according to the embodiment may include a greater number of the light emitting elements ED in each subpixel SPXn and form a series connection of the light emitting elements ED.

Figure 24:
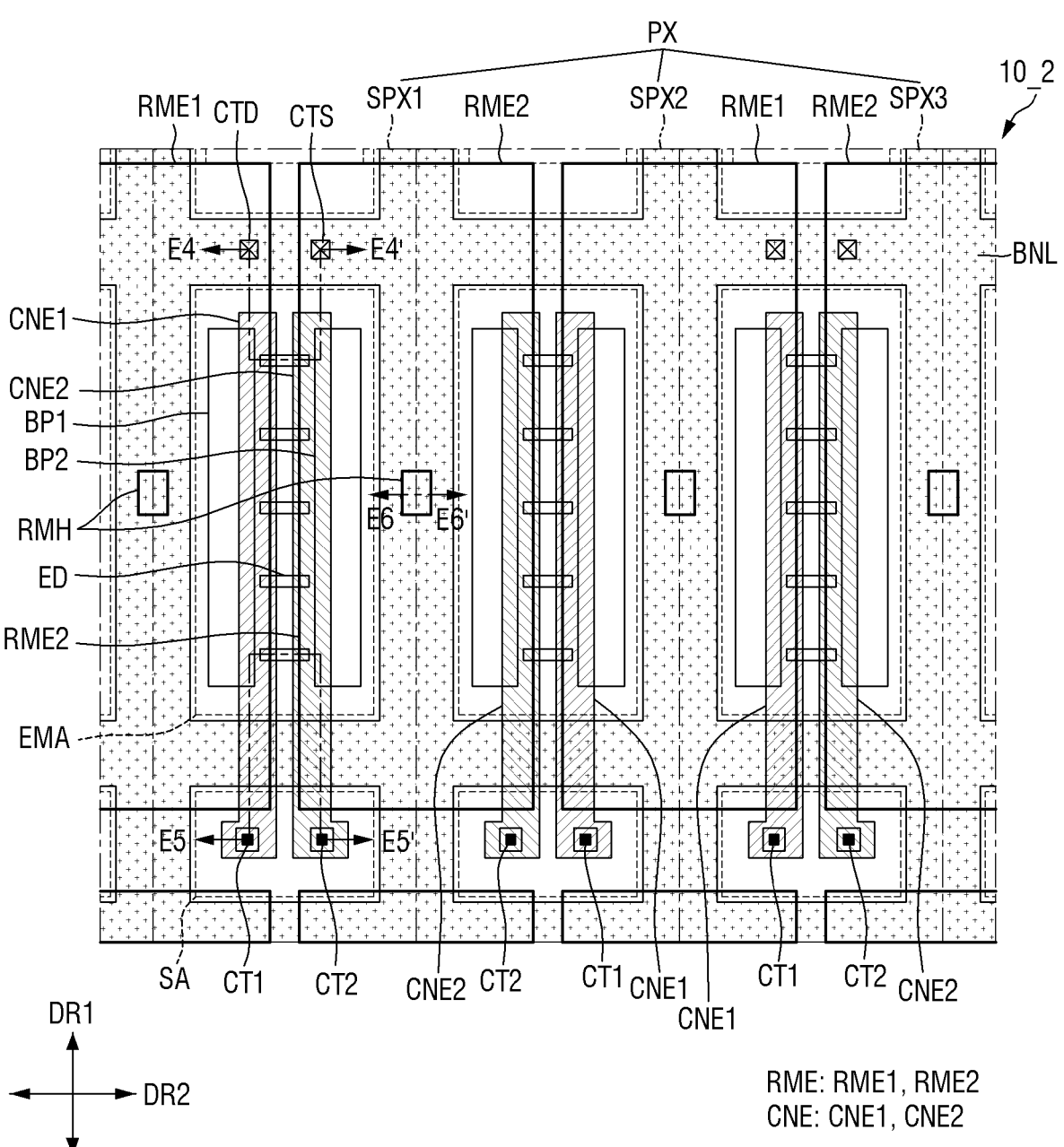
FIG. 24 is a schematic plan view of a pixel of a display device according to an embodiment.
Figure 25:
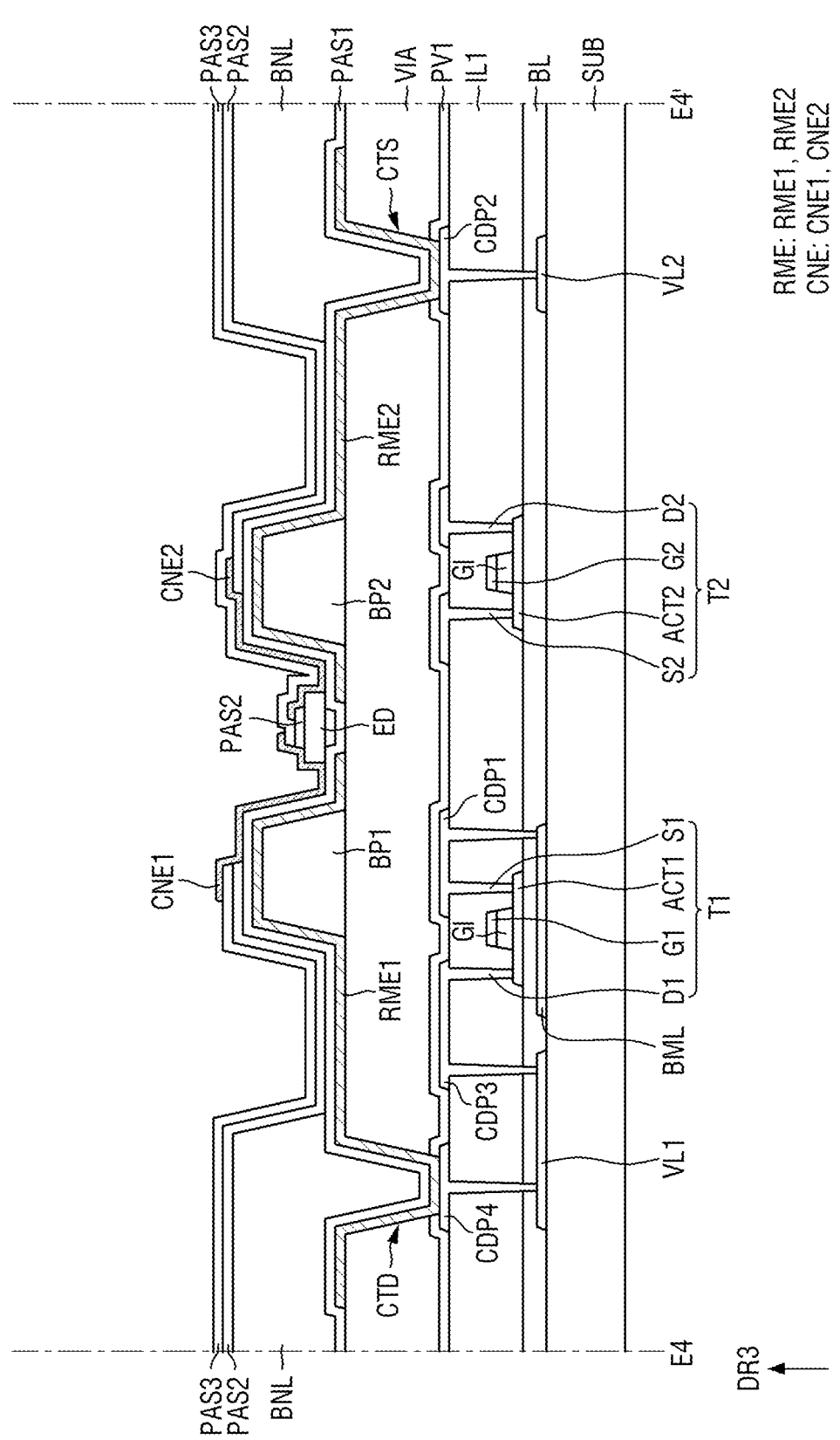
FIG. 25 is a schematic cross-sectional view taken along line E4-E4' of FIG. 24.
Figure 26:
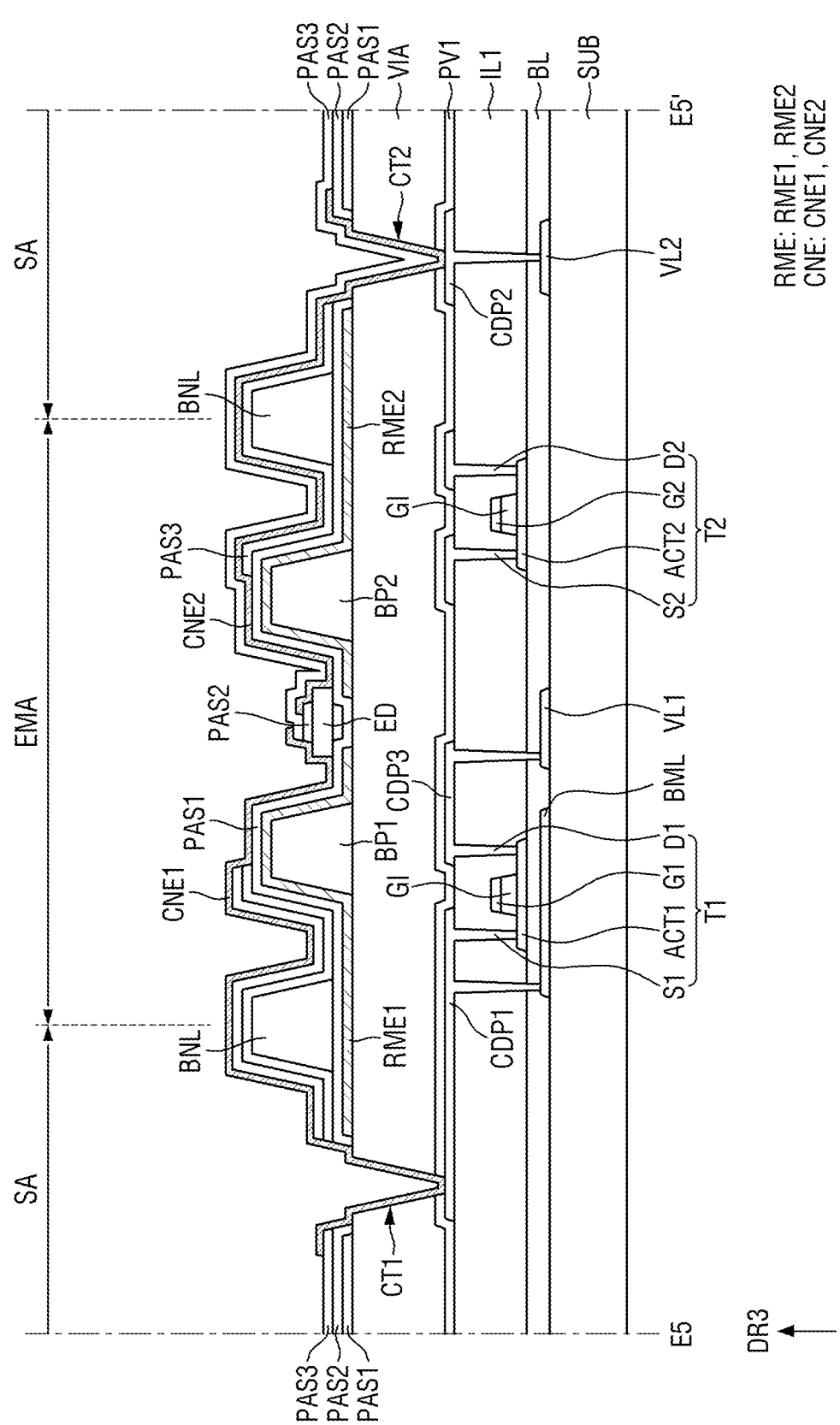
FIG. 26 is a schematic cross-sectional view taken along line E5-E5' of FIG. 24.
Figure 27:
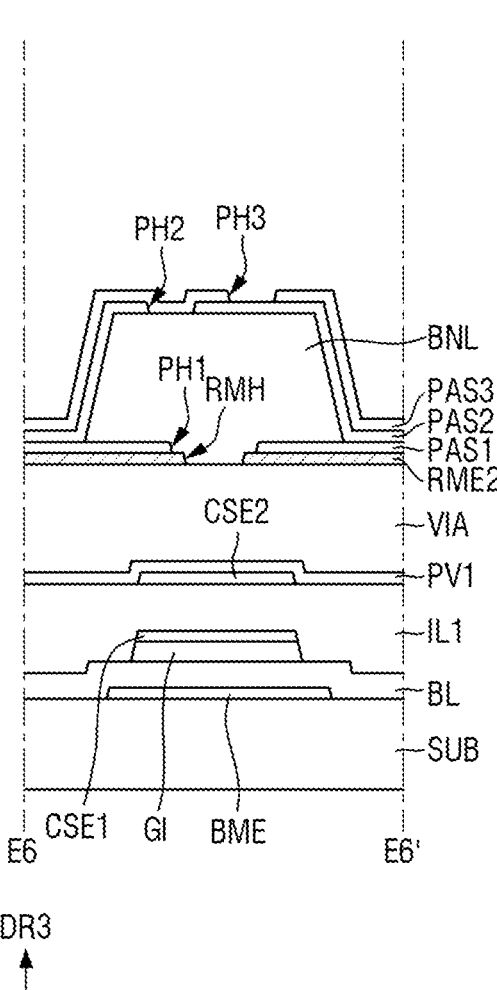
FIG. 27 is a schematic cross-sectional view taken along line E6-E6' of FIG. 24.

FIG. 24 is a schematic plan view of a pixel PX of a display device 10_2 according to an embodiment. FIG. 25 is a schematic cross-sectional view taken along line E4-E4' of FIG. 24. FIG. 26 is a schematic cross-sectional view taken along line E5-E5' of FIG. 24. FIG. 27 is a schematic cross-sectional view taken along line E6-E6' of FIG. 24.

FIG. 24 illustrates the planar arrangement of bank patterns BP1 and BP2, electrodes RME (RME1 and RME2), light emitting elements ED, and connection electrodes CNE (CNE1 and CNE2) in a pixel PX of the display device 10_2. FIG. 25 illustrates a cross section across ends of a light emitting element ED. FIG. 26 illustrates a cross section across contact portions CT1 and CT2 in the second direction DR2. FIG. 27 illustrates a cross section across an area between subpixels SPXn adjacent to each other in the second direction DR2.

Referring to FIGS. 24 to 27, the display device 10_2 may have various arrangement structures of the electrodes RME and the light emitting elements ED. The embodiment is different from the embodiment of FIG. 20 in the number and shape of the electrodes RME, the bank patterns BP1 and BP2, the light emitting elements ED, and the connection electrodes CNE disposed in each subpixel SPXn. Hereinafter, any redundant description will not be repeated, and differences may be mainly described.

The bank patterns BP1 and BP2 may be disposed in an emission area EMA of each subpixel SPXn. The bank patterns BP1 and BP2 may have a constant width in the second direction DR2 and may extend in the first direction DR1.

For example, the bank patterns BP1 and BP2 may include a first bank pattern BP1 and a second bank pattern BP2 spaced apart from each other in the second direction DR2 in the emission area EMA of each subpixel SPXn. The first bank pattern BP1 may be disposed on a left side of a center of the emission area EMA, and the second bank pattern BP2 may be spaced apart from the first bank pattern BP1 and disposed on a right side of the center of the emission area EMA. The first bank pattern BP1 and the second bank pattern BP2 may be alternately disposed in the second direction DR2 and may be disposed as island-shaped patterns in a display area DPA. As in the embodiment of FIG. 20, the first bank pattern BP1 and the second bank pattern BP2 may be disposed within the emission area EMA.

The electrodes RME may include a first electrode RME1 and a second electrode RME2, each being disposed over two different subpixels SPXn. In the display device 10_2 of the embodiment, a first electrode RME1 and a second electrode RME2 may be disposed in each subpixel SPXn, and each of the first electrode RME1 and the second electrode RME2 may be disposed over different subpixels SPXn.

The first electrode RME1 of a first subpixel SPX1 may be disposed on the first bank pattern BP1, and the second electrode RME2 may be disposed on the second bank pattern BP2. The second electrode RME2 of the first subpixel SPX1 may be disposed over the first subpixel SPX1 and a second subpixel SPX2 and may also be disposed on the first bank pattern BP1 of the second subpixel SPX2.

The second electrode RME2 of the second subpixel SPX2 may be disposed on the first bank pattern BP1, and the first electrode RME1 may be disposed on the second bank pattern BP2. The second electrode RME2 of the second subpixel SPX2 is the same as the second electrode RME2 of the first subpixel SPX1. The first electrode RME1 of the second subpixel SPX2 may be disposed over the second subpixel SPX2 and a third subpixel SPX3 and may also be disposed on the first bank pattern BP1 of the third subpixel SPX3.

The first electrode RME1 of the third subpixel SPX3 may be disposed on the first bank pattern BP1, and the second electrode RME2 may be disposed on the second bank pattern BP2. The first electrode RME1 of the third subpixel SPX3 is the same as the first electrode RME1 of the second subpixel SPX2. The second electrode RME2 of the third subpixel SPX3 may be disposed over the third subpixel SPX3 and another subpixel SPXn.

In the first subpixel SPX1 and the third subpixel SPX3, the first electrode RME1 may be disposed on the left side, and the second electrode RME2 may be disposed on the right side. In the second subpixel SPX2, the second electrode RME2 may be disposed on the left side, and the first electrode RME1 may be disposed on the right side.

The first electrode RME1 and the second electrode RME2 may be spaced apart from each other in the second direction DR2 and may be alternately disposed. The first and second electrodes RME1 and RME2 may be disposed over different subpixels SPXn and may be spaced apart from each other in the emission area EMA of any one subpixel SPXn. Each of the first and second electrodes RME1 and RME2 may cover the first bank pattern BP1 and the second bank pattern BP2 disposed in different subpixels SPXn and may overlap a bank layer BNL between the subpixels SPXn. Each of the first electrode RME1 and the second electrode RME2 may overlap conductive layers under the bank layer BNL, thereby preventing the light emitting elements ED from being misaligned.

According to an embodiment, each of the first electrode RME1 and the second electrode RME2 disposed over different subpixels SPXn may include an electrode hole RMH at a position overlapping the bank layer BNL. The electrode hole RMH may be disposed between the emission areas EMA of two different subpixels SPXn and may overlap the bank layer BNL. The shape and function of the electrode hole RMH are the same as those described above. The electrode hole RMH may also be omitted.

The first electrode RME1 may be electrically connected to a first voltage line VL1 through a first electrode contact hole CTD formed in an area overlapping the bank layer BNL. The second electrode RME2 may be electrically connected to a second voltage line VL2 through a second electrode contact hole CTS formed in an area overlapping the bank layer BNL. However, unlike in other embodiments, in the display device 10_2 of the embodiment, the electrodes RME may not be electrically connected to the light emitting elements ED and may be used only for a process of aligning the light emitting elements ED. Since the second electrode RME2 is electrically connected to the second voltage line VL2, a second power supply voltage which is a common voltage may be applied to the second electrode RME2. However, a pixel voltage should be applied to the first electrode RME1 through a first transistor T1 disposed in each subpixel SPXn. In an embodiment in which each electrode RME is disposed over subpixels SPXn, it may not be easy to transmit a different electrical signal to the first electrode RME1 for each subpixel SPXn. Therefore, the first electrode RME1 and the second electrode RME2 may be electrically connected to the first voltage line VL1 and the second voltage line VL2, respectively, and the first transistor T1 of each subpixel SPXn may be electrically connected to the light emitting elements ED through the connection electrodes CNE1 and CNE2.

The first electrode RME1 may contact a fourth conductive pattern CDP4 of a third conductive layer through the first electrode contact hole CTD. The fourth conductive pattern CDP4 may contact the first voltage line VL1 through a contact hole penetrating a first interlayer insulating layer IL1 and a buffer layer BL. The first electrode RME1 may be electrically connected to the first voltage line VL1 through the fourth conductive pattern CDP4. The second electrode RME2 may contact a second conductive pattern CDP2 of the third conductive layer through the second electrode contact hole CTS. The second conductive pattern CDP2 may contact the second voltage line VL2 through a contact hole penetrating the first interlayer insulating layer IL1 and the buffer layer BL. The second electrode RME2 may be electrically connected to the second voltage line VL2 through the second conductive pattern CDP2.

In each of the first subpixel SPX1 and the third subpixel SPX3, the first electrode RME1 and the second electrode RME2 may respectively be electrically connected to the voltage lines VL1 and VL2 through the electrode contact holes CTD and CTS disposed in the subpixel SPXn. On the other hand, in the second subpixel SPX2, the electrode contact holes CTD and CTS may not be formed, and the first electrode RME1 and the second electrode RME2 may be electrically connected to the voltage lines VL1 and VL2 through the electrode contact holes CTD and CTS of adjacent subpixels SPXn.

The bank layer BNL may surround the subpixels SPXn, the emission areas EMA, and sub-areas SA. The bank layer BNL may be disposed at boundaries between the subpixels SPXn adjacent to each other in the first direction DR1 and the second direction DR2 and also may be disposed at boundaries between the emission areas EMA and the sub-areas SA. This is the same as described above.

The light emitting elements ED may be disposed in the emission area EMA. The light emitting elements ED may be disposed between the bank patterns BP1 and BP2 and may have ends disposed on different electrodes RME1 and RME2.

Each of the light emitting elements ED may include a first semiconductor layer 31 and a second semiconductor layer 32, and a first end and a second end of each of the light emitting elements ED may be distinguished according to positions of the semiconductor layers. The light emitting elements ED may be placed on the electrodes RME1 and RME2 as orientation directions of their ends are changed by an electric field generated on the first electrode RME1 and the second electrode RME2. In each of the light emitting elements ED, the ends at which the first semiconductor layer 31 and the second semiconductor layer 32 are located may be oriented according to the direction of an electric field.

For example, the first ends of the light emitting elements ED may be disposed on the first electrode RME1 electrically connected to the first voltage line VL1, and the second ends of the light emitting elements ED may be disposed on the second electrode RME2 electrically connected to the second voltage line VL2. In the first subpixel SPX1 and the third subpixel SPX3, since the first electrode RME1 is disposed on the left side, the first ends of the light emitting elements ED may be placed to face the left side, and the second ends may be placed to face the right side. In the second subpixel SPX2, since the first electrode RME1 is disposed on the right side, the first ends of the light emitting elements ED may be placed to face the right side, and the second ends may be placed to face the left side. In the display device 10_2, the orientation direction of the light emitting elements ED may be different for each subpixel SPXn. The orientation direction of first type light emitting elements disposed in the first subpixel SPX1 and the third subpixel SPX3 may be different from that of second type light emitting elements disposed in the second subpixel SPX2.

The connection electrodes CNE (CNE1 and CNE2) may be disposed on the electrodes RME and the bank patterns BP1 and BP2. The connection electrodes CNE may extend in a direction and may be spaced apart from each other. Each of the connection electrodes CNE may contact the light emitting elements ED and may be electrically connected to an electrode RME or a conductive layer under the electrode RME.

The connection electrodes CNE may include a first connection electrode CNE1 and a second connection electrode CNE2 disposed in each subpixel SPXn. The first connection electrode CNE1 may extend in the first direction DR1 and may be dispose on the first electrode RME1. The first connection electrode CNE1 may partially overlap the first electrode RME1 and may extend from the emission area EMA to the sub-area SA beyond the bank layer BNL. The second connection electrode CNE2 may extend in the first direction DR1 and may be disposed on the second electrode RME2. The second connection electrode CNE2 may partially overlap the second electrode RME2 and may extend from the emission area EMA to the sub-area SA beyond the bank layer BNL.

As described above, the first electrode RME1 and the second electrode RME2 may be used only for the process of aligning the light emitting elements ED and may not be electrically connected to the light emitting elements ED. According to an embodiment, in the display device 10_2, the connection electrodes CNE1 and CNE2 may directly contact the third conductive layer. For example, the first connection electrode CNE1 may not overlap the first electrode RME1 in the sub-area SA and may directly contact a first conductive pattern CDP1 by a first contact portion CT1 penetrating a first passivation layer PV1, a via layer VIA, and first to third insulating layers PAS1 to PAS3. The second connection electrode CNE2 may not overlap the second electrode RME2 in the sub-area SA and may directly contact the second conductive pattern CDP2 by a second contact portion CT2 penetrating the first passivation layer PV1, the via layer VIA, and the first and second insulating layers PAS1 and PAS2.

The first connection electrode CNE1 disposed in each subpixel SPXn may be electrically connected to the first transistor T1 by the first conductive pattern CDP1. Accordingly, each subpixel SPXn may emit light individually. The second connection electrode CNE2 may be electrically connected to the second voltage line VL2 to which a common voltage is applied. The second connection electrode CNE2 may not directly contact the second conductive pattern CDP2 and may also be electrically connected to the second voltage line VL2 by the second electrode RME2.

As described above, the orientation direction of the light emitting elements ED (first type light emitting elements) disposed in the first subpixel SPX1 and the third subpixel SPX3 may be different from that of the light emitting elements ED (second type light emitting elements) disposed in the second subpixel SPX2. Accordingly, the arrangement of the first connection electrode CNE1 and the second connection electrode CNE2 may be different in each subpixel SPXn.

For example, the first connection electrode CNE1 may be disposed on the first electrode RME1 to contact the first ends of the light emitting elements ED, and the second connection electrode CNE2 may be disposed on the second electrode RME2 to contact the second ends of the light emitting elements ED. In the first subpixel SPX1 and the third subpixel SPX3, since the first ends of the light emitting elements ED are disposed on the left first electrode RME1, the first connection electrode CNE1 may be disposed on the left first electrode RME1, and the second connection electrode CNE2 may be disposed on the right second electrode RME2. In the first subpixel SPX1 and the third subpixel SPX3, the first connection electrode CNE1 may overlap the first bank pattern BP1, and the second connection electrode CNE2 may overlap the second bank pattern BP2.

Conversely, in the second subpixel SPX2, since the first ends of the light emitting elements ED are disposed on the right first electrode RME1, the first connection electrode CNE1 may be disposed on the right first electrode RME1, and the second connection electrode CNE2 may be disposed on the left second electrode RME2. In the second subpixel SPX2, the first connection electrode CNE1 may overlap the second bank pattern BP2, and the second connection electrode CNE2 may overlap the first bank pattern BP1.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a bank layer extending in a first direction and a second direction intersecting the first direction and surrounding subpixels;
a first electrode extending in the first direction in each of the subpixels;
second electrodes spaced apart from the first electrode and extending in the first direction, the first electrode being disposed between the second electrodes;
light emitting elements in each of the subpixels, the light emitting elements comprising:
a first light emitting element disposed on the first electrode and any one of the second electrodes; and
a second light emitting element having an end disposed on another one of the second electrodes;
a first connection electrode disposed on the first electrode and electrically contacting the first light emitting element; and
a second connection electrode disposed on the second electrodes and electrically contacting the second light emitting element,
wherein a portion extending in the first direction of each of the second electrodes is disposed in different ones of the subpixels arranged in the second direction and overlaps in a plan view the bank layer disposed between the subpixels.

2. The display device of claim 1, wherein a maximum width of each of the second electrodes is greater than a width of a portion of the bank layer which is disposed between different ones of the subpixels.

3. The display device of claim 2, further comprising:
a first bank pattern extending in the first direction in each of the subpixels and overlapping the first electrode in the plan view; and
second bank patterns spaced apart from each other and each disposed over different ones of the subpixels adjacent to each other in the second direction, the first bank pattern being disposed between the second bank patterns, wherein
the second electrodes overlap the second bank patterns in the plan view, and
the maximum width of each of the second electrodes is greater than a width of each of the second bank patterns.

4. The display device of claim 3, wherein
the first light emitting element is disposed between the first bank pattern and any one of the second bank patterns, and
the second light emitting element is disposed between the first bank pattern and another one of the second bank patterns.

5. The display device of claim 2, further comprising:
a bottom electrode overlapping in the plan view the bank layer and the second electrodes, wherein
the bottom electrode and the second electrodes are disposed on different layers.

6. The display device of claim 2, wherein
each of the second electrodes comprises:
an electrode stem portion extending in the first direction; and a widened electrode portion electrically connected to the electrode stem portion and wider than the electrode stem portion, and the widened electrode portion is disposed over different ones of the subpixels.

7. The display device of claim 1, wherein the second electrodes comprise:

a first electrode line on which the second light emitting element is disposed; and a second electrode line on which the first light emitting element is disposed, the second connection electrode is disposed on the first electrode line of the second electrodes, and the display device further comprises:

a first extension portion disposed on the second electrode line and electrically contacting the first light emitting element;

a second extension portion disposed on the first electrode and electrically contacting the second light emitting element; and a third connection electrode comprising a first connection portion electrically connecting the first extension portion and the second extension portion and disposed on the bank layer.

8. The display device of claim 7, wherein the subpixels comprise a first subpixel and a second subpixel adjacent to the first subpixel in the second direction, the first subpixel and the second subpixel share the second electrode line of the second electrodes, and the first light emitting element of the first subpixel and the second light emitting element of the second subpixel are disposed on a same one of the second electrodes.

9. The display device of claim 1, wherein each of the second electrodes comprises an electrode hole overlapping in the plan view the bank layer between different ones of the subpixels.

10. The display device of claim 9, further comprising:

a first insulating layer disposed on the first electrode and the second electrodes, wherein the first insulating layer comprises a first opening hole overlapping the electrode hole in the plan view.

11. The display device of claim 9, further comprising:

a second insulating layer disposed on the light emitting elements and the bank layer; and a third insulating layer disposed on the second insulating layer and disposed under the first connection electrode and the second connection electrode, wherein the second insulating layer comprises second opening holes disposed on the bank layer, and the third insulating layer comprises third opening holes disposed on the bank layer.

12. The display device of claim 11, wherein each of the second opening holes and the third opening holes has a smaller size than the electrode hole of each of the second electrodes.

13. The display device of claim 11, wherein the second opening holes and the third opening holes are disposed on the bank layer between different ones of the subpixels and do not overlap each other in the plan view.

14. The display device of claim 1, further comprising:

a third electrode disposed between the first electrode and the second electrodes and extending in the first direction, wherein the first light emitting element has a first end disposed on the first electrode and a second end disposed on any one of the second electrodes, and the second light emitting element has a first end disposed on the third electrode and a second end disposed on another one of the second electrodes.

15. The display device of claim 14, further comprising:

a first bank pattern extending in the first direction in each of the subpixels and overlapping the first electrode and the third electrode in the plan view; and second bank patterns spaced apart from the first bank pattern in the second direction, the first bank pattern being disposed between the second bank patterns, wherein each of the second electrodes overlaps different second bank patterns in the plan view, and one of the second electrodes overlaps in the plan view the second bank patterns respectively disposed in different ones of the subpixels.

16. The display device of claim 14, further comprising:

a third connection electrode comprising:

a first extension portion disposed on the third electrode and facing the second connection electrode; and a second extension portion disposed on the second electrodes and spaced apart from the second connection electrode;

a fourth connection electrode comprising:

a third extension portion disposed on the second electrodes and facing the first connection electrode; and a fourth extension portion disposed on the first electrode and spaced apart from the first connection electrode; and a fifth connection electrode comprising:

a fifth extension portion disposed on the third electrode and spaced apart from the first extension portion; and a sixth extension portion disposed on the second electrodes and spaced apart from the third extension portion.

17. A display device comprising:

subpixels arranged in a first direction and a second direction intersecting the first direction and each comprising an emission area;

a bank layer surrounding the subpixels and the emission area;

a first electrode and a second electrode, a portion extending in the first direction of each being disposed over different ones of the subpixels adjacent to each other in the second direction, and spaced apart from each other in the emission area of each of the subpixels;

light emitting elements disposed on the first electrode and the second electrode in the emission area of each of the subpixels;

a first connection electrode disposed on the first electrode and electrically contacting first ends of the light emitting elements; and a second connection electrode disposed on the second electrode and electrically contacting second ends of the light emitting elements, wherein the first electrode and the second electrode have a greater width than the bank layer in the second direction and each overlap in a plan view the bank layer disposed between the emission areas of adjacent subpixels.

18. The display device of claim 17, further comprising:

a first bank pattern and a second bank pattern disposed in the emission area of each of the subpixels and spaced apart from each other in the second direction, wherein each of the first electrode and the second electrode covers the first bank pattern and the second bank pattern respectively in different ones of the subpixels.

19. The display device of claim 18, wherein each of the light emitting elements is disposed between the first bank pattern and the second bank pattern.

20. The display device of claim 17, wherein the subpixels comprise a first subpixel and a second subpixel adjacent to the first subpixel in the second direction, the first subpixel and the second subpixel share the second electrode, the first electrode of the first subpixel is disposed on a side of the second electrode in the second direction, and the first electrode of the second subpixel is disposed on another side of the second electrode in the second direction.

* * * * *